United States Patent
Idei et al.

(10) Patent No.: US 6,633,184 B2
(45) Date of Patent: Oct. 14, 2003

(54) PHASE COMPARATOR AND SYNCHRONIZING SIGNAL EXTRACTING DEVICE

(75) Inventors: Gijun Idei, Shizuoka-ken (JP); Kazuyoshi Unno, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/859,505

(22) Filed: May 18, 2001

(65) Prior Publication Data

US 2001/0043086 A1 Nov. 22, 2001

(30) Foreign Application Priority Data

| May 19, 2000 | (JP) | ................ 2000-148284 |
| Sep. 14, 2000 | (JP) | ................ 2000-280817 |
| Dec. 14, 2000 | (JP) | ................ 2000-380388 |

(51) Int. Cl.[7] .......................... G01R 25/00
(52) U.S. Cl. ............... 327/12; 327/20; 327/156; 331/25; 331/DIG. 2; 375/376
(58) Field of Search ............... 327/2, 3, 5, 7, 327/8–10, 12, 18, 20, 22, 144–148, 155–157, 162, 163; 365/233, 233.5; 375/373–376, 362; 331/17, 25, 1 A, DIG. 2

(56) References Cited

U.S. PATENT DOCUMENTS

| 4,644,567 A | | 2/1987 | Artun et al. ............... 375/357 |
| 4,764,737 A | * | 8/1988 | Kaatz ..................... 327/231 |
| 5,259,006 A | * | 11/1993 | Price et al. ............... 327/141 |
| 5,459,765 A | | 10/1995 | Meyer et al. ............... 375/360 |
| 5,939,901 A | * | 8/1999 | Geddes .................... 327/12 |
| 6,157,218 A | * | 12/2000 | Chen ....................... 327/5 |

FOREIGN PATENT DOCUMENTS

| DE | 3626467 A1 | | 2/1988 | |
| EP | 520558 A1 | * | 6/1992 | ......... H03L/7/089 |
| EP | 0 758 171 A2 | | 2/1997 | |

OTHER PUBLICATIONS

Dan H. Wolaver, Phase–Locked Loop Circuit Design 62, 202, and 221 (1991).

* cited by examiner

*Primary Examiner*—Minh Nguyen
(74) *Attorney, Agent, or Firm*—Finnegan, Henderson, Farabow, Garrett, & Dunner, L.L.P.

(57) ABSTRACT

While generating a correction pulse (E) based on a clock signal (Xck1) input into one input terminal (6), a frequency and a phase of a differentiated pulse train (Data_Dif) input into the other input terminal (5) are compared with a frequency and a phase of the clock signal input into the one input terminal, then a leading phase instructing pulse (U4) and an incomplete lagging phase instructing pulse (D4a) are generated based on this compared result, then false pulses contained in the incomplete lagging phase instructing pulse (d4a) are removed by using the correction pulse (E) when the differentiated pulse train (Data_Dif) input into the other input terminal is in the tooth missing state, and then the precise leading phase instructing pulse (U4) and the precise lagging phase instructing pulse (D4) are output from two output terminals (7, 8).

14 Claims, 40 Drawing Sheets

FIG. 13
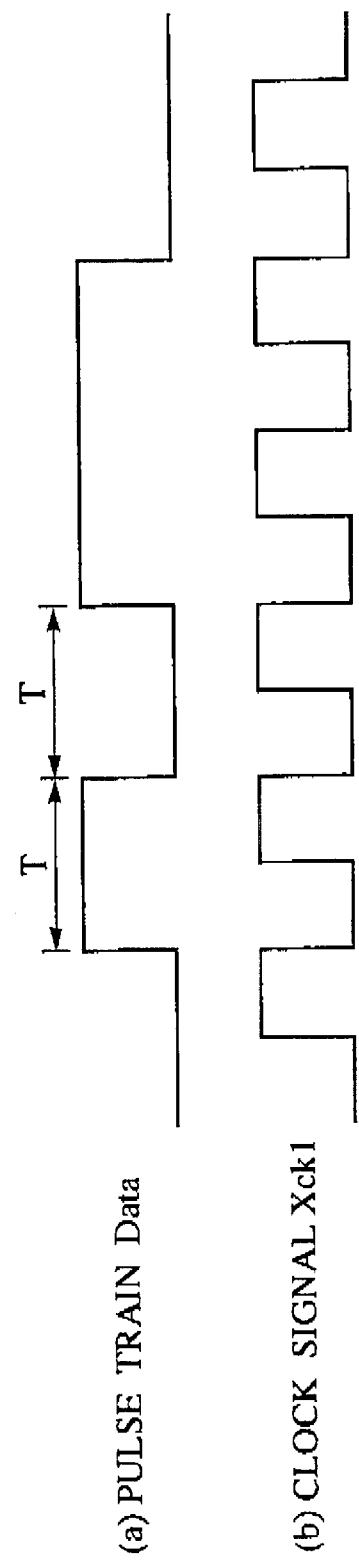
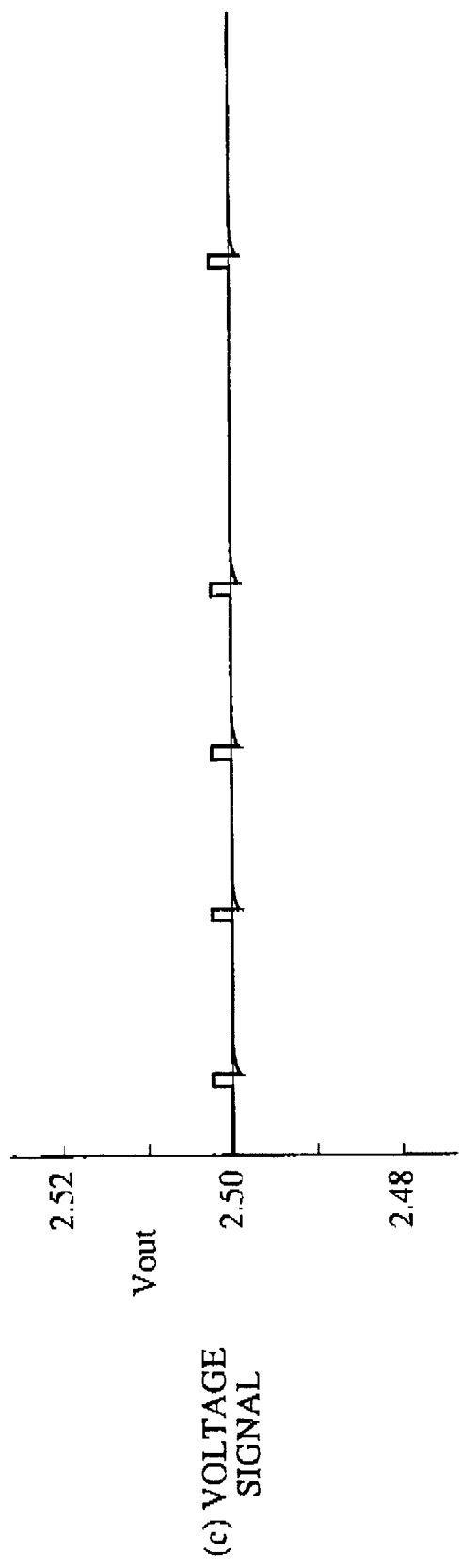
(a) PULSE TRAIN Data
(b) CLOCK SIGNAL Xck1
(c) VOLTAGE SIGNAL (a) PULSE TRAIN Data
(b) DIFFERENTIATED PULSE TRAIN Data_Dif
(c) RESET SIGNAL Vreset
(d) CLOCK SIGNAL Xck
(e) PULSE UL1a
(f) PULSE DL1a
(g) PULSE E
(h) PULSE UL1
(i) PULSE DL1 fxck=22.22 MHz(fxck:fb=10:9), THE DELAY TIME OF THE DELAY CIRCUIT 15=0.3 T, THE DELAY TIME OF THE DELAY CIRCUIT 52=0

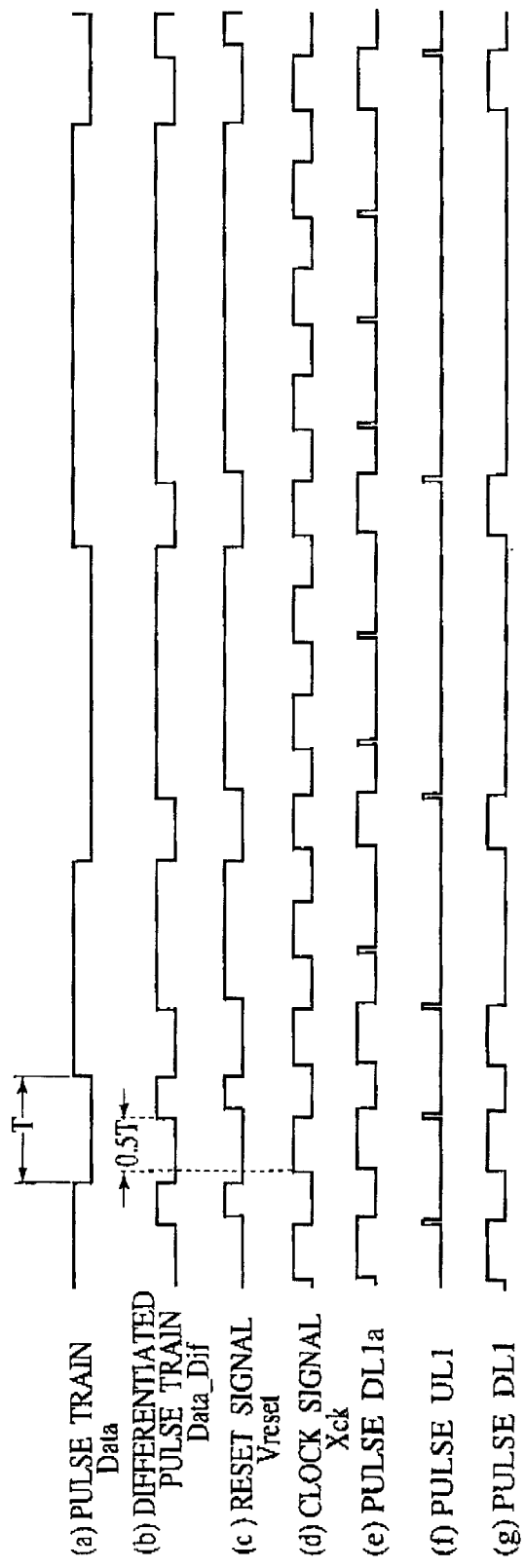

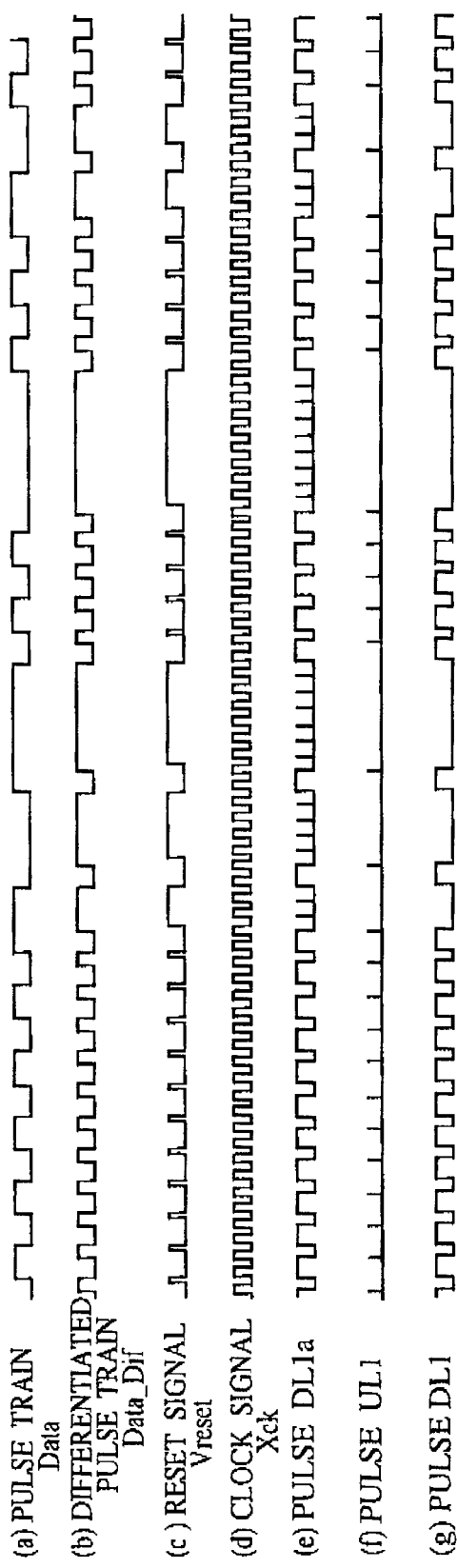

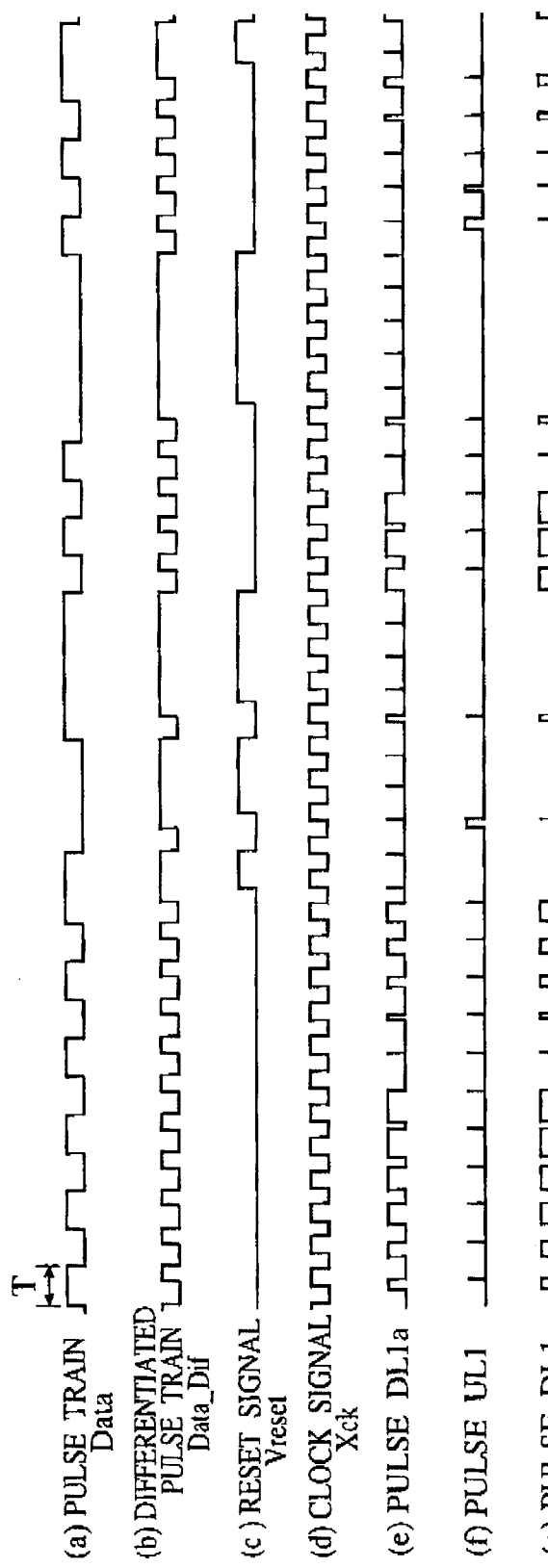

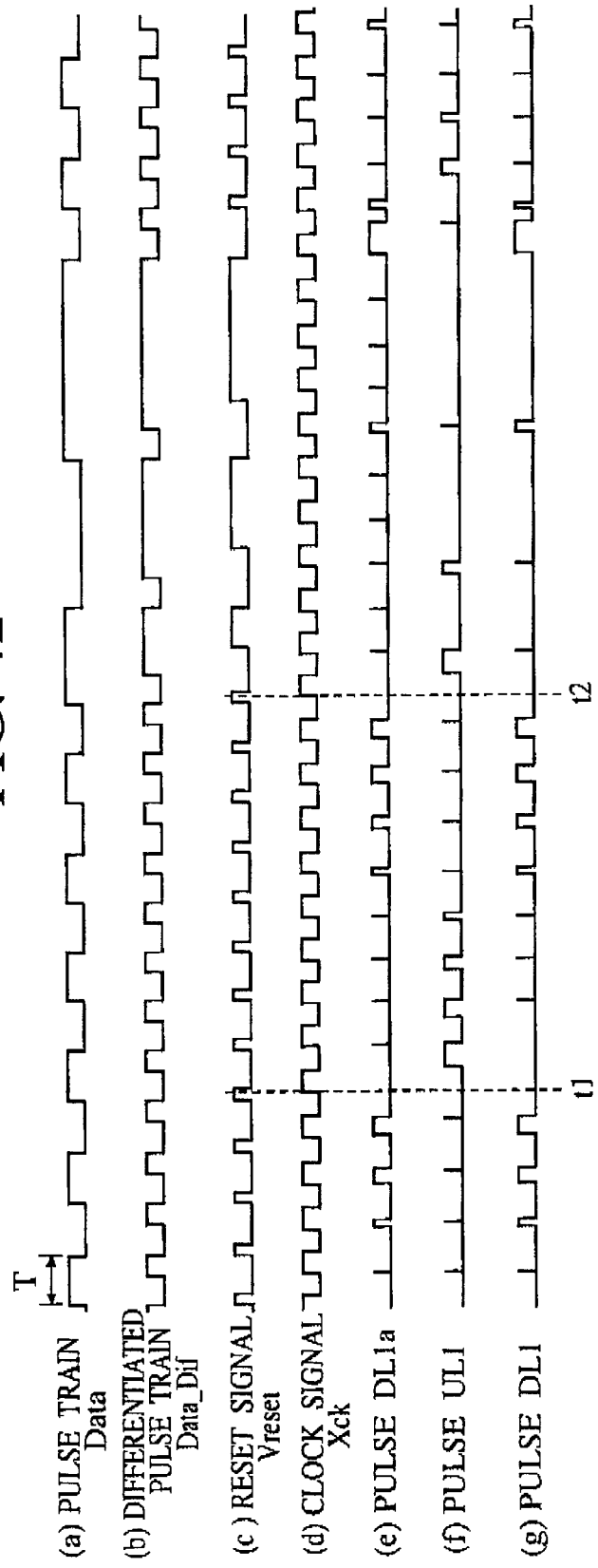

US 6,633,184 B2

PHASE COMPARATOR AND SYNCHRONIZING SIGNAL EXTRACTING DEVICE

BACKGROUND OF THE INVENTION

1. Field of the Invention

The present invention relates to a phase comparator employed in the data communication system, etc. and a synchronizing signal extracting device using the same and, more particularly, a phase comparator which can be synchronized with not only the continuous repetitive pulse but also the discontinuous data pulse with missing pulses since the omission of pulses is caused like the tooth missing and a synchronizing signal extracting device using the same.

2. Description of the Related Art

In the data communication, the data pulse train being sent must be interpreted without error to decode the original signal precisely. For this purpose, the synchronizing signal must be detected from the data pulse train being sent, and then the original signal must be decoded by using this synchronizing signal. In order to detect the synchronizing signal, the frequency and the phase must be caused to coincide with those of the received pulse train. In the prior art, the phase locked loop (referred to as a "PLL" hereinafter) circuit shown in FIG. 1 is normally employed as such detecting means.

A PLL circuit 150 shown in FIG. 1 comprises the phase comparator 151 having a comparing function for comparing a phase of the input pulse with a phase of the clock signal to output a voltage signal in accordance with the compared result and a frequency discriminating function, etc., as occasion demands, the low-frequency filter/amplifier 152 for extracting a low-frequency component by removing a high-frequency component in the voltage signal output from the phase comparator 151, and the voltage-controlled oscillator 153 for oscillating at a frequency, that responds to the voltage signal containing only the low-frequency component being output from the low-frequency filter/amplifier 152, to generate the clock signal. In this PLL circuit 150, when the phase of the clock signal being output from the voltage-controlled oscillator 153 lags behind the phase of the input pulse, the phase comparator 151 detects this lag and also increases the voltage signal in accordance with this detected result to increase the frequency of the clock signal being output from the voltage-controlled oscillator 153 and to advance the phase of the clock signal. In contrast, when the phase of the clock signal being output from the voltage-controlled oscillator 153 goes ahead of the phase of the input pulse, the phase comparator 151 detects this lead and also decreases the voltage signal in accordance with this detected result to lower the frequency of the clock signal being output from the voltage-controlled oscillator 153 and to delay the phase of the clock signal.

When the continuously repetitive pulse is input, this PLL circuit 150 can relatively easily cause to coincide the phase of the clock signal being output from the voltage-controlled oscillator 153 with the phase of the input pulse. Therefore, this PLL circuit 150 is extensively employed in the frequency synthesizer, etc.

However, according to the phase comparator 151 constituting such PLL circuit 150, the special regard must be paid to the discontinuous pulse train with missing pulses like the tooth missing caused in the data communication when the pulse train is modulated by the data. Therefore, such PLL circuit 150 cannot attain the sufficient function and the sufficient performance as the PLL circuit.

For this reason, in the prior art, as shown in FIG. 2, the phase comparator 159 was developed (Dan H. Wolaver. Phase Locked Loop Circuit Design, p.202, Prentice Hall. ISEN 0-13-662743-9) as the phase comparator that can be applied to such discontinuous pulse train with missing pulses. This phase comparator 159 comprises two D flip-flop circuits 154, 155, one inverter circuit 156, and two exclusive-OR circuits 157, 158, and is able to directly execute the phase comparison of the discontinuous pulse train, e.g., the NRZ (Non Return to Zero)-modulated pulse.

Also, as shown in FIG. 3, the phase comparator 168 was also developed (Dan H. Wolaver, Phase Locked Loop Circuit Design, p.221, Prentice Hall, ISBN 0-13-662743-9). This phase comparator 168 comprises two D flip-flop circuits 160, 161, two exclusive-OR circuits 162, 163, and four resistors 164, 165, 166, 167, and is able to execute the phase comparison of the RZ(Return to Zero)-modulated pulse which can be obtained by previously differentiating the NRZ-modulated pulse.

FIG. 4 shows an outline of the PLL circuit 191 that employs the phase comparator 171 like the phase comparator 159 as the phase comparator 151, and the charge pump unit 172 as the low-frequency filter/amplifier 152. In this case, since the phase comparator 168 has the output waveform and the operation almost identical to those of the phase comparator 159, explanation of the PLL circuit employing this phase comparator 168 will be omitted herein.

The phase comparator 191 shown in FIG. 4 comprises the phase comparator 171 for comparing the frequency and the phase of the discontinuous pulse train Data input into the input terminal 169 with those of the clock signal Xck1 input into the input terminal 170 and also generating pulses W, X in accordance with this compared result; the charge pump unit 172 for increasing the voltage value of the voltage signal by executing the charging operation when the pulse W is output from this phase comparator 171 and also decreasing the voltage value of the voltage signal by executing the discharging operation when the pulse X is output from this phase comparator 171; and the voltage-controlled oscillator 173 for increasing the oscillating frequency as the voltage value of the voltage signal being output from this charge pump unit 172 is increased higher and also decreasing the oscillating frequency as the voltage value of the voltage signal being output from this charge pump unit 172 is decreased lower so as to generate the clock pulse Xck1. This phase comparator 191 controls the oscillating frequency of the voltage-controlled oscillator 173 such that the minimum pulse width of the discontinuous input pulse train Data can coincide with the repetitive period of the clock signal Xck1, and generates the clock signal Xck1 whose frequency is twice the maximum repetitive frequency of the discontinuous pulse train Data.

The phase comparator 171 comprises the D flip-flop circuit 174 for acquiring the pulse train Data input into the data input terminal D when the clock signal Xck1 input into the input terminal 170 rises and then outputting this pulse train Data from the output terminal Q while holding such pulse train Data; the inverter circuit 175 for inverting the clock signal Xck1 input into the input terminal the D flip-flop circuit 176 for acquiring the pulse train Data output from the output terminal Q of the D flip-flop circuit 174 from the data input terminal p when the inverted signal of the clock signal Xck1 output from this inverter circuit 175 rises and then outputting this pulse train Data from the output terminal Q while holding such pulse train Data; the exclusive-OR circuit 177 for calculating the exclusive-OR between the discontinuous pulse train Data input into the input terminal 169 and the pulse train Data output from the D flip-flop circuit 174 to generate the pulse W; and the exclusive-OR circuit 178 for calculating the exclusive-OR between the pulse train Data output from the D flip-flop circuit 174 and the pulse train Data output from the delayed flip-flop circuit 176 to generate the pulse X.

Then, as shown in (b) of FIG. 5, when the clock signal Xck1 input into the input terminal 170 rises, the D flip-flop circuit 174 is caused to acquire the pulse train Data, shown in (a) of FIG. 5, that is input into the input terminal 169 and to hold this pulse train Data. When the clock signal Xck1 input into the input terminal 170 falls and the inverted signal of the clock signal Xck1 output from the inverter circuit 175 rises, the D flip-flop circuit 176 is caused to acquire the pulse train Data that is output from the D flip-flop circuit 174 and to hold this pulse train Data. Also, in parallel with the above operations, the exclusive-OR between the pulse train Data input into the input terminal 169 and the pulse train Data output from the D flip-flop circuit 174 is calculated by the exclusive-OR circuit 177 to generate the pulse W shown in (c) of FIG. 5. Also, the exclusive-OR between the pulse train Data output from the D flip-flop circuit 174 and the pulse train Data output from the D flip-flop circuit 176 is calculated by the exclusive-OR circuit 178 to generate the pulse X shown in (d) of FIG. 5. Then, these pulses W, X are output from the output terminals 179, 180 respectively to be supplied to the input terminals 181, 182 of the charge pump unit 172.

The charge pump unit 172 comprises the inverter circuit 183 for inverting the pulse W input via the input terminal 181; the P-channel MOS transistor 184 for receiving the pulse W output from the inverter circuit 183 and for turning ON to pull up the voltage of its source terminal to the power supply voltage $V_{DD}$ by the power supply voltage $V_{DD}$ applied to its drain terminal while the pulse W is "1", i.e., the pulse W is output from the output terminal 179 of the phase comparator 171; the N-channel MOS transistor 185 for receiving the pulse X input to the input terminal 182 via its gate terminal and for lowering the voltage of the drain terminal to the ground voltage "0" V of its source terminal while this pulse X is "1"; the capacitor 186 for executing the charging operation by the power supply voltage $V_{DD}$ generated at the source terminal of the P-channel MOS transistor 184 when the P-channel MOS transistor 184 is in its ON state and also for executing the discharging operation by the ground voltage generated at the drain terminal of the N-channel MOS transistor 185 when the N-channel MOS transistor 185 is in its ON state; the resistor 187 operated together with the capacitance of the capacitor 186 to decide the time constant of the charging/discharging operations: and the bypass capacitor 188 for attenuating a high frequency component.

Then, when the pulse W is output from the phase comparator 171 and the inverted pulse of the pulse W is output from the inverter circuit 183, the P-channel MOS transistor 184 is turned ON and then the charging/discharging circuit 189 consisting of the capacitor 186 and the resistor 187 is charged, When the pulse X is output from the phase comparator 171, the N-channel MOS transistor 185 is turned ON and then the charging/discharging circuit 189 is discharged. Thus, as shown in (e) of FIG. 5, the voltage signal is generated in accordance with an amount of charge accumulated in the capacitor 186 of the charging/discharging circuit 189, and then this voltage signal is supplied to the voltage-controlled oscillator 173 via the output terminal 190.

While increasing the oscillating frequency in compliance with the increase of the voltage value of the voltage signal output from the charge pump unit 172 and also decreasing the oscillating frequency in compliance with the decrease of the voltage value of the voltage signal, the voltage-controlled oscillator 173 feeds back the clock signal Xck1, that is obtained by the oscillating operation, to the input terminal 170 of the phase comparator 171 and also supplies this clock signal Xck1 to the succeeding stage system (not shown).

Accordingly, in this PLL circuit 191, when the phase of the clock signal Xck1 input into the input terminal 170 lags behind the phase of the discontinuous pulse train Data input into the input terminal 169, i.e., when the rise timing of the clock signal Xck1 lags behind rise/fall timings of the discontinuous pulse train Data, the width of the pulse W output from the phase comparator 171 is set wider than "0.5T" to expand the conduction period of the P-channel MOS transistor 184. Thus, the amount of charge accumulated in the capacitor 186 of the charging/discharging circuit 189 is increased gradually and accordingly the oscillating frequency of the voltage-controlled oscillator 173 is increased gradually.

Then, when the pulse train Data coincide in phase with the clock signal Xck1, i.e., at a point of time when the width of the pulse W output from the phase comparator 171 becomes equal to "0.5T", the amount of charge accumulated in the capacitor 186 of the charging/discharging circuit 189 is kept constant and accordingly the oscillating frequency of the voltage-controlled oscillator 173 is fixed.

Then, in the situation that the pulse train Data whose pulse width is set to "T" is being input, when the phase of the clock signal Xck1 goes ahead of the phase of the pulse train Data, i.e., when the fall timing of the clock signal Xck1 goes ahead of the rise/fall timings of the discontinuous pulse train Data, the width of the pulse W output from the phase comparator 171 is set narrower than "0.5T" to shorten the conduction period of the P-channel MOS transistor 184. Thus, the amount of charge accumulated in the capacitor 186 of the charging/discharging circuit 189 is decreased gradually and accordingly the oscillating frequency of the voltage-controlled oscillator 173 is decreased gradually.

Then, when the pulse train Data coincide in phase with the clock signal Xck1, i.e., at a point of time when the width of the pulse W output from the phase comparator 171 becomes equal to "0.5T", the amount of charge accumulated in the capacitor 186 of the charging/discharging circuit 189 is kept constant and accordingly the oscillating frequency of the voltage-controlled oscillator 173 is fixed. In contrast, since the exclusive-OR between the output of the D flip-flop circuit 174, that is output at the leading edge of the clock signal Xck1, and the output of the D flip-flop circuit 176, that is output substantially at the trailing edge of the clock signal Xck1 when the circuit 176 receives the output of circuit 174, is calculated, the pulse width of the pulse X is always set to 0.5T.

However, the above PLL circuit 191 in the prior art has the problems described in the following.

First, in the phase comparator 171 of the PLL circuit 191 shown in FIG. 4, the value of the pulse train Data supplied to the data input terminal D of the D flip-flop circuit 174 is received at the rise of the clock signal Xck1, and the value of the pulse train Data supplied to the data input terminal D of the D flip-flop circuit 176 (the value of the pulse train Data supplied from the data output terminal Q of the D flip-flop circuit 174) is received at the fall of the clock signal Xck1. Therefore, the pulse train Data output from the data output terminal Q of the D flip-flop circuit 176 lags behind the pulse train Data output from the data output terminal Q of the D flip-flop circuit 174 by "0.5T".

For this reason, the width of the pulse W output from the exclusive-OR circuit 177 can be changed from "0" to "1T" in answer to the difference between the phase of the clock signal Xck1 and the phase of the pulse train Data, nevertheless the width of the pulse X output from the exclusive-OR circuit 178 is always kept at "0.5T". That is, the width of the pulse X has merely a meaning as the reference width used to decide whether or not the width of the pulse W is shorter or longer than "0.5T", on the charge pump unit 172 side.

Then, when the difference between the phase of the clock signal Xck1 and the phase of the pulse train Data is "0", i.e., at a point of time when the phase coincides with each other, the widths of both the pulse W and the pulse X become "0.5T". Therefore, at this time, the output can be reduced substantially to "0" by calculating a difference between a time-integral value of the width of the pulse W and a time-integral value of the width of the pulse X even if both the width of the pulse W and the width of the pulse X are deviated. But the problem is that occurrence times of the pulse W and the pulse X are not equal, and thus the pulsation of the voltage signal becomes large because the capacitor is charged in the period of the pulse W and is discharged in the period of the pulse X.

As the countermeasure of this, if the value of the resistor 187 and the value of the capacitor 186 both constituting the charge pump unit 172 are increased to enlarge the time constant, variation in the voltage value of the voltage signal can be reduced and thus the voltage signal can come close to the direct current. But the responsibility, especially the transient responsibility becomes worse if to do so, and therefore the value of the resistor 187 and the value of the capacitor 186 can be increased merely to some extent.

In contrast, if the value of the resistor 187 and the value of the capacitor 186 both constituting the time-constant circuit 189 are reduced to decrease the time constant, the transient responsibility can be improved, but the pulsation of the voltage value of the voltage signal is increased. Thus, the oscillating frequency of the voltage-controlled oscillator 173 is not stabilized, and there is such a possibility that the jitter, the false drawing, etc. occur.

Assume that, as particular numerical values, as shown in FIG. 6, for example, the capacitance of the capacitor 188 constituting the charge pump unit 172 is set to "20 pF", the capacitance of the capacitor 186 is set to "0.047 $\mu$F", the power supply voltage is set to "5 V", the value of the resistor 187 is set to "390 $\Omega$", and the "0.5T" is set to "5 ns", and also charging/discharging currents of the P-channel MOS transistor 184 and the N-channel MOS transistor 185 are set to "200 $\mu$A". Then, as shown in (e) of FIG. 5, the voltage value of the voltage signal output from the output terminal 190 of the charge pump unit 172 has the large pulsation.

In addition, if the waveform of this voltage signal is checked, the voltage value is largely varied at the portion where the pulse train Data is missed like the tooth missing. Therefore, the voltage value of the voltage signal is varied according to the pattern of the pulse train Data, and thus there is the possibility that the vicious jitter is caused, Also, it is difficult to make the charge current of the P-channel MOS transistor 184 and the discharge current of the N-channel MOS transistor 185 equal perfectly. Thus, when any one of the P-channel KOS transistor 184 and the N-channel MOS transistor 185, e.g., the charge current of the P-channel MOS transistor 184 is slightly larger than the discharge current of the N-channel MOS transistor 185, the charge accumulated in the capacitor 186 cannot be discharged completely, as shown in (e) of FIG. 5. Therefore, although both the width of the pulse W and the width of the pulse X are "0.5T", the offset is generated and the voltage value of the voltage signal is deviated from the proper value.

Such problem is the problem common to the phase comparators 171, 159, 168 (see FIG. 2, FIG. 3, and FIG. 4) in which the occurrence time of the pulse W and the occurrence time of the pulse X are different.

Also, in the phase comparator 171 employed in such PLL circuit 191, the width of the pulse W can be changed from "0" to "1T" in accordance with the difference between the phase of the clock pulse Xck1 and the phase of the pulse train Data, nevertheless the capacitor 186 of the time-constant circuit is discharged in the period of "0.5T" by the pulse X, that is output after the pulse W and has the width of "0.5T", even after such capacitor 186 is charged in the period of "1T" when the width of the pulse W becomes "1T". As a consequence, there is the drawback that the capacitor 186 cannot be charged up to the power supply voltage "$V_{DD}$" and thus the output of the charge pump unit 172 cannot be increased.

Therefore, as the phase comparator to overcome the problem due to the employment of such phase comparator 171, etc. in the prior art, there is the phase comparator 192 in which the width of the pulse being output at the phase coincidence point can be set as small as possible and the occurrence time can be set to coincide with each other, as shown in FIG. 7 (Dan H. Wolaver, Phase Locked Loop Circuit Design, p.62). Such phase comparator 192 is extensively employed as the phase comparator for the continuous pulse without missing pulses.

The phase comparator 192 shown in FIG. 7 comprises the D flip-flop circuit 193 for acquiring the "1" signal being input into the data input terminal D every time when the differentiated pulse train Data_Dif (the pulse train obtained by differentiating the pulse train Data) is input into the clock terminal, and outputting this signal from the data output terminal Q while holding this signal, and then resetting the held content to output the "0" signal from the data output terminal Q every time when the "1" signal is input into the reset terminal R: the D flip-flop circuit 194 for acquiring the "1" signal input into the data input terminal D every time when the clock signal Xck1 input into the clock terminal rises, and outputting this signal from the data output terminal Q while holding this signal, and then resetting the held content to output the "0" signal from the data output terminal Q every time when the "1" signal is input into the reset terminal R; and the AND circuit 195 for generating the "1" signal to reset the D flip-flop circuits 193, 194 when the "1" signal is output from the data output terminal Q of the D flip-flop circuit 194 and also the "1" signal is output from the data output terminal Q of the D flip-flop circuit 193.

Then, as shown in (a) of FIG. 8, in the situation that the pulse train Data whose pulse width is set to "T" is supplied and also the differentiated pulse train Data_Dif obtained by differentiating the pulse train Data is input, when the phase of the differentiated pulse train Data_Dif coincides with the phase of the clock signal Xck1, as shown in (b) (c) of FIG. 8, the pulses U5, D5 that have the narrow width and are synchronized with each other are generated from the data output terminals D of the D flip-flop circuits 193, 194 respectively to cause the charge pump unit to execute the charging operation and the discharging operation, as shown in (d) (e) of FIG. 8.

However, as shown in (a) to (e) of FIG. 8, in this phase comparator 192, the excellent function can be achieved with respect to the continuous pulse train Data with no missing pulse like the pulse train Data shown in the periods A1, A2, A3, A4, A5, nevertheless the erroneous pulse (false pulse) is output as the pulse DS when the differentiated pulse train Data_Dif obtained by differentiating the pulse train Data with the missing pulse such as the pulse train Data shown in the periods B1, B2, B3, i.e., the pulse train Data with one missing pulse, the pulse train Data with two missing pulses, the pulse train Data with three missing pulses, etc. is input.

This is because the D flip-flop circuit 194 reads and outputs "1" at the time point of the rise of the clock signal Xck1, e.g., at the time of point P1 in FIG. 8 in the pulse missing period but the output of the D flip-flop circuit 193 has already been reset to "0", thus the reset by the AND circuit 195 cannot be satisfied, thus the output of the D flip-flop circuit 194 is still kept at "1" until the rising time points of the succeeding differentiated pulse train Data_Dif and the clock signal Xck1, and therefore the false pulse having the wide width is output.

Accordingly, there is the drawback that such phase comparator 192 cannot handle the pulse train Data with missing pulses,

SUMMARY OF THE INVENTION

The present invention has been made in view of the above circumstances, and it is an object of the present invention to provide a phase comparator which is capable of generating a precise phase-compared output for a pulse train that is modulated by the data into the tooth missing state, minimizing ripple of a detected output to reduce as close to zero as possible when frequencies and phases coincide with each other, increasing a variable range of the detected output, reducing jitters to enable a high speed response, and having a frequency discriminating function, and a synchronizing signal extracting device using the same.

In order to achieve the above object, according to an aspect of the present invention, there is provided a phase comparator comprising: a phase comparing portion for generating a leading phase instructing pulse and a lagging phase instructing pulse to mate a phase of an input pulse train and a phase of an input clock signal with each other in accordance with the phases; a correction pulse generating portion for generating a correction pulse in accordance with the input pulse train and the input clock signal; and a resetting portion for resetting the phase comparing portion by generating a reset pulse in accordance with the leading phase instructing pulse and the lagging phase instructing pulse output from the phase comparing portion, the correction pulse output from the correction pulse generating portion, and the input clock signal.

In order to achieve the above object, according to another aspect of the present invention, there is provided a phase comparator comprising: a phase comparing portion for generating a leading phase instructing pulse and a lagging phase instructing pulse to mate a phase of an input pulse train and a phase of an input clock signal with each other in accordance with the phases; a correction pulse generating portion for generating a correction pulse in accordance with the input pulse train and the input clock signal; a resetting portion for resetting the phase comparing portion by generating a reset pulse in accordance with the leading phase instructing pulse and the lagging phase instructing pulse output from the phase comparing portion, the correction pulse output from the correction pulse generating portion, and the input clock signal; and a pulse correcting portion for removing false pulses contained in the lagging phase instructing pulse output from the phase comparing portion, based on the correction pulse output from the correction pulse generating portion.

In a preferred embodiment of the present invention, the correction pulse generating portion generates the correction pulse that has a pulse width equivalent to a time period from a time at which the correction pulse is triggered by the clock signal to a time at which the correction pulse is reset by a differentiated pulse train obtained by differentiating the pulse train, and detects a pulse missing of the input pulse train based on the pulse width of the correction pulse.

In a preferred embodiment of the present invention, the correction pulse generating portion generates the correction pulse that has a pulse width equivalent to a time period obtained by overlapping a time period from a time at which the correction pulse is triggered by the clock signal to a time at which the correction pulse is reset by a differentiated pulse train obtained by differentiating the pulse train and a time period from a time at which the correction pulse is triggered by a second clock signal that lags behind the clock signal by a predetermined degrees to a time at which the correction pulse is reset by a differentiated pulse train obtained by differentiating the pulse train, and detects a pulse missing of the input pulse train based on the pulse width of the correction pulse.

In a preferred embodiment of the present invention, the phase comparing portion includes a first flip-flop circuit triggered by a differentiated pulse train obtained by differentiating the pulse train to output the leading phase instructing pulse and a second flip-flop circuit triggered by the clock signal to output the lagging phase instructing pulse, and the resetting portion generates a reset pulse when both the leading phase instructing pulse and the lagging phase instructing pulse are output from the phase comparing portion or when the clock signal is input in a situation that the correction pulse is being output from the correction pulse generating portion, and resets the leading phase instructing pulse and the lagging phase instructing pulse by resetting the respective flip-flop circuits constituting the phase comparing portion.

In a preferred embodiment of the present invention, the phase comparing portion includes a first flip-flop circuit triggered by a differentiated pulse train obtained by differentiating the pulse train to output the leading phase instructing pulse and a second flip-flop circuit triggered by the clock signal to output the lagging phase instructing pulse, and the resetting portion generates a reset pulse when both the leading phase instructing pulse and the lagging phase instructing pulse are output from the phase comparing portion, and resets the leading phase instructing pulse and the lagging phase instructing pulse by resetting the respective flip-flop circuits constituting the phase comparing portion; or generates a reset pulse when the clock signal is input in a situation that the correction pulse is being output from the correction pulse generating portion and resets the lagging phase instructing pulse by resetting the second flip-flop circuit constituting the phase comparing portion.

In a preferred embodiment of the present invention, the phase comparing portion generates the leading phase instructing pulse and the lagging phase instructing pulse by using a differentiated pulse train obtained by differentiating both of a rise and a fall of the pulse train, and selects and outputs portions that correspond to at least one of a high level period and a low level period of the pulse train from the leading phase instructing pulse and the lagging phase instructing pulse.

In order to achieve the above object, according to still another aspect of the present invention, there is provided a synchronizing signal extracting device comprising: a phase comparator set forth in the first aspect of the present; a differentiator for differentiating an pulse train having a frequency that is ½ of a frequency of the Input pulse train, and supplying to the phase comparator as the input pulse train; a charge pump unit for increasing a voltage value of an output voltage signal by executing a charging operation when the leading phase instructing pulse is input from the phase comparator, and decreasing the voltage value of the output voltage signal by executing a discharging operation when the lagging phase instructing pulse is input from the phase comparator: and a voltage-controlled oscillator for receiving the voltage signal output from the charge pump unit, generating a clock signal having a frequency that increases as the voltage value of the voltage signal increases, and supplying the generated clock signal to the phase comparator.

In order to achieve the above object, according to yet still another aspect of the present invention, there is provided a synchronizing signal extracting device comprising: a phase comparator set forth in the second aspect of the present invention; a differentiator for differentiating an pulse train having a frequency that is ½ of a frequency of the input pulse train, and supplying to the phase comparator as the input pulse train; a charge pump unit for increasing a voltage value of an output voltage signal by executing a charging operation when the leading phase instructing pulse is input from the phase comparator, and decreasing the voltage value of the output voltage signal by executing a discharging operation when the lagging phase instructing pulse is input from the phase comparator; and a voltage-controlled oscillator for receiving the voltage signal output from the charge pump unit, generating a clock signal having a frequency that increases as the voltage value of the voltage signal increases, and supplying the generated clock signal to the phase comparator.

According to the above configurations, the precise synchronizing signal can be generated with respect to the pulse train that is brought into the tooth missing state due to a modulation by data, while reducing the number of parts. Also, the pulsation of the detected output can be minimized as small as possible to zero at the point of time when the synchronizing signal having the matched frequency and phase is obtained, and the variable range of the detected output can be expanded. As a result, the frequency variable range of the synchronizing signal can be expanded to enable the high speed response, and also the frequency discriminating function can be provided.

The nature, principle and utility of the invention will become more apparent from the following detailed description when read in conjunction with the accompanying drawings.

BRIEF DESCRIPTION OF THE DRAWINGS

In the accompanying drawings:

FIG. 13 is a schematic diagram showing an example of a waveform obtained when the pulse train input into the synchronizing signal extracting device shown in FIG. 11 is synchronized with the clock signal generated by this synchronizing signal extracting device;

FIG. 39 is a time chart showing an operation of the synchronizing signal extracting device shown in FIG. 38 where no false pulse appears even when the clock signal Xck1 leads in phase 0.5T than the differentiated pulse train Data_Dif:

FIG. 40 is a time chart showing an operation of the synchronizing signal extracting device shown in FIG. 38 where no false pulse appears even when the frequency of the clock signal Xck1 is as high as twice that of the differentiated pulse train Data Dif;

FIG. 41 is a time chart showing an operation of the synchronizing signal extracting device shown in FIG. 38 where no false pulse appears even when the frequency of the clock signal Xck1 is as high as 9/8 times that of the differentiated pulse train Data_Dif; and FIG. 42 is a time chart showing an operation of the synchronizing signal extracting device shown in FIG. 38 where false pulses appear under a certain condition of the frequencies of the clock signal Xck1 and the differentiated pulse train Data_Dif and the delay time of the delay circuits.

DESCRIPTION OF THE PREFERRED EMBODIMENTS

Embodiments of the present invention will be explained in detail with reference to the accompanying drawings hereinafter.

<<Explanation of Configuration>>

Figure 11:
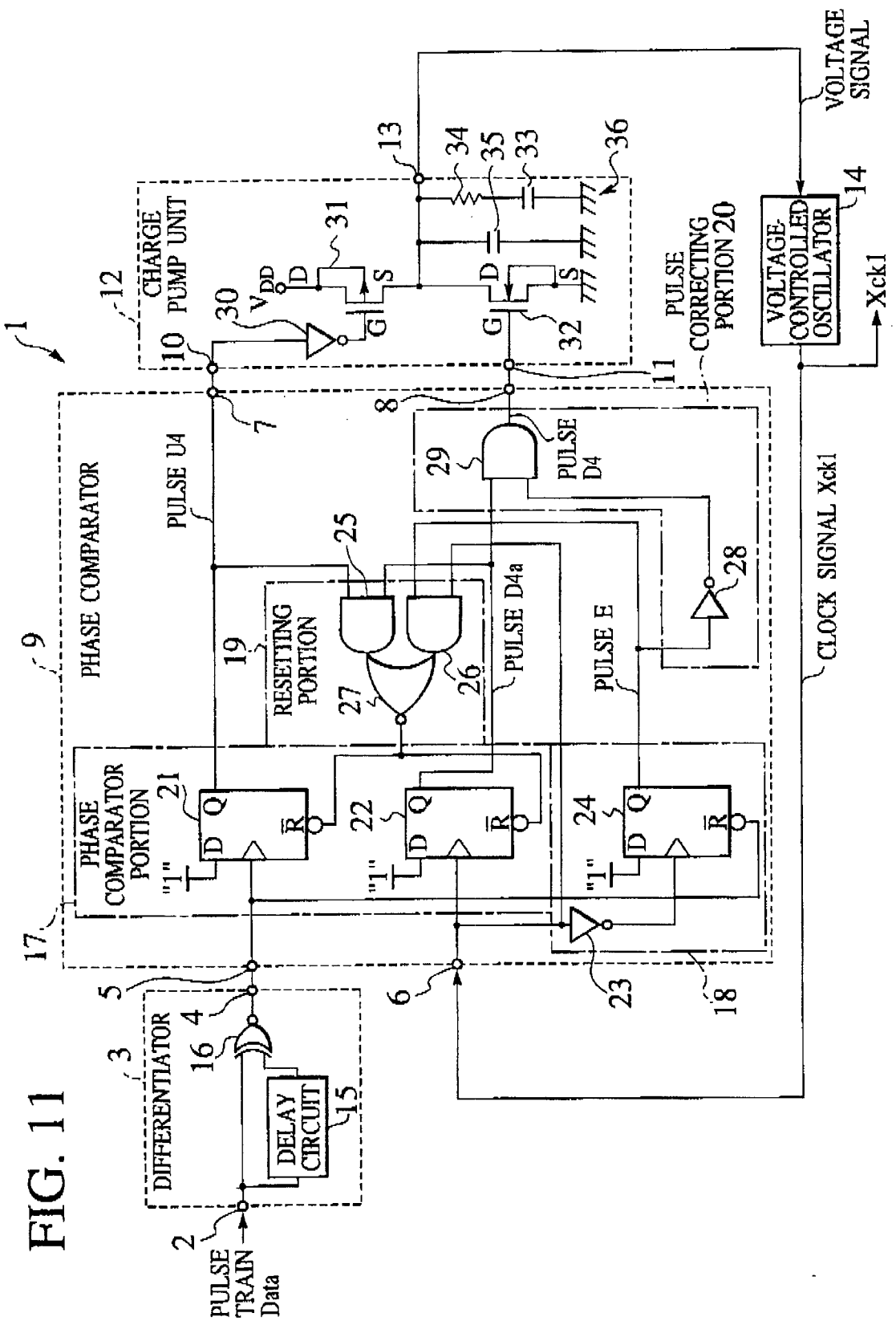
FIG. 11 is circuit diagram showing a phase comparator and a synchronizing signal extracting device according to an embodiment of the present invention.

FIG. 11 is circuit diagram showing a phase comparator and a synchronizing signal extracting device employing this phase comparator according to an embodiment of the present invention.

The synchronizing signal extracting device 1 shown in FIG. 11 comprises a differentiator 3 for differentiating and inverting the discontinuous pulse train Data being input Into an input terminal 2; a phase comparator 9 for comparing the frequency and the phase of the discontinuous differentiated pulse train Data_Dif, that is output from an output terminal 4 of the differentiator 3 and then input into an input terminal 5, with the frequency and the phase of the clock signal Xck1 to generate pulses U4, D4 having a width in accordance with to this compared result, and then outputting them from output terminals 7, 8 respectively; a charge pump unit 12 for increasing a voltage value of a voltage signal by executing a charging operation when the pulse U4 is output from the output terminal 7 of the phase comparator 9 and then input into an input terminal 10, or reducing the voltage value of the voltage signal by executing a discharging operation when the pulse D4 is output from the output terminal 8 of the phase comparator 9 and then input into an input terminal 11; and a voltage-controlled oscillator 14 for increasing the oscillating frequency in compliance with the increase of the voltage value of the voltage signal being output from an output terminal 13 of the charge pump unit 12 or decreasing the oscillating frequency in compliance with the decrease of the voltage value of the voltage signal to then generate the clock signal Xck1.

Then, in this synchronizing signal extracting device 1, the phase of the discontinuous input pulse train Data and the phase of the generated clock signal Xck1 are compared with each other, then the oscillating frequency and the phase of the voltage-controlled oscillator 14 are controlled based on this compared result such that the phase of the discontinuous input pulse train Data can coincide with the phase of the clock signal Xck1, and the clock signal Xck1 which coincides In phase with the discontinuous input pulse train Data is generated.

The differentiator 3 includes a delay circuit 15 and an exclusive-NOR circuit 16. The delay circuit 15 consists of a transmission line, a multi-stage gate circuit, an integrating circuit using resistors, capacitors, etc., or the like, and receives the discontinuous pulse train Data input into the input terminal 2 and then delays it by a time, e.g., corresponding to the ½ width of the minimum pulse width. The exclusive-NOR circuit 16 calculates the exclusive-OR between the discontinuous pulse train Data input into the input terminal 2 and the delayed pulse train Data output from the delay circuit 15, then generates the differentiated pulse train Data_Dif consisting of the pulses that have a width corresponding to the delay time of the delay circuit 15 with respect to the width of the pulses in the pulse train Data and are inverted, and then outputs this from the output terminal 4 to supply to the input terminal 5 of the phase comparator 9.

The phase comparator 9 includes a phase comparator portion 17, a correcting pulse generating portion 18, a resetting portion 19, and a pulse correcting portion 20. The phase comparator portion 17 compares the frequency and the phase of the differentiated pulse train Data_Dif being input into the input terminal 5 with the frequency and the phase of the clock signal Xck1 being input into the input terminal 6, and then generates a pulse U4 (leading phase instruction (charge instruction) pulse) or a pulse D4a (lagging phase instruction (discharge instruction) pulse) in accordance with this compared result. The correcting pulse generating portion 18 generates a correcting pulse E based on the clock signal Xck1 input into the input terminal 6 and the differentiated pulse train Data_Dif input into the input terminal 5. The resetting portion 19 resets the phase comparator portion 17, based on the pulse E output from the correcting pulse generating portion 18, the clock signal Xck1 input into the input terminal 6, and the pulses U4, D4a output from the phase comparator portion 17. The pulse correcting portion 20 removes the false pulse contained in the pulse D4a by using the correcting pulse E, based on the pulse E being output from the correcting pulse generating portion 18.

The phase comparator portion 17 consists of two D flip-flop circuits 21, 22. The D flip-flop circuit 21 acquires the "1" signal being Input into the data Input terminal D every time when the differentiated pulse train Data_Dif that is input into the clock terminal via the input terminal 5 is raised, and then outputs this "1" signal from the data output terminal Q while holding it and then resets the held content to then output the "0" signal from the data output terminal Q every time when the "0" signal (the "1" signal in the negative logic) is input into the reset terminal R. The D flip-flop circuit 22 acquires the "1" signal being input into the data input terminal D every time when the clock signal Xck1 that is input into the clock terminal via the input terminal 6 is raised, and then outputs this "1" signal from the data output terminal Q while holding it and then resets the held content to then output the "0" signal from the data output terminal Q every time when the "0" signal (the "1" signal in the negative logic) is input into the reset terminal R.

The correcting pulse generating portion 18 includes an inverter circuit 23, and a D flip-flop circuit 24. The inverter circuit 23 is a circuit for inverting the clock signal Xck1 being input into the input terminal 6. The D flip-flop circuit 24 acquires the "1" signal being input into the data input terminal D every time when the inverted clock signal Xck1 output from the inverter circuit 23 is raised, and outputs this signal from the data output terminal Q while holding this, and also resets the held content to then output the "0" signal from the data output terminal Q every time when the differentiated pulse train Data_Dif input into the input terminal 5 is "1" and thus the "o" signal (the "1" signal in the negative logic) is input into the reset terminal R.

The resetting portion 19 includes two AND circuits 25, 26, and a NOR circuit 27, The AND circuit 25 calculates the logical product of the pulses U4, D4a being output from the D flip-flop circuits 21, 22 of the phase comparator portion 17 respectively. The AND circuit 26 calculates the logical product of the clock signal Xck1 input into the input terminal 6 and the pulse E output from the D flip-flop circuit 24 of the correcting pulse generating portion 18. The NOR circuit 27 calculates the logical sum of calculated results of the AND circuits 25, 26 and then inverts it.

The pulse correcting portion 20 includes an inverter circuit 28 and an AND circuit 29. The inverter circuit 28 Inverts the pulse E being output from the D flip-flop circuit 24 of the correcting pulse generating portion 18. The AND circuit 29 calculates the logical product of the inverted signal of the pulse E output from the inverter circuit 28 and the pulse D4a output from the D flip-flop circuit 22 of the phase comparator 17, This pulse correcting portion 20 causes the inverter circuit 28 to invert the pulse E being output from the D flip-flop circuit 24 of the correcting pulse generating portion 18, and acquires the pulse D4a being output from the D flip-flop circuit 22 of the phase comparator 17 when the inverted signal of the pulse E is "1", and then supplies this pulse to the input terminal 11 of the charge pump unit 12 as the pulse D4. That is, D4a is inhibited to output to terminal 8 during E is "1".

The charge pump unit 12 includes an inverter circuit 30, a P-channel MOS transistor 31, an N-channel MOS transistor 32, a capacitor 33, a resistor 34, and a capacitor 35. The inverter circuit 30 inverts the pulse U4 input via the input terminal 10. The P-channel MOS transistor 31 receives the inverted signal of the pulse U4 output from the inverter circuit 30 via the gate terminal, and turns ON to pull the voltage of the source terminal up to the power supply voltage $V_{DD}$ by using the power supply voltage $V_{DD}$ applied to the drain terminal during when the Inverted signal of the pulse U4 is "0", i.e., when the pulse U4 is being output from the output terminal 7 of the phase comparator 9. The N-channel MOS transistor 32 receives the pulse D4 being input into the input terminal 11 via the gate terminal, and also reduces the voltage of the drain terminal to the ground voltage "0" of the source terminal during when this pulse D4 is "1". The capacitor 33 executes a charging operation by the power supply voltage $V_{DD}$ generated at the source terminal of the P-channel MOS transistor 31 when the P-channel MOS transistor 31 is in its conductive state, and executes a discharging operation by the ground voltage generated at the drain terminal of the N-channel MOS transistor 32 when the N-channel MOS transistor 32 is in its conductive state. Also, the capacitor 33 has the operation for holding the compared output voltage at the phase coincidence point. The resistor 34 as well as the capacitance of the capacitor 33 decides the time constant. The capacitor 35 is a bypass capacitor that attenuates a high-frequency component, and stabilizes the voltage value of the generated voltage signal.

While increasing the oscillating frequency in accordance with the increase of the voltage value of the voltage signal output from the charge pump unit 12 and also decreasing the oscillating frequency in accordance with the decrease of the voltage value of the voltage signal, the voltage-controlled oscillator 14 feeds back the clock signal Xck1, that is obtained by the oscillating operation, to the input terminal 6 of the phase comparator 9 and also supplies this clock signal Xck1 to the succeeding stage system (not shown).

<<Explanation of Operation>>

Then, an operation of this synchronizing signal extracting device will be explained in detail with reference to the circuit diagram shown in FIG. 11 and time charts shown in FIG. 12 to FIG. 17 hereunder.

<The case where phases of the differentiated pulse train and the clock signal coincide with each other>

Figure 12:
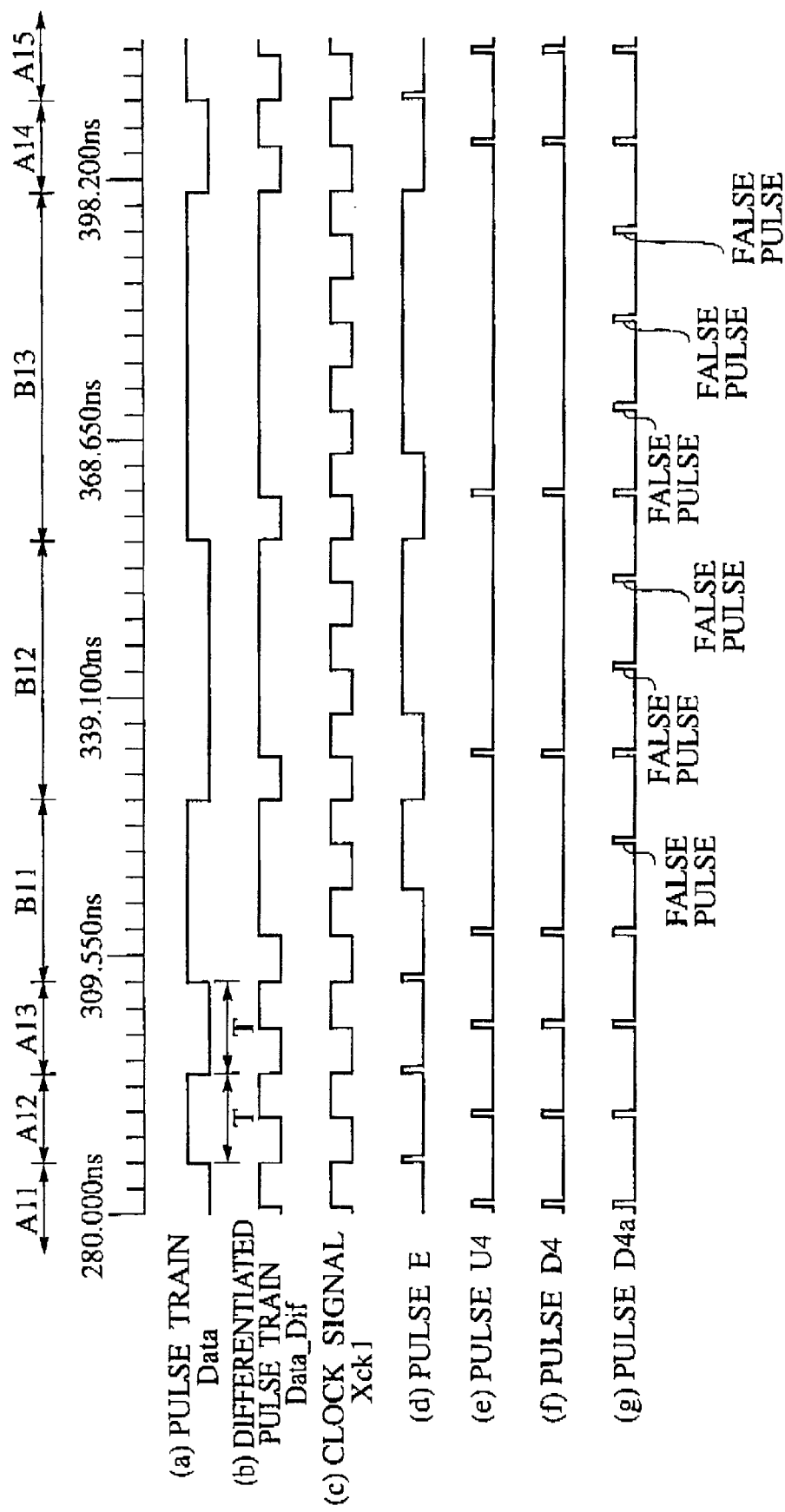
FIG. 12 is a time chart showing an example of an operation executed when a pulse train input into the synchronizing signal extracting device shown in FIG. 11 is synchronized with a clock signal generated by this synchronizing signal extracting device.

In FIG. 12, periods A11, A12, A13, A14, A15 show the state in which no missing pulse exists respectively, and periods B11, B12, B13 shows the state in which one, two, and three pulses are missing respectively.

The D flip-flop circuit 24 of the correcting pulse generating portion 18 reads and outputs "1" when the clock signal Xck1 input into the input terminal 6 is fallen down. and is reset to "0" during when the differentiated pulse train Data_Dif is low level "0", that is obtained by differentiating the pulse train Data input into the input terminal 2 by the differentiator 3 and input into the input terminal 5. Accordingly, as shown by the pulse E in (d) of FIG. 12, in the periods such as B11, B12, B13, etc. in which the pulse missing occurs, the differentiated pulse train Data_Dif is "1" at the time of falling down, therefore the pulse having the wide width is generated corresponding to the pulse missing period.

The D flip-flop circuit 21 is triggered at the rise of the differentiated pulse train Data_Dif input into the input terminal 5 and thus reads and outputs "1". The D flip-flop circuit 22 is triggered at the rising edge of the clock signal Xck1 input into the input terminal 6 and thus reads and outputs "1". Since the outputs of these D flip-flop circuits 21, 22 are input into the AND circuit 25 of the resetting portion 19, both the D flip-flop circuits 21, 22 are reset via the NOR circuit 27 when both inputs of the AND circuit 25 are "1". Likewise, since an output of the delayed flip-flop circuit 24, i.e., the pulse E and the signal input into the input terminal 6. i.e., the clock signal Xck1 are connected to the AND circuit 26 of the resetting portion 19, both the D flip-flop circuits 21, 22 are reset via the NOR circuit 27 when both inputs of the AND circuit 26 are "1".

Therefore, in the periods such as A11, A12, A13, etc. in which no pulse missing occurs, since the pulse E shown in (d) of FIG. 12 is "0" at the rise of the clock signal Xck1, only the AND circuit 25 and the NOR circuit 27 in the resetting portion 19 can function substantially.

Meanwhile, in the periods such as B11, B12, B13, etc. in which the pulse missing occurs, the D flip-flop circuit 21 reads and outputs "1" at the rise of the clock signal Xck1. However, since the pulse E is "1" and also the clock signal Xck1 is "1" in these periods, both the D flip-flop circuits 21, 22 are reset via the AND circuit 26 and the NOR circuit 27 in the resetting portion 19. In this case, the D flip-flop circuit 21 has already been reset, but no problem occurs even if the circuit 21 is reset again, Thus, during missing pulse period, D flip-flop 21 and 22 are both reset, so no decision is made by this phase comparator. As a result, the output waveforms of the D flip-flop circuits 21, 22 are given as the pulse U4 shown in (e) of FIG. 12 and the pulse D4a shown in (g) of FIG. 12.

However, in the pulse D4a shown in (g) of FIG. 12, the pulses labeled as the "false pulse" is generated In the pulse missing period and thus do not correspond to the pulse U4 shown in (e) of FIG. 12, such pulses must be removed. For this reason, in FIG. 11, the output of the D flip-flop circuit 24, i.e., the pulse E is inverted by the inverter circuit 28 in the pulse correcting portion 20 and then connected to one input of the AND circuit 29 and the output of the D flip-flop circuit 22, i.e., the pulse D4a is connected to the other input of the AND circuit 29, and then the output of the AND circuit 29 is connected to the output terminal 8 to serve as the pulse D4. According to such configuration, as shown by the pulse D4 in (f) of FIG. 12, the false pulse can be removed by inhibiting the output of the pulse D4a during when the pulse E is "1", i.e. in the pulse missing period, so that the pulse D4 which corresponds to the pulse U4 can be generated. Since the pulse U4 and the pulse D4 are generated simultaneously and the pulse width is narrow, the pulsation of the voltage in the charge pump unit 12 In the succeeding stage can be suppressed as small as possible and thus the synchronizing device with the small jitter can be achieved.

Also, since the pulse U4 and the pulse D4 are generated simultaneously and the pulse width is narrow, the pulsation can be suppressed low even if there is difference between the charging current and the discharging current of the P-channel MOS transistor 31 and the N-channel MOS transistor 32. FIG. 13 shows an output voltage that has an extremely small value when the resistance value of the resistor 34=390 Ω, the capacitance value of the capacitor 33=0.047 μF, the capacitance value of the capacitor 35=20 pF, the voltage value of the power supply $V_{DD}$=5 V, and the frequency=100 MHz, as shown in FIG. 11.

<The case where the clock signal goes ahead of the pulse train>

Figure 14:
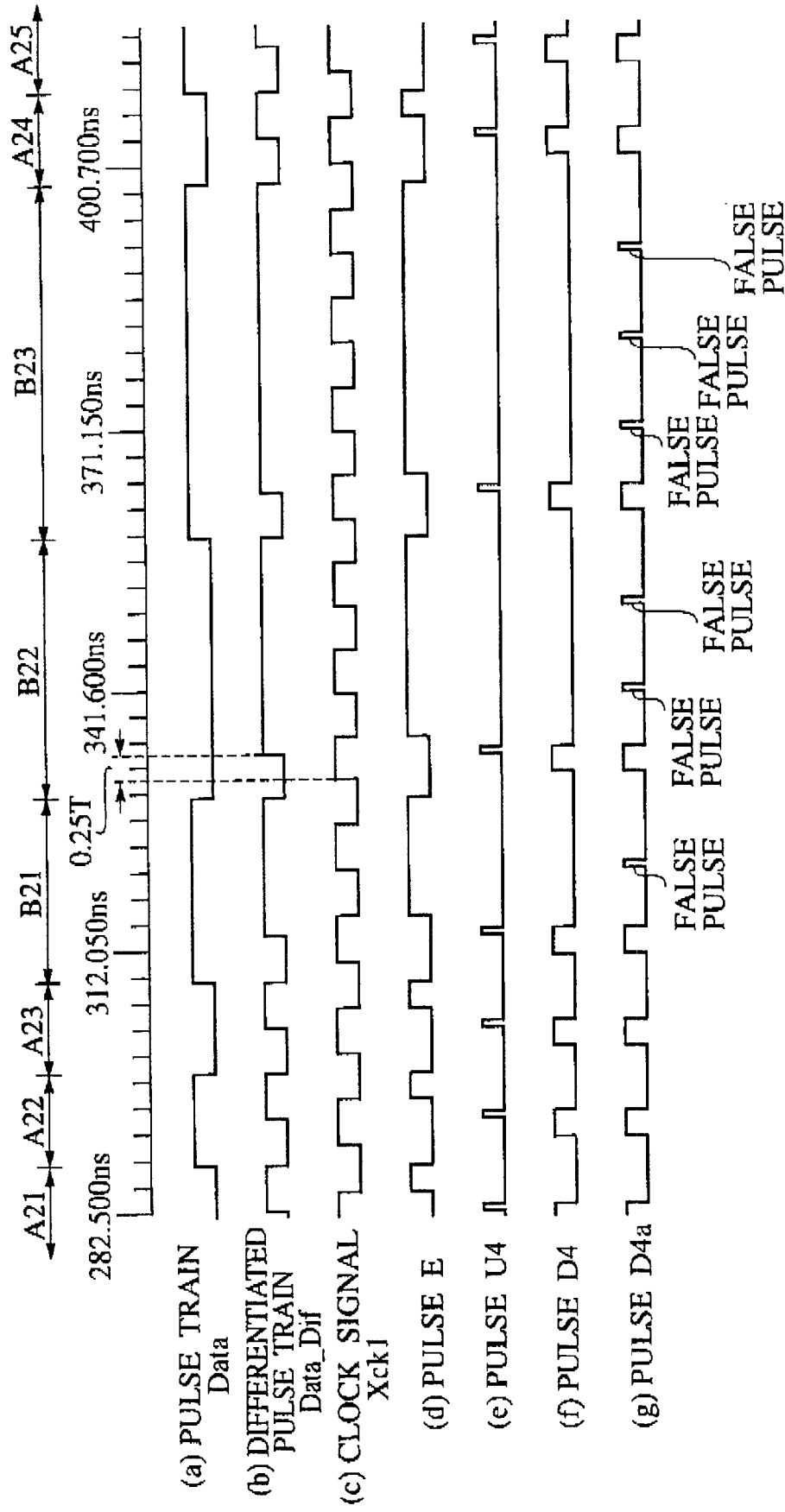
FIG. 14 is a time chart showing an example of an operation executed when a phase of the differentiated pulse of the pulse train input Into the synchronizing signal extracting device shown in FIG. 11 lags behind a phase of the clock signal generated by this synchronizing signal extracting device.

FIG. 14 shows the case where the phase of the clock signal Xck1 goes ahead of the differentiated pulse train Data_Dif by 0.25T. In this case, since the rise of the clock signal Xck1 come earlier than the rise of the differentiated pulse train Data_Dif, the D flip-flop circuit 22 shown in FIG. 11 reads "1" and outputs "1" earlier and then the differentiated pulse train Data_Dif rises, so that both the D flip-flop circuits 21, 22 are reset.

Accordingly, the pulse width of the output pulse D4a of the D flip-flop circuit 22 is given by the width of (the phase difference between the rise of the clock signal Xck1 and the rise of the differentiated pulse train Data_Dif)+(operation delay times of the resetting portion 19, etc.). That is, the output has the pulse width that is in proportion to the phase difference. In contrast, the pulse width of the output pulse U4 of the D flip-flop circuit 21 is given by the narrow pulse width that corresponds to the operation delay times of the resetting portion 19, etc.

Also, since the false pulse can be removed from the pulse D4a by the above action of the pulse E to give the pulse D4, the pulse D4 having the pulse width that is in proportion to the phase difference can be obtained. In other words, since the pulse width of the pulse D4 shown in (f) of FIG. 14 is wider than the pulse U4 shown in (e) of FIG. 14, the output is generated to lag the phase by lowering the voltage of the output terminal 13 via the charge pump unit 12 and lowering the frequency of the voltage-controlled oscillator 14. As a result, the output of the charge pump unit 12 is also in proportion to this phase difference.

<The case where the clock signal lags behind the pulse train>

Figure 15:
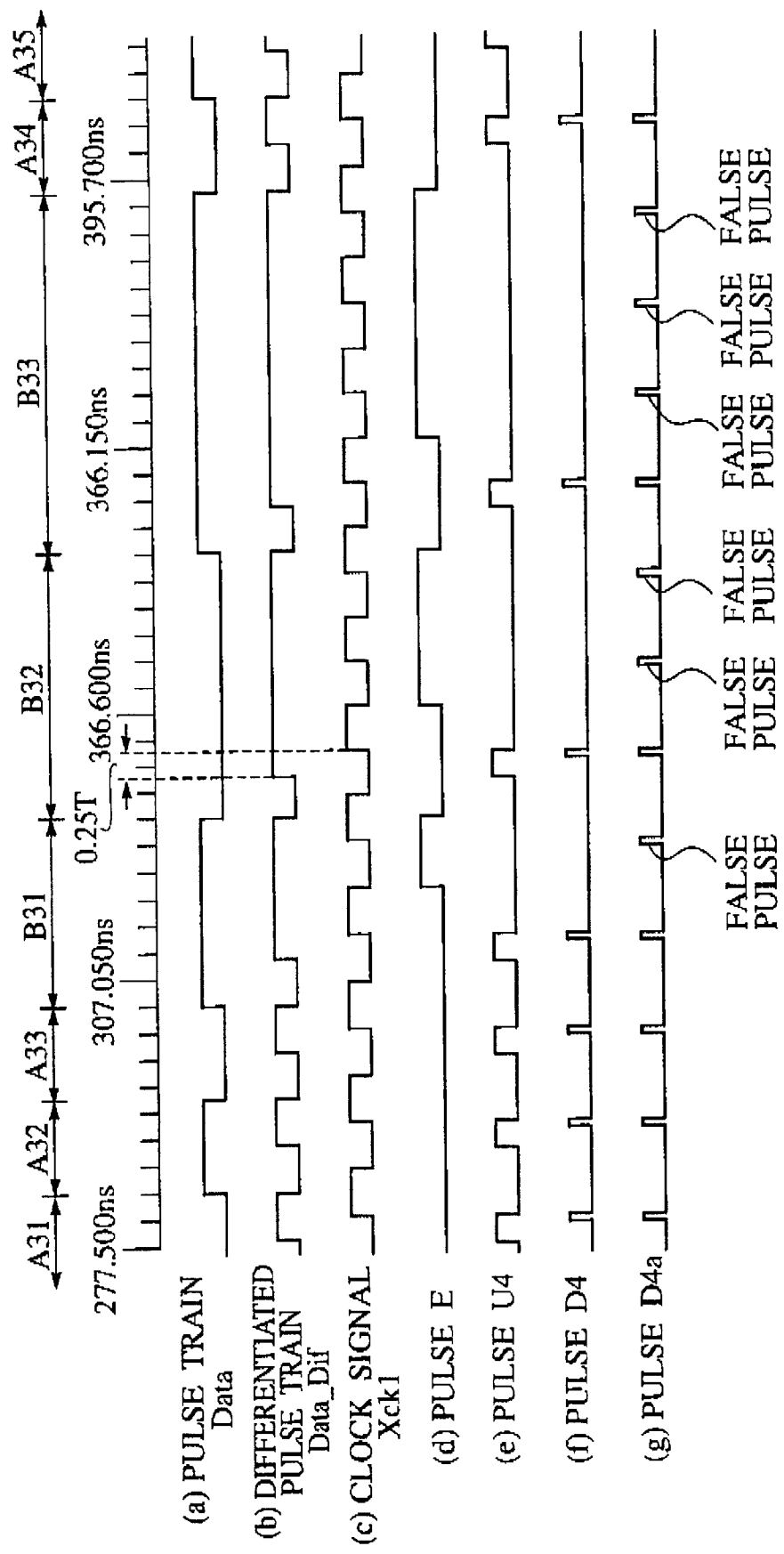
FIG. 15 is a time chart showing an example of an operation executed when a phase of the differentiated pulse of the pulse train input into the synchronizing signal extracting device shown in FIG. 11 leads ahead of a phase of the clock signal generated by this synchronizing signal extracting device.

FIG. 15 shows the case where the phase of the clock signal Xck1 lags behind the differentiated pulse train Data_Dif by 0.25T oppositely to the above. Since the D flip-flop circuit 21 reads and outputs "1" earlier than the D flip-flop circuit 22 conversely, and the pulse width of the pulse U4 shown in (e) of FIG. 14 becomes wider, so that the output is generated to increase the frequency of the voltage-controlled oscillator 14 and to advance the phase. In this case, since the pulse width of the pulse U4 is in proportion to the phase difference between the differentiated pulse train Data_Dif and the clock signal Xck1, the output of the charge pump unit 12 is also in proportion to the phase difference.

<The case where the frequency of the clock signal is changed by "±10%">

Figure 16:
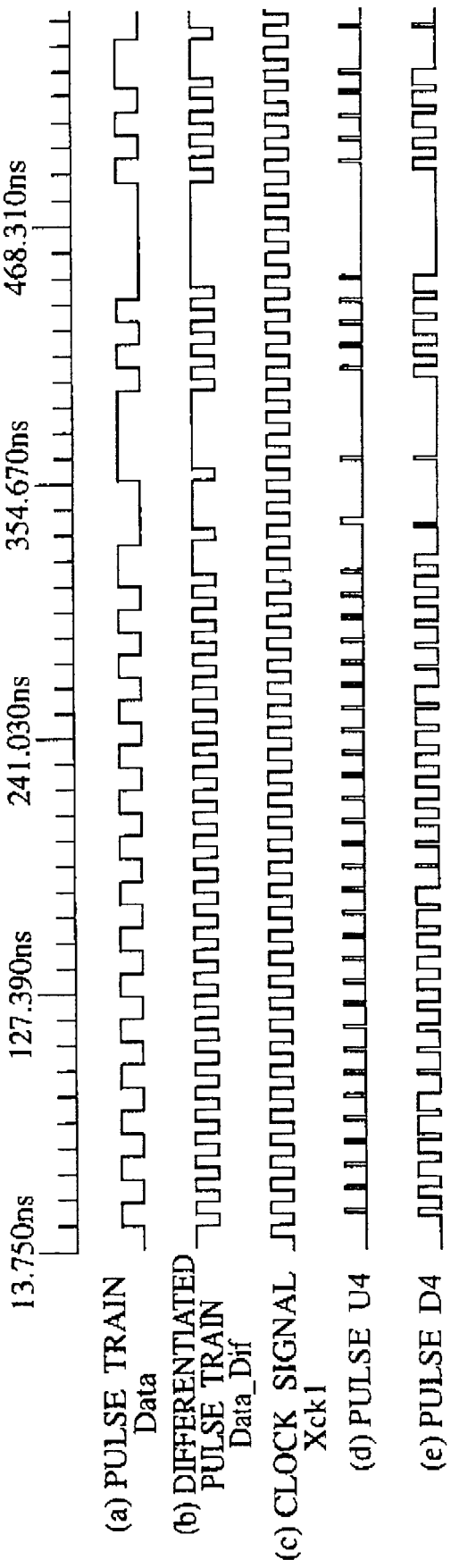
FIG. 16 is a time chart showing an example of an operation executed when a frequency of the local clock of voltage controlled oscillator (VCO) input into the synchronizing signal extracting device shown in FIG. 11 is increased by "10%"

FIG. 16 shows the case where the frequency of the clock signal Xck1 is higher than the frequency of the pulse train Data by 10%. The pulse U4 shown in (d) of FIG. 16 has the minimum pulse width, and the pulse P4 shown in (e) of FIG. 16 has the wider pulse width. Thus, only the output is generated to lower substantially the frequency.

Figure 17:
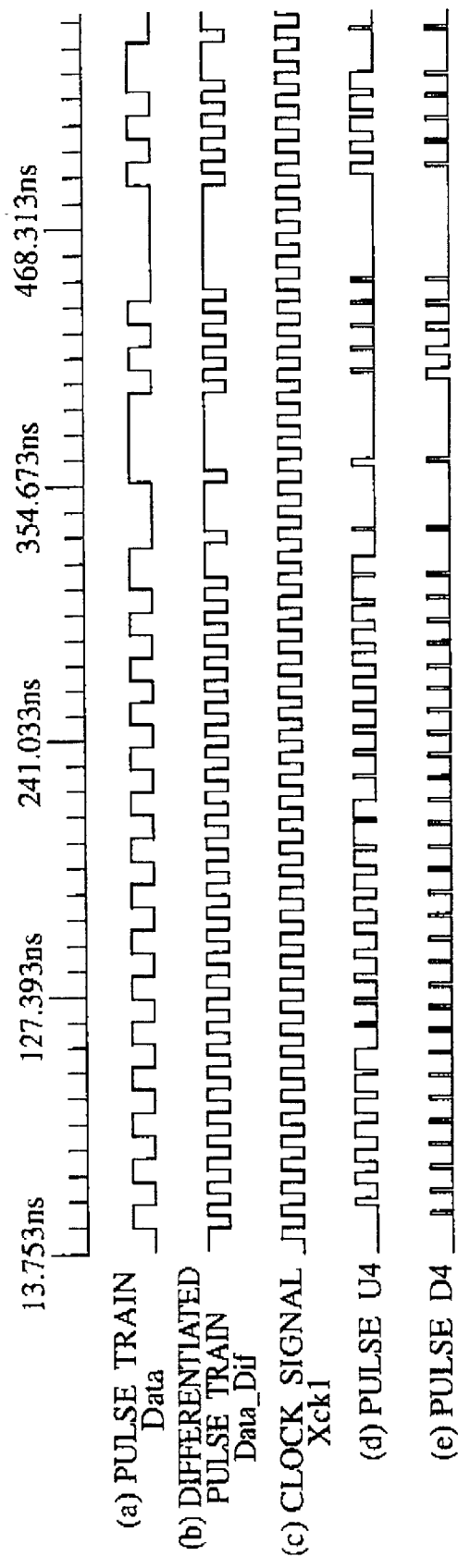
FIG. 17 is a time chart showing an example of an operation executed when a frequency of the local clock of voltage controlled oscillator (VCO) input into the synchronizing signal extracting device shown in FIG. 11 is decreased by "10%"

In contrast, FIG. 17 shows the case where the frequency of the clock signal Xck1 is lower than the frequency of the pulse train Data by 10%. The pulse D4 shown in (e) of FIG. 17 has the minimum pulse width, and the pulse U4 shown in (d) of FIG. 17 has the wider pulse width. Thus, only the output is generated to increase substantially the frequency.

Accordingly, the device shown in FIG. 11 as the embodiment of the present invention has not only the phase comparing function but also the frequency discriminating function. The device having above two functions is very excellent as the synchronizing device.

In other words, if the frequencies are separated away from each other, the frequency acquisition (also called "frequency pulling-in") for matching the frequency can be achieved only by the phase comparing function, but there are the disadvantages that much time might be required to acquire the frequency and that the operation is trapped in the middle of the frequency acquisition by the noise, etc. and cannot go out of such trap. In contrast, in the synchronizing device having the frequency discriminating function in the present invention, it is possible to acquire (to pull in) the frequency in a very short time and to make the phase equal. In addition, as shown in FIG. 16 and FIG. 17, even if the tooth missing state is present in the input pulse train, the output to respond to the frequency level can be generated surely according to the frequency level without the influence of such tooth missing state.

<<Advantages>>

In this manner, in this embodiment, the frequency and the phase of the differentiated pulse train Data_Dif input into the input terminal 5 are compared with the frequency and the phase of the clock signal Xck1 input into the input terminal 6 while generating the correcting pulse E based on the clock signal Xck1 input into the input terminal 6, then the pulses U4, D4a are generated based on this compared result, then the false pulses contained in the pulse D4a are removed by using the correcting pulse E when the tooth missing state is present in the differentiated pulse train Data_Dif input into the input terminal 5, and then only the precise pulses U4, D4 are output from the output terminals 7, 8. Therefore, the precise clock signal Xck1 can be generated with respect to the pulse train Data, that is modulated by the data to produce the tooth missing state, while reducing the number of parts, and also the pulsation of the voltage signal can be minimized as small as possible to zero not to generate the jitter, etc. at a point of time when the clock signal Xck1 having the matched frequency and phase is obtained.

Also, the pulse U4 output from the phase comparator 9 can be synchronized with the pulse D4, and also at least one of the pulse U4 and pulse D4 can be reduced to the minimum width at the phase coincidence point. Accordingly, the variable range of the voltage signal output from the charge pump unit 12 can be expanded. That is, a ratio of the output voltage of the operation point to the output voltage of phase coincidence point, i.e., a figure of merit indicating the performance of the phase comparator can be maximized.

In addition, the high frequency discriminating function can be provided to the phase comparator 9, and thus the operation in the frequency acquiring stage such as the power supply ON stage, etc. can be made advantageous.

Further, in this embodiment, even when the frequency and the phase of respective pulses constituting the pulse train Data coincide with the frequency and the phase of the clock signal Xck1 output from the voltage-controlled oscillator 14 and also the rise timing of the differentiated pulse train Data_Dif output from the exclusive-NOR circuit 16 in the differentiator 3 coincide with the rise timing of the clock signal Xck1 output from the voltage-controlled oscillator 14, the P-channel MOS transistor 31 and the N-channel MOS transistor 32 in the charge pump unit 12 can be operated by outputting the pulses U4, D4 having extremely narrow widths that differ from each other by a value that corresponds to the phase difference. Therefore, the difference can be provided between the conduction time of the P-channel MOS transistor 31 and the conduction time of the N-channel MOS transistor 32 by the difference (phase difference) between the rising timing of the differentiated pulse train Data_Dif output from the exclusive-NOR circuit 16 in the differentiator 3 and the rising timing of the clock signal Xck1 output from the voltage-controlled oscillator 14. As a result, the dead band can be eliminated and the response characteristic can be improved.

In this embodiment, when the pulse train Data input into the input terminal 2 is in the tooth missing state, the false pulses are present in the pulse D4 output from the phase comparator 9 and such false pulses are removed by the pulse correcting portion 20. However, in the system in which the restrict phase comparison is not needed, the false pulses having the extremely narrow width may be output as they are by omitting such pulse correcting portion 20.

<<Another Embodiment>>

In the above embodiment, when the pulse U4 is output from the D flip-flop circuit 21 constituting the phase comparator portion 17 and also the pulse D4a is output from the D flip-flop circuit 22, or when the pulse E is output from the D flip-flop circuit 24 in the correcting pulse generating portion 18 and also the clock signal Xck1 input into the input terminal 6 is raised, the D flip-flop circuits 21, 22 constituting the phase comparator portion 17 are reset by the resetting portion 19 in the phase comparator 9. A phase comparator 41 may be constructed by using other resetting portion, for example, a resetting portion 40 having a configuration shown in FIG. 18.

Figure 18:
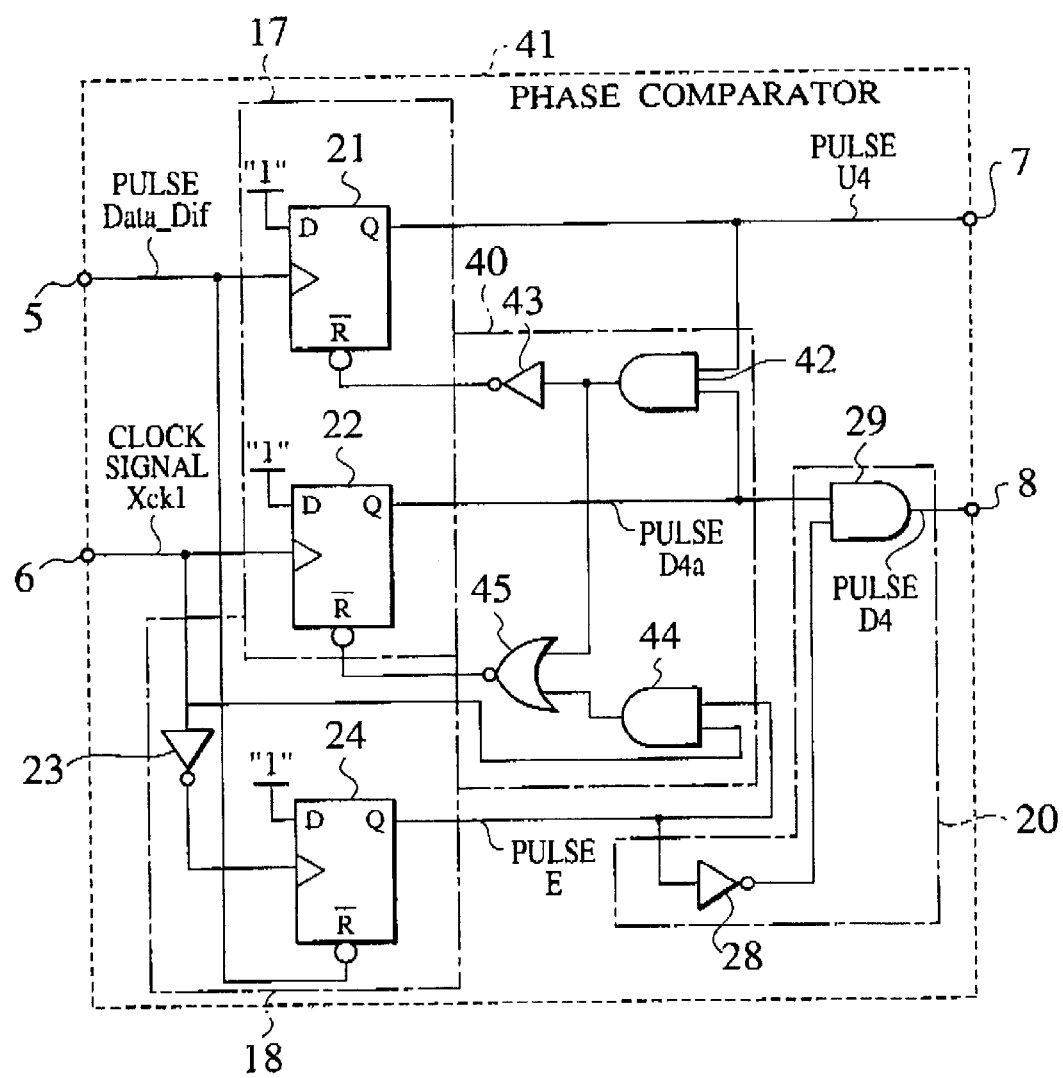
FIG. 18 is a circuit diagram showing a phase comparator according to another embodiment of the present invention.

The resetting portion 40 shown in FIG. 18 comprises an AND circuit 42 for calculating a logical product between the pulses U4, D4a output from the data output terminals D of the D flip-flop circuits 21, 22 constituting the phase comparator portion 17; an inverter circuit 43 for inverting the calculated result of the AND circuit 42 to supply it to the reset terminal R of the D flip-flop circuit 21; an AND circuit 44 for calculating a logical product between the clock signal Xck1 input into the input terminal 6 and the pulse E output from the data output terminal D of the D flip-flop circuit 24 constituting the correcting pulse generating portion 18; and a NOR circuit 45 for calculating a logical sum between calculated results of the AND circuits 42, 44 and then inverting it to supply to the reset terminal R of the D flip-flop circuit 22. When both the pulses U4, D4a output from the D flip-flop circuits 21, 22 In the phase comparator portion 17 are "1", the D flip-flop circuits 21, 22 are reset by generating the "0" signal (the "1" signal in the negative logic). When the clock signal Xck1 input into the input terminal 6 is "1" in the situation that the pulse E output from the D flip-flop circuit 24 in the correcting pulse generating portion 18 is "1", the "0" signal (the "1" signal in the negative logic) is generated to reset only the D flip-flop circuit 22 in the phase comparator portion 17.

When the pulse train Data is in the tooth missing state even if such resetting portion 40 is employed, the D flip-flop circuit 22 can be reset. Accordingly, while reducing the cost of the overall system by using the general part, the precise clock signal Xck1 can be generated with respect to the pulse train Data that is brought into the tooth missing state due to a modulation by data. Also, the pulsation of the voltage signal can be minimized as small as possible to zero at a point of time when the clock signal Xck1 having the matched frequency and phase is obtained, and the variable range of the detected output can be expanded. As a result, the frequency variable range of the clock signal Xck1 can be expanded to enable the high speed response, and also the frequency discriminating function can be provided.

Also, in this embodiment, even when the frequency and the phase of respective pulses constituting the pulse train Data coincide with the frequency and the phase of the clock signal Xck1 output from the voltage-controlled oscillator 14 and also the rise timing of the differentiated pulse train Data_Dif output from the exclusive-NOR circuit 16 in the differentiator 3 coincide with the rise timing of the clock signal Xck1 output from the voltage-controlled oscillator 14. the P-channel MOS transistor 31 and the N-channel MOS transistor 32 in the charge pump unit 12 can be operated by outputting the pulses U4, D4 having extremely narrow widths that differ from each other by a value that corresponds to the phase difference. Therefore, the difference can be provided between the conduction time of the P-channel MOS transistor 31 and the conduction time of the N-channel MOS transistor 32 by the difference (phase difference) between the rising timing of the differentiated pulse train Data_Dif output from the exclusive-NOR circuit 16 in the differentiator 3 and the rising timing of the clock signal Xck1 output from the voltage-controlled oscillator 14. As a result, the dead band can be eliminated and the response characteristic can be improved.

In this embodiment, when the pulse train Data input into the input terminal 2 is brought into the tooth missing state, the false pulses are present in the pulse D4 output from the phase comparator 41 and such false pulses are removed by the pulse correcting portion 20. However, in the system in which the restrict phase comparison is not needed, the false pulses having the extremely narrow width may be output as they are by omitting such pulse correcting portion 20.

<Still Another Embodiment>>

Also, in the above embodiment, when the pulse E is output from the D flip-flop circuit 24 in the correcting pulse generating portion 18, the AND circuit 29 is brought into its pulse-passing inhibit state by inverting this pulse E by virtue of the inverter circuit 28 in the pulse correcting portion 20. Thus, even if the false pulses D4a are output from the D flip-flop circuit 22 in the phase comparator portion 17, the false pulses D4a are prevented from being output to the charge pump unit 12. However, as shown in FIG. 19, if a phase comparator 50 in which the inverted signal of the clock signal Xck1 output from the inverter circuit 23 in the correcting pulse generating portion 18 is directly input into the AND circuit 26 of the resetting portion 19 is employed, the false pulse D4a can be prevented from being output from the D flip-flop circuit 22 in the phase comparator 17, and thus the pulse correcting portion 20 may be omitted.

When the pulse train Data is brought into the tooth missing state even if such phase comparator 50 is employed, the D flip-flop circuits 21, 22 can be reset to prevent the malfunction. Accordingly, like the above embodiment, while reducing mostly the number of parts, the precise clock signal Xck1 can be generated with respect to the pulse train Data that is brought into the tooth missing state due to a modulation by data. Also, the pulsation of the voltage signal can be minimized as small as possible to zero at a point of time when the clock signal Xck1 having the matched frequency and phase is obtained, and the variable range of the detected output can be expanded. As a result, the frequency variable range of the clock signal Xck1 can be expanded to enable the high speed response, and also the frequency discriminating function can be provided.

Also, in this embodiment, even when the frequency and the phase of respective pulses constituting the pulse train Data coincide with the frequency and the phase of the clock signal Xck1 output from the voltage-controlled oscillator 14 and also the rise timing of the differentiated pulse train Data_Dif output from the exclusive-NOR circuit 16 in the differentiator 3 coincide with the rise timing of the clock signal Xck1 output from the voltage-controlled oscillator 14, the P-channel MOS transistor 31 and the N-channel MOS transistor 32 in the charge pump unit 12 can be operated by outputting the pulses U4, D4 having extremely narrow widths that differ from each other by a value that corresponds to the phase difference. Therefore, the difference can be provided between the conduction time of the P-channel MOS transistor 31 and the conduction time of the N-channel MOS transistor 32 by the difference (phase difference) between the rising timing of the differentiated pulse train Data_Dif output from the exclusive-NOR circuit 16 in the differentiator 3 and the rising timing of the clock signal Xck1 output from the voltage-controlled oscillator 14. As a result, the dead band can be eliminated and the response characteristic can be improved.

Figure 19:
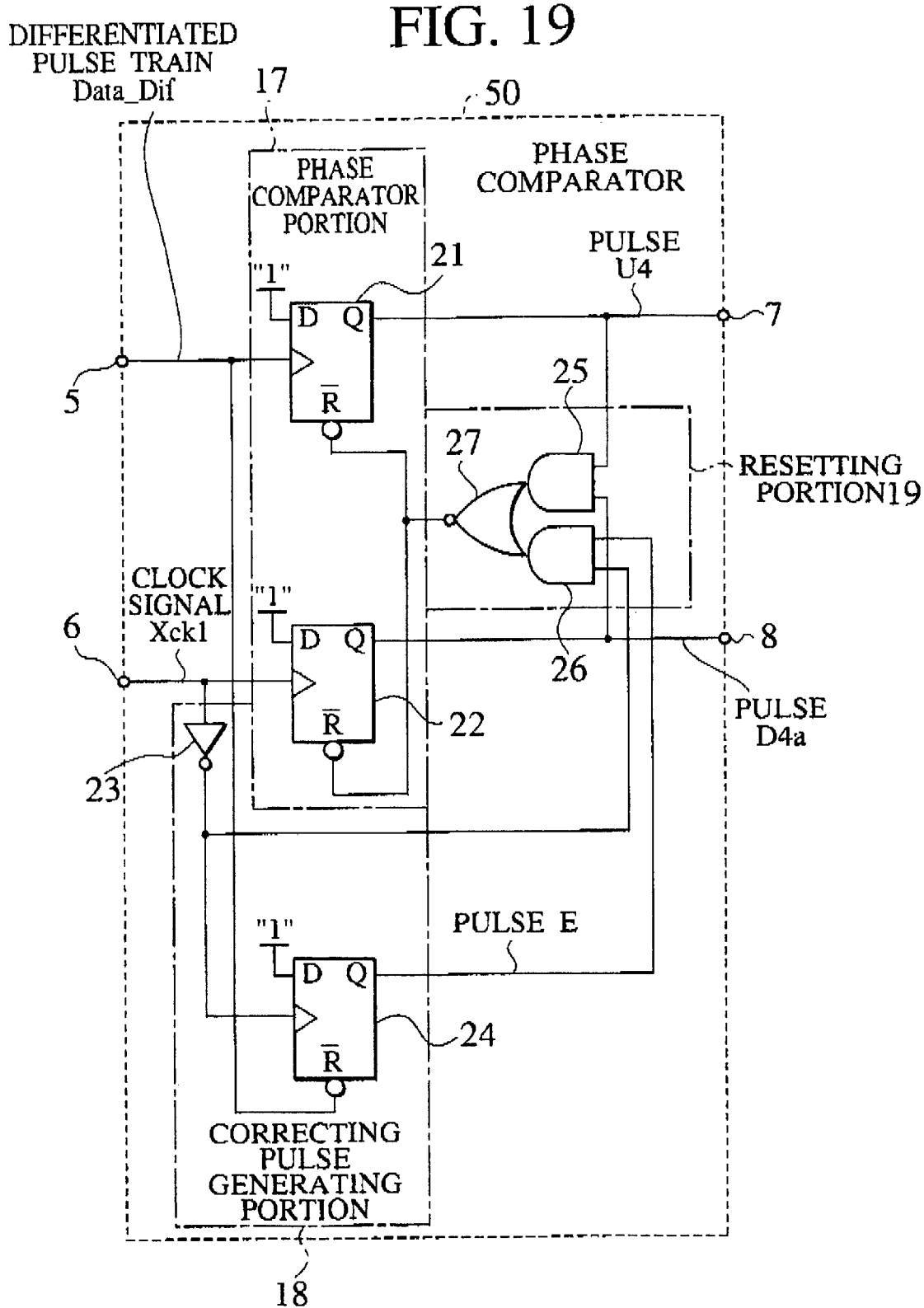
FIG. 19 is a circuit diagram showing a phase comparator according to still another embodiment of the present invention.

Furthermore, the inverter circuit 23 constituting the correcting pulse generating portion 18 in the phase comparator shown in above FIG. 11, FIG. 18, and FIG. 19 may be replaced with the delay circuit or the delay element having the same function as the delay circuit 15.

Also, in the above embodiment, the differentiator 3 consists of the delay circuit 15 for delaying the pulse train Data, and the exclusive-NOR circuit 16 for calculating the exclusive-NOR between the output of the delay circuit 15 and the pulse train Data. But the present invention is not limited to this. This is because distortion of the pulse width is caused according to the transmitting medium, and thus the rise and the fall of the input pulse train Data are distorted, and therefore the phase comparison employing both the rise and the fall of the pulse train Data is affected by the jitter.

The differentiator 3 may consist of the delay circuit 15 for delaying the pulse train Data, the inverter circuit for inverting the output or the delay circuit 15, and the NAND circuit for calculating NAND between the output of this inverter circuit and the pulse train Data, and then the output of this NAND circuit may be used as the output (the differentiated pulse train Data_Dif) of the differentiator 3. According to this configuration, the precise phase comparison that can reduce the influence of the jitter, although the number of comparison times is reduced by half, can be achieved by executing the phase comparison employing any one of the rise and the fall of the pulse train Data.

<<Yet Still Another Embodiment>>

Next, a yet still another embodiment of the present invention will be explained hereunder.

First, the concept of this embodiment will be explained with reference to FIG. 9 and FIG. 10 in the prior art hereunder.

Figure 9:
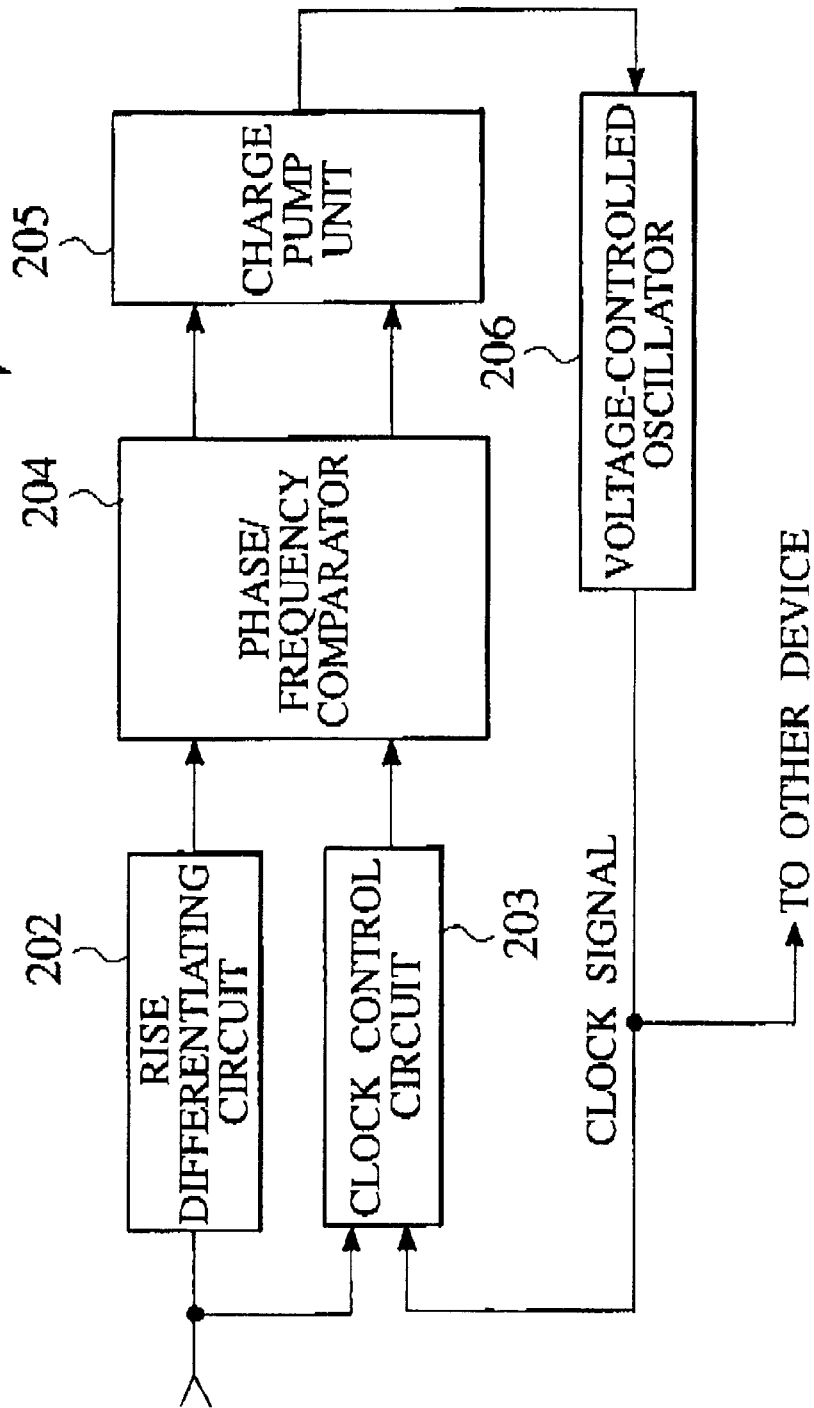
FIG. 9 is a block diagram showing an example of a synchronizing signal extracting device in the prior art.

As shown in a block diagram of FIG. 9, the synchronizing signal extracting device in the prior art comprises a rise differentiating circuit 202, a clock control circuit 203, a phase/frequency comparator 204, a charge pump unit 205, and a voltage-controlled oscillator 206. Then, the signal obtained by differentiating only the rise of the data pulse train by the rise differentiating circuit 202 is supplied to one input of the phase/frequency comparator 204, and the clock signal controlled by the clock control circuit 203, that outputs the local clock signal in connection with the rise differentiated signal only when the rise differentiated signal is generated, is supplied to the other input of the phase/frequency comparator 204. Thus, the phase and the frequency between the above input rise differentiated signal and the clock signal can coincide with each other.

Figure 10:
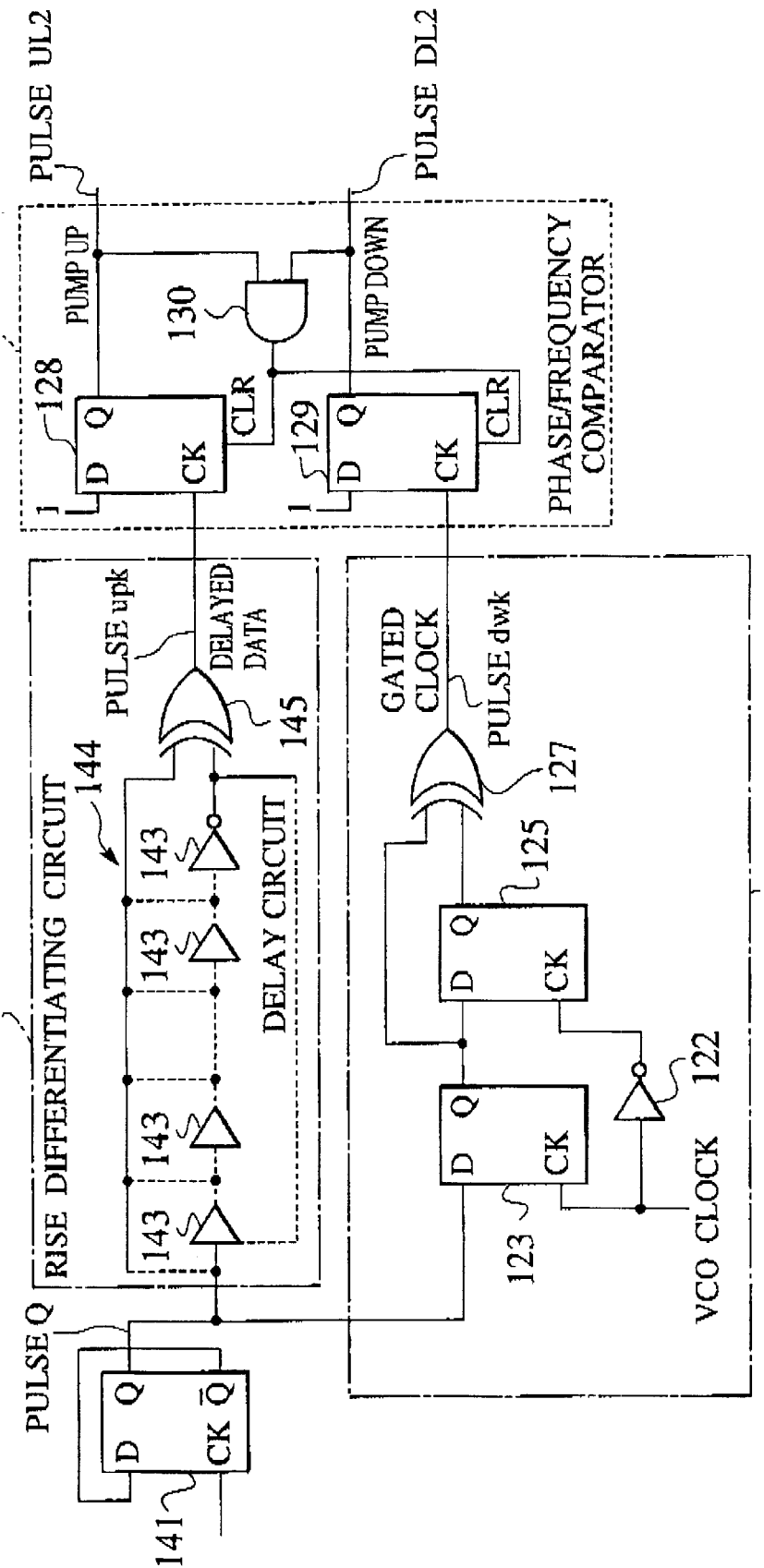
FIG. 10 is a circuit diagram showing a detailed configuration of the synchronizing signal extracting device shown in FIG. 9.

FIG. 10 shows a detailed circuit example of the above synchronizing signal extracting device shown in FIG. 9 in the prior art. The rise differentiating circuit 202 includes a delay circuit 144 constructed by connecting in parallel a plurality of delay elements 143, and an exclusive-OR circuit 145. A reference 141 is a rise trigger-type D flip-flop circuit. Then, the data input pulse train is frequency-divided into ½ by the rise trigger-type D flip-flop circuit 141 to generate the pulse Q, and then this pulse Q is differentiated by the delay circuit 144 and the exclusive-OR circuit 145. Accordingly, the signal obtained by differentiating only the rise of the data pulse train (rise differentiated signal) is supplied to the phase/frequency comparator 204.

Figure 1:
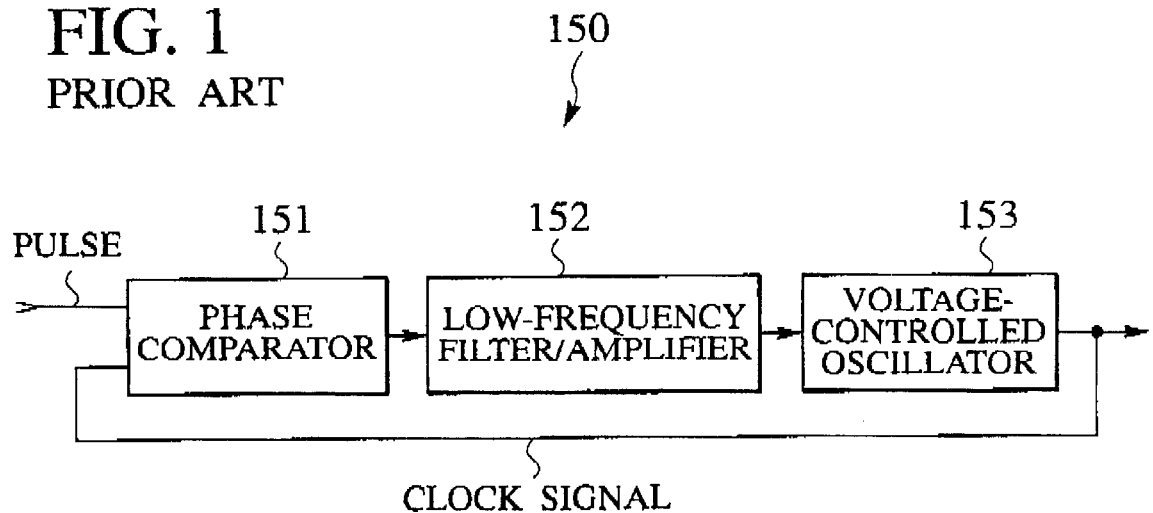
FIG. 1 is a block diagram showing an example of a normal PLL circuit.
Figure 2:
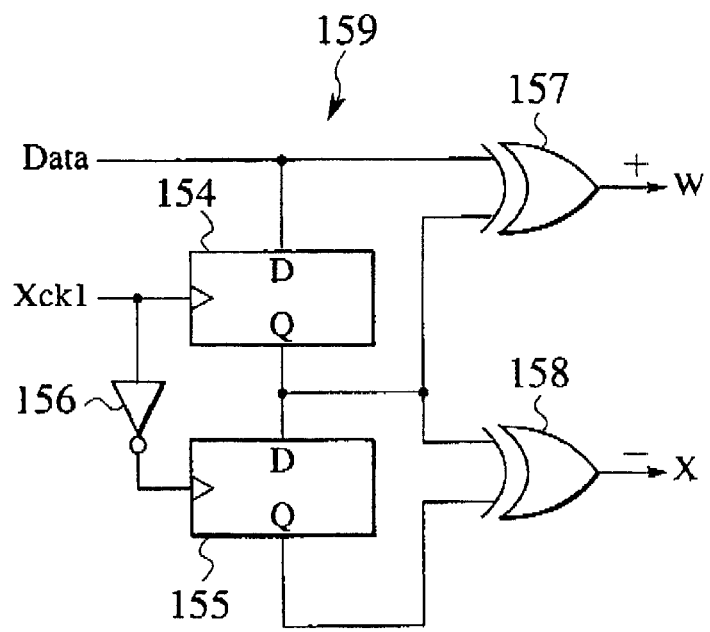
FIG. 2 is a circuit diagram showing an example of a normal phase comparator employed in the prior art.
Figure 3:
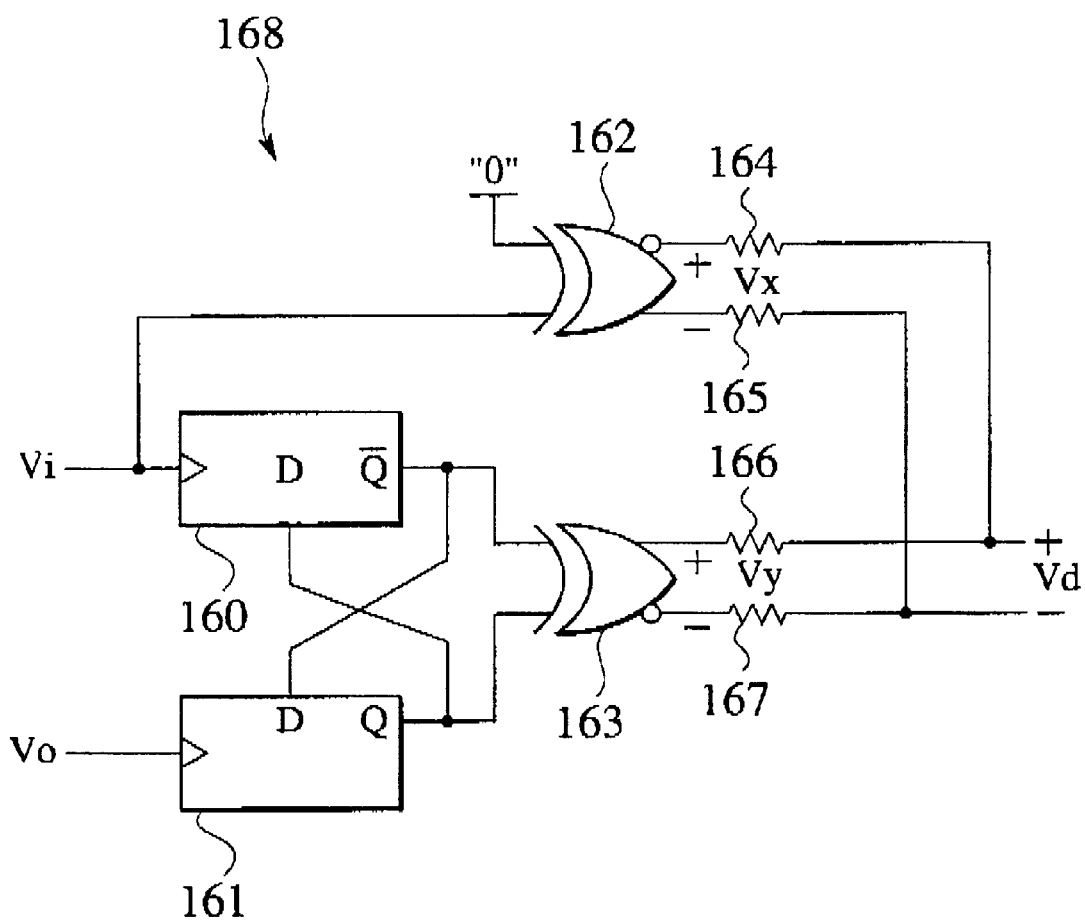
FIG. 3 is a circuit diagram showing another example of a normal phase comparator employed in the prior art.
Figure 4:
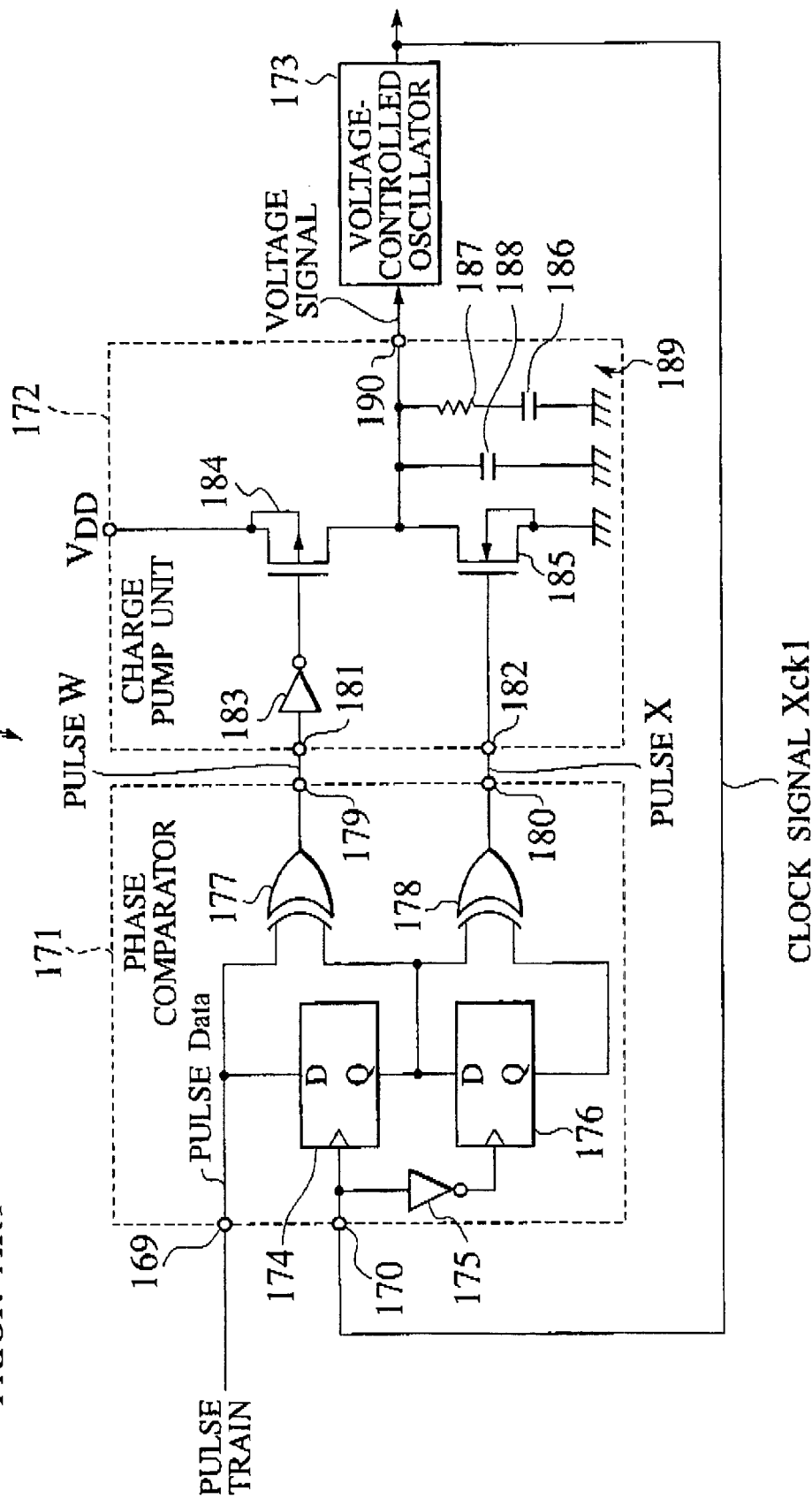
FIG. 4 is a circuit diagram showing an example of a PLL circuit employing the phase comparator shown in FIG. 2.
Figure 5:
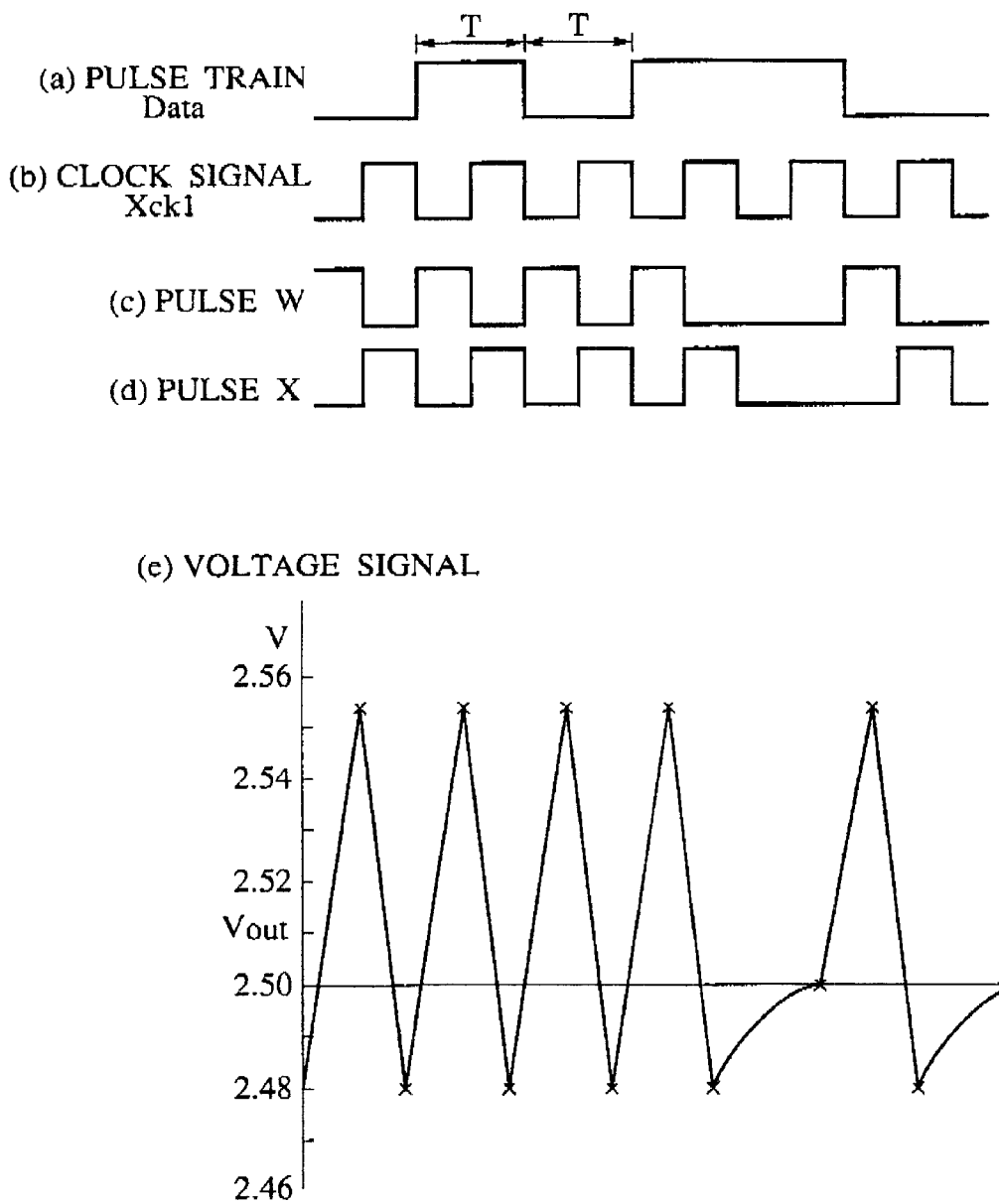
FIG. 5 is a waveform diagram showing an example of an operation of the PLL circuit shown in FIG. 4.
Figure 6:
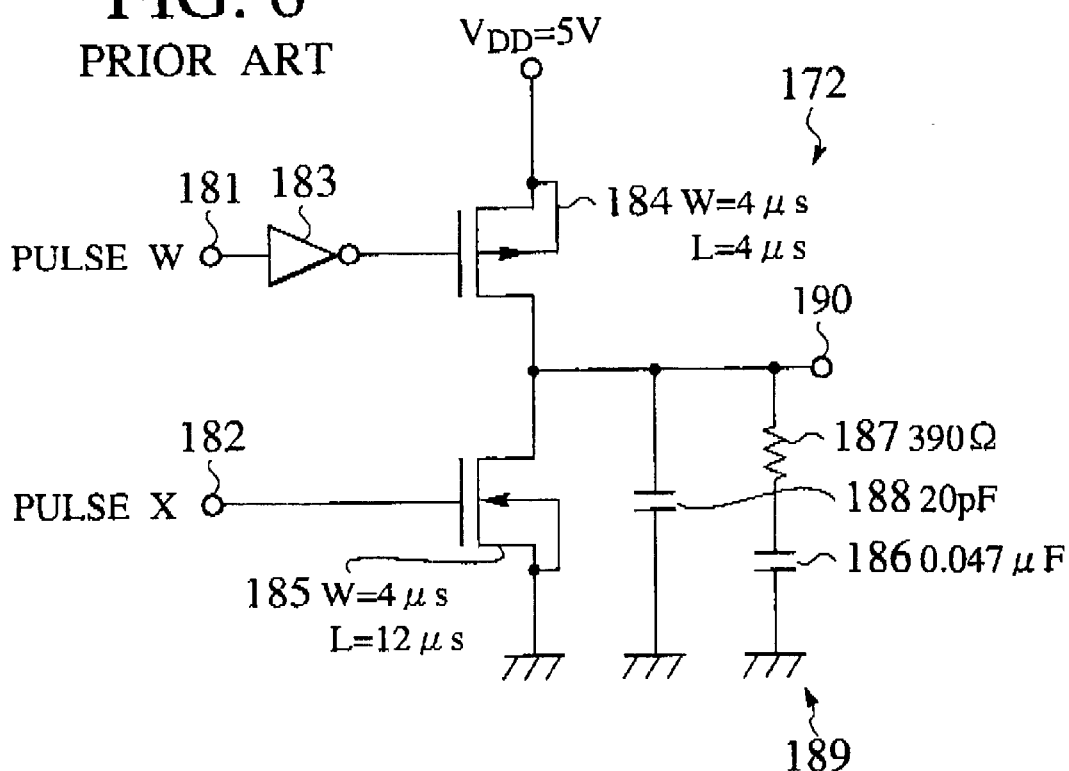
FIG. 6 is a schematic circuit diagram showing an example of particular circuit constants of a charge pump unit shown in FIG. 4.

Also, a clock control circuit 203 includes an inverter circuit 122, two D flip-flop circuits 123, 125, and an exclusive-OR circuit 127. Then, the pulse Q that is obtained by ½-frequency-dividing the data pulse train is supplied from the D flip-flop circuit 141 to the data input terminal of the D flip-flop circuit 123, and also the local clock signal VCO CLOCK is supplied to the clock input terminal. In this case, the clock control circuit 203 has the same circuit configuration as that shown in FIG. 2. This clock control circuit 203 can operate to supply the local clock signal VCO CLOCK to the phase/frequency comparator 204 only at the point of rise time of the input data pulse train.

Figure 7:
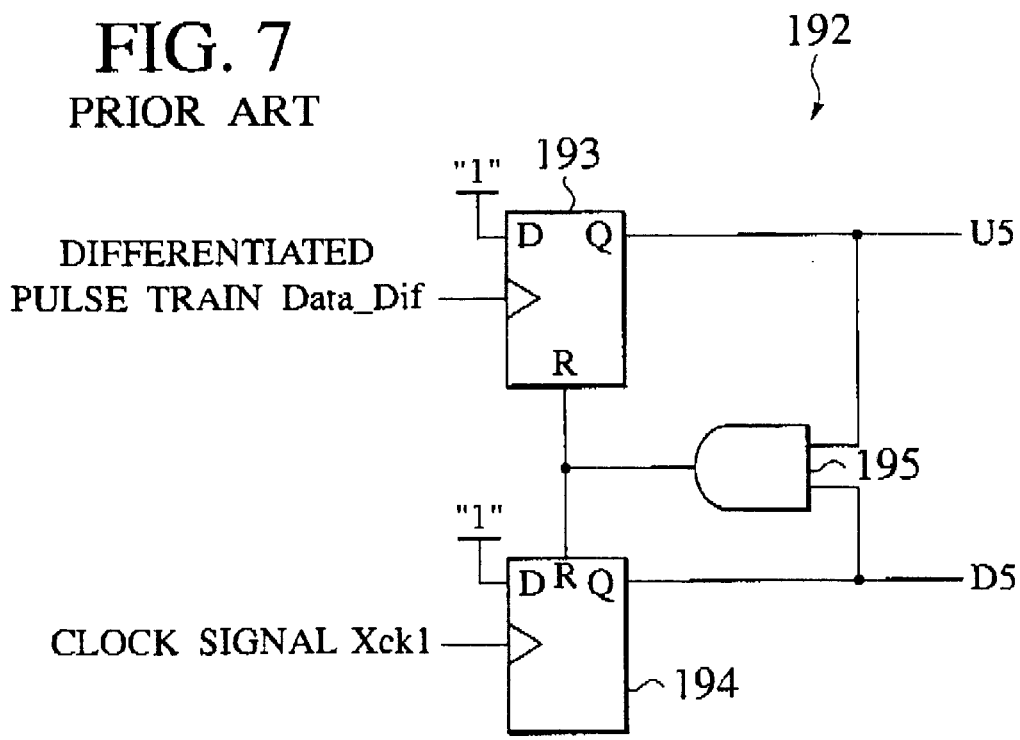
FIG. 7 is a circuit diagram showing an example of a phase comparator proposed in the prior art.
Figure 8:
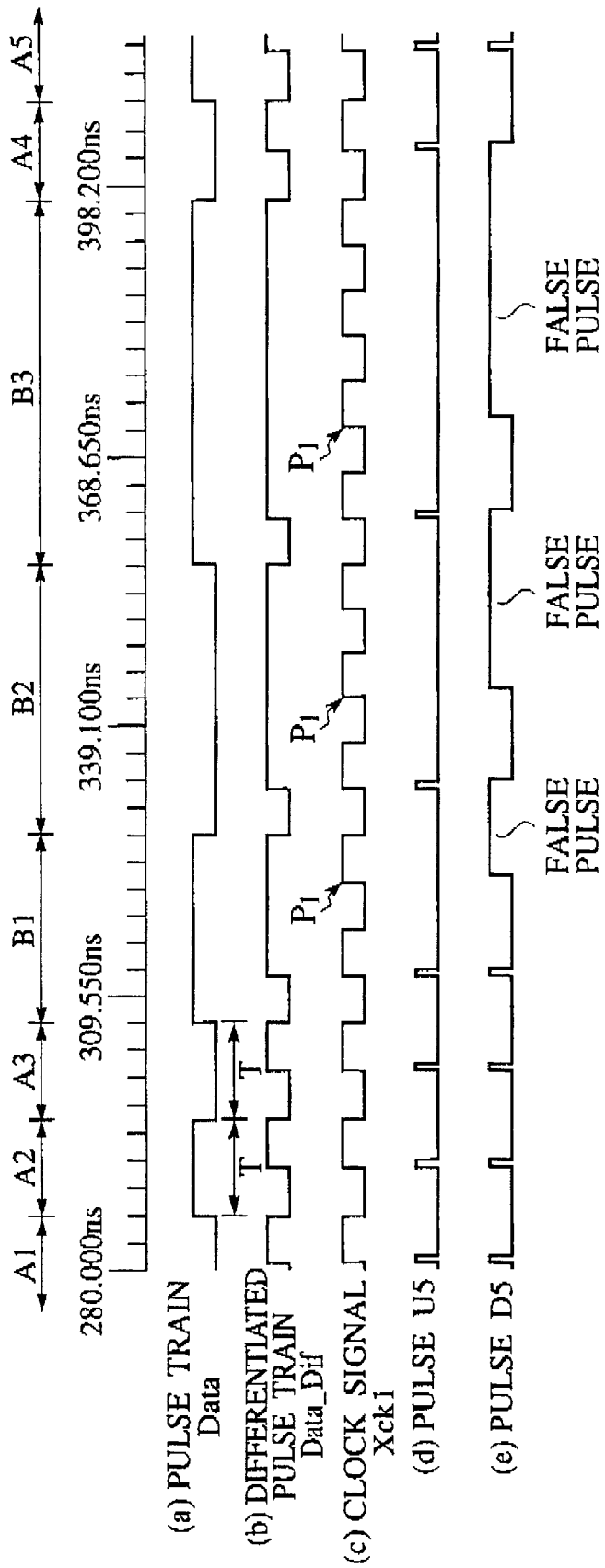
FIG. 8 is a time chart showing an example of an operation of the phase comparator shown in FIG. 7.

The phase/frequency comparator 204 includes two D flip-flop circuits 128, 129, and an AND circuit 130. In this case, this phase/frequency comparator 204 has the same circuit configuration and the same operation as those shown in FIG. 7. Accordingly, even if the tooth missing is caused in the input data pulse train, the normal phase comparison output can be generated without the false output in the phase comparing stage In which the frequency has already been matched. However, in this example in the prior art, there is the problem that, since the false pulling is caused according to the frequency in the frequency pulling stage, the frequency pulling range cannot be expanded.

In this embodiment of the present invention, the above drawback in the prior art can be overcome by selecting only any one of the high level period and the low level period of the input data pulse train or both of the high level period and the low level period.

Figure 20:
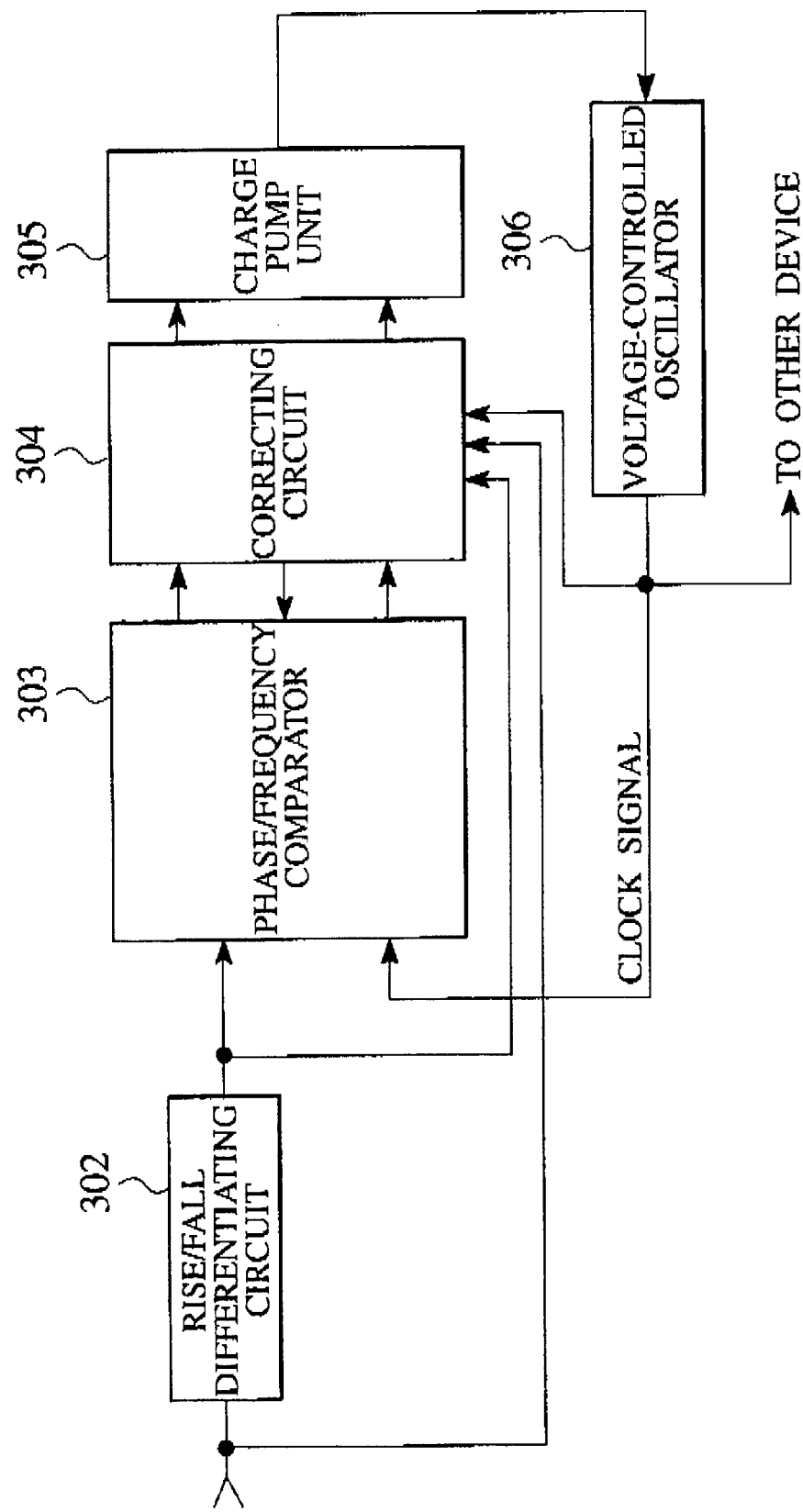
FIG. 20 is a block diagram showing a synchronizing signal extracting device according to yet still another embodiment of the present invention.

That is, as shown in a block diagram of FIG. 20, a synchronizing signal extracting device 301 in this embodiment comprises a rise/fall differentiating circuit 302, a phase/frequency comparator 303, a correcting circuit 304, a charge pump unit 305, and a voltage-controlled oscillator 306. The output signal of the rise/fall differentiating circuit 302 of the input data pulse train is supplied to one input of the phase/frequency comparator 303, and the local clock signal output from the voltage-controlled oscillator 306 is input into the other input of the phase/frequency comparator 303 as it is. Also, the input data pulse train, the output signal of the rise/fall differentiating circuit 302, and the local clock signal are supplied to the correcting circuit 304 that is connected to the outputs of the phase/frequency comparator 303. The outputs of the correcting circuit 304 (a leading phase instructing pulse after the correction, a lagging phase instructing pulse after the correction), that are obtained by correcting the outputs of the phase/frequency comparator 303, are supplied to the charge pump unit 305.

Figure 21:
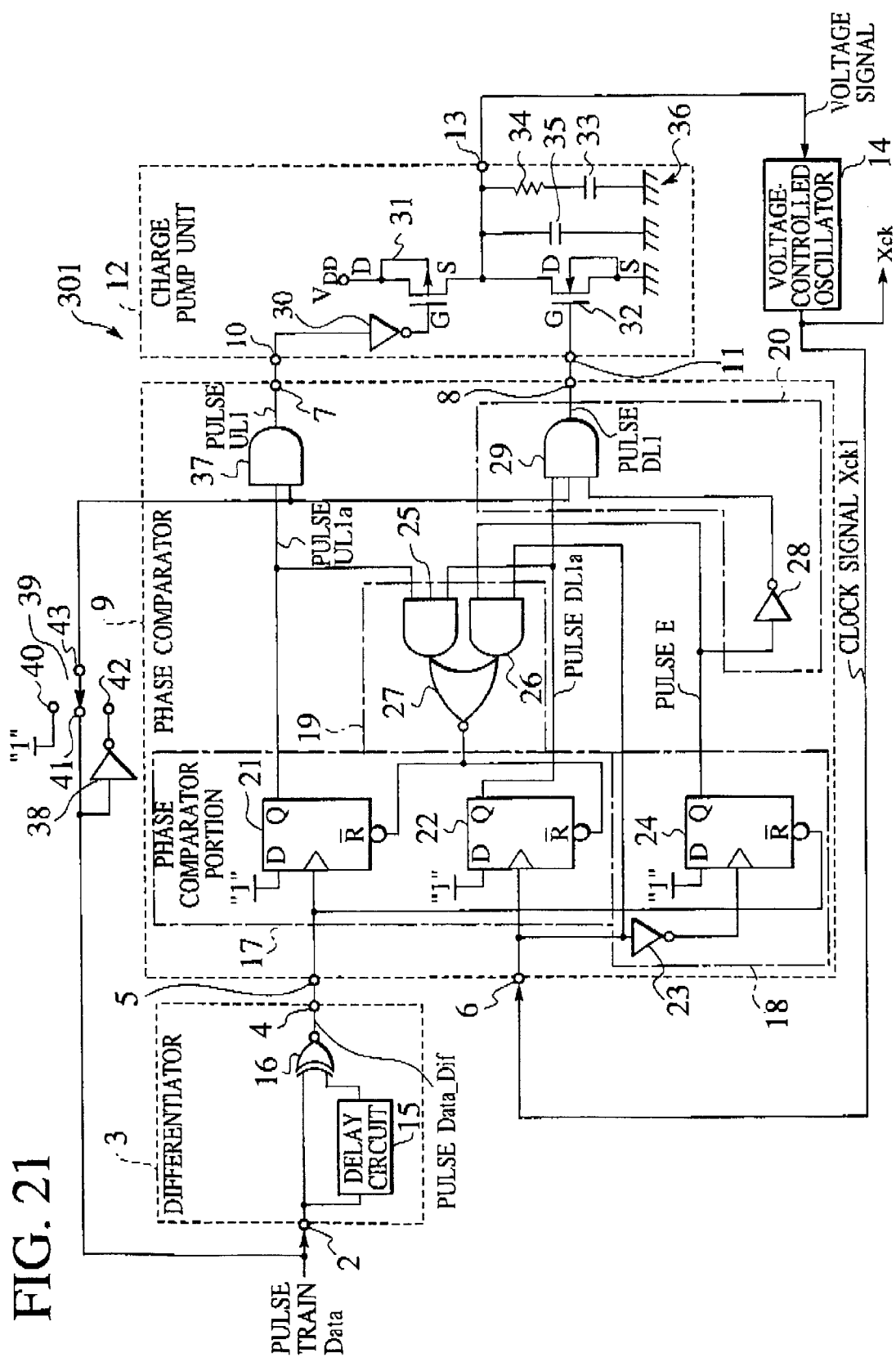
FIG. 21 is a circuit diagram showing a detailed configuration of the synchronizing signal extracting device shown in FIG. 20.

Then, a particular circuit configuration of the synchronizing signal extracting device 301 shown in FIG. 20 will be explained with reference to FIG. 21 hereunder. In FIG. 21, the same references are affixed to the same constituent parts as those in FIG. 11, and their explanation will be omitted herein. As for the correlation between FIG. 20 and FIG. 21, the rise/fall differentiating circuit 302 corresponds to the differentiator 3; the phase/frequency comparator 303 corresponds to the phase comparator 17: the correcting circuit 304 corresponds to the correcting pulse generating portion 18, the correcting portion 20 and the resetting circuit 19; the charge pump unit 305 corresponds to the charge pump unit 12; and the voltage-controlled oscillator 306 corresponds to the voltage-controlled oscillator 14.

In this embodiment, as shown in FIG. 21, three-input AND circuit 29 is provided, and an AND circuit 37 is provided to supply the output of the D flip-f lop circuit 21 to the charge pump unit 12. Also, a switch 39 having three contacts 40, 41, 42 is provided. The middle point 43 of the switch 39 is connected to inputs of the AND circuit 29 and the AND circuit 37 respectively. The signal of the logical level "1" is supplied to the contact 40 of three contacts of the switch 39, the pulse train Data is supplied to the contact 41, and the inverted signal of the pulse train Data is supplied to the contact 42 via the inverter circuit 38. In this case, a NAND circuit may be constructed by combining the AND circuit 37 and the inverter circuit 30 of the charge pump unit 12.

In the above configuration, the differentiated pulse train Data_Dif, that is obtained by differentiating the rise and fall of the pulse train Data, and the clock signal Xck as it is are input into the phase comparator 9. Since the operations of the phase comparator 17, the correcting pulse generating portion 18, and the resetting circuit 19 are identical to those in FIG. 11 mentioned above, their explanation will be omitted herein.

Next, an operation of the switch 39 will be explained hereunder.

First, when the middle point of the switch 39 is connected to the contact 40, the signal of the logical level "1" is supplied to the AND circuit 37 and the AND circuit 29. Therefore, the pulse UL1a (corresponding to the pulse U4 in FIG. 11) is output from the output terminal 7 of the phase comparator 9, and the logical product of the pulse DL1a and the inverted signal of the pulse E (corresponding to the pulse D4 in FIG. 11) is output from the output terminal 8.

Then, when the middle point 43 of the switch 39 is connected to the contact 41, the pulse train Data is supplied to the AND circuit 37 and the AND circuit 29. Therefore, the output pulse UL1a of the phase comparator 9 and the logical product of the pulse DL1a and the inverted signal of the pulse E in the high level period of the pulse train Data are output from the output terminal 7 and the output terminal 8. Then, when the middle point 43 of the switch 39 is connected to the contact 42, only the outputs of the phase comparator 9 in the low level period of the pulse train Data are selected and then output from the output terminal 7 and the output terminal 8 as the output pulse UL1 and the output pulse DL1 respectively.

Figure 22:
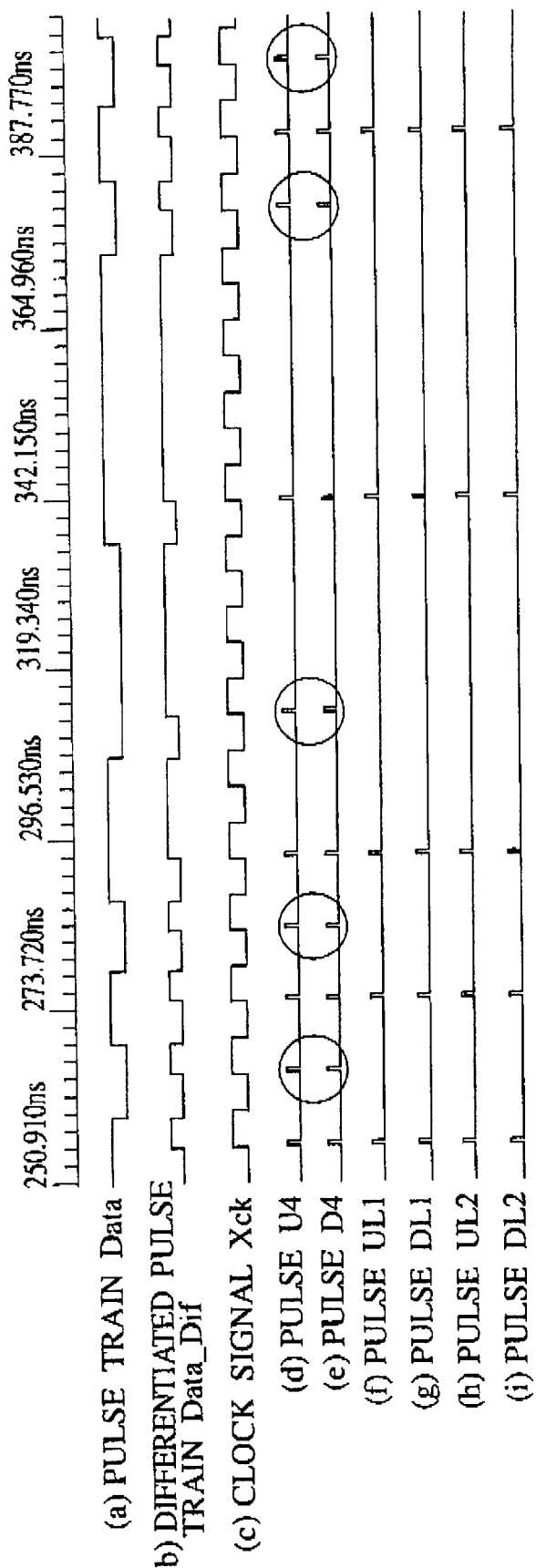
FIG. 22 is a time chart showing the case where frequencies and phases coincide with each other between a differentiated pulse of pulse train Data and a clock signal Xck.
Figure 23:
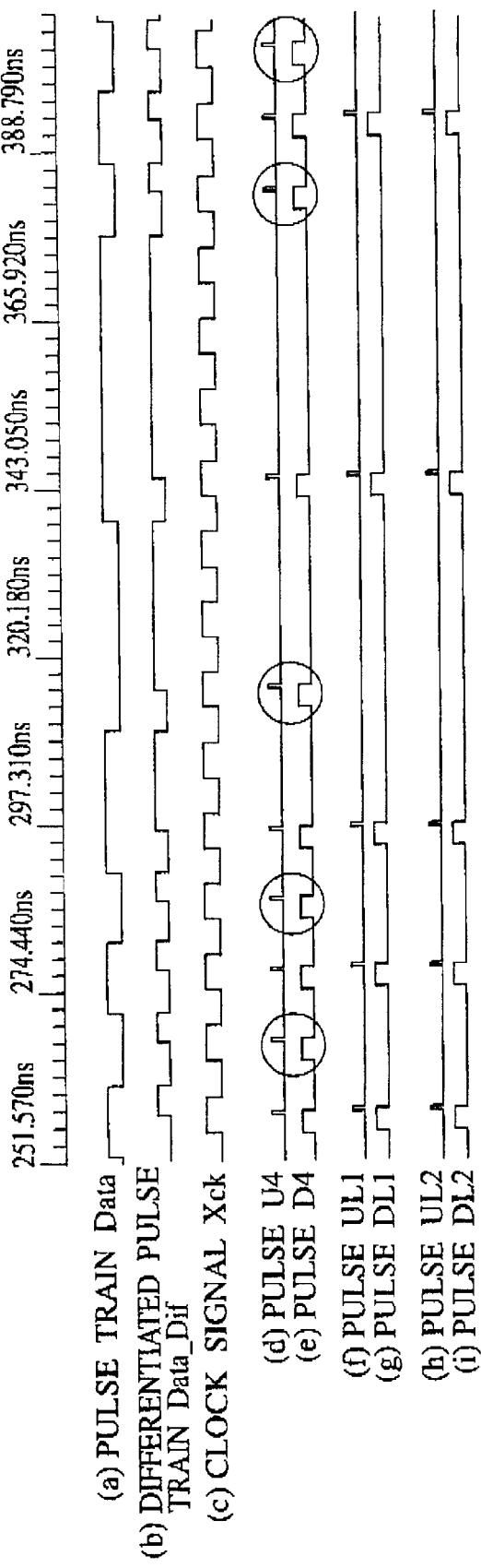
FIG. 23 is a time chart showing the case where the clock signal Xck goes ahead of the differentiated pulse of the pulse train Data by 0.25T.
Figure 24:
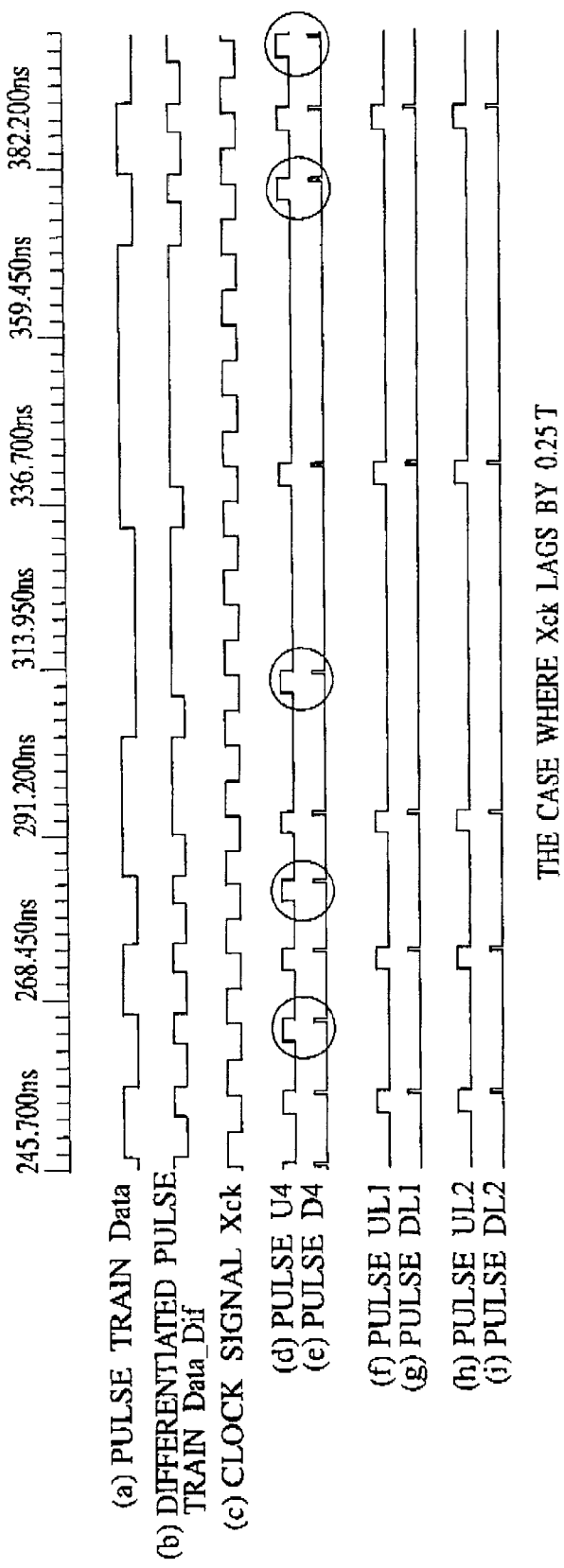
FIG. 24 is a time chart showing the case where the clock signal Xck lags behind the pulse train Data by 0.25T.
Figure 25:
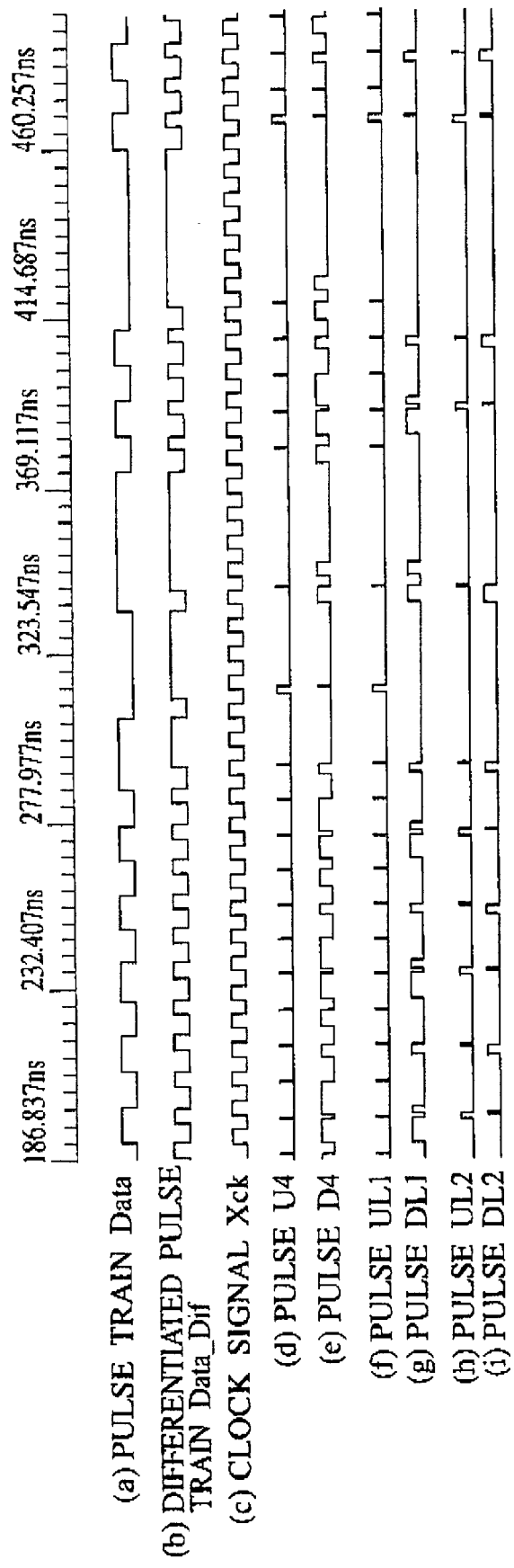
FIG. 25 is a time chart showing the case where a frequency fxck of the clock signal Xck is set higher than the bit clock frequency of the pulse train Data (twice of maximum density data frequency) (fxck=1.25 fb)
Figure 26:
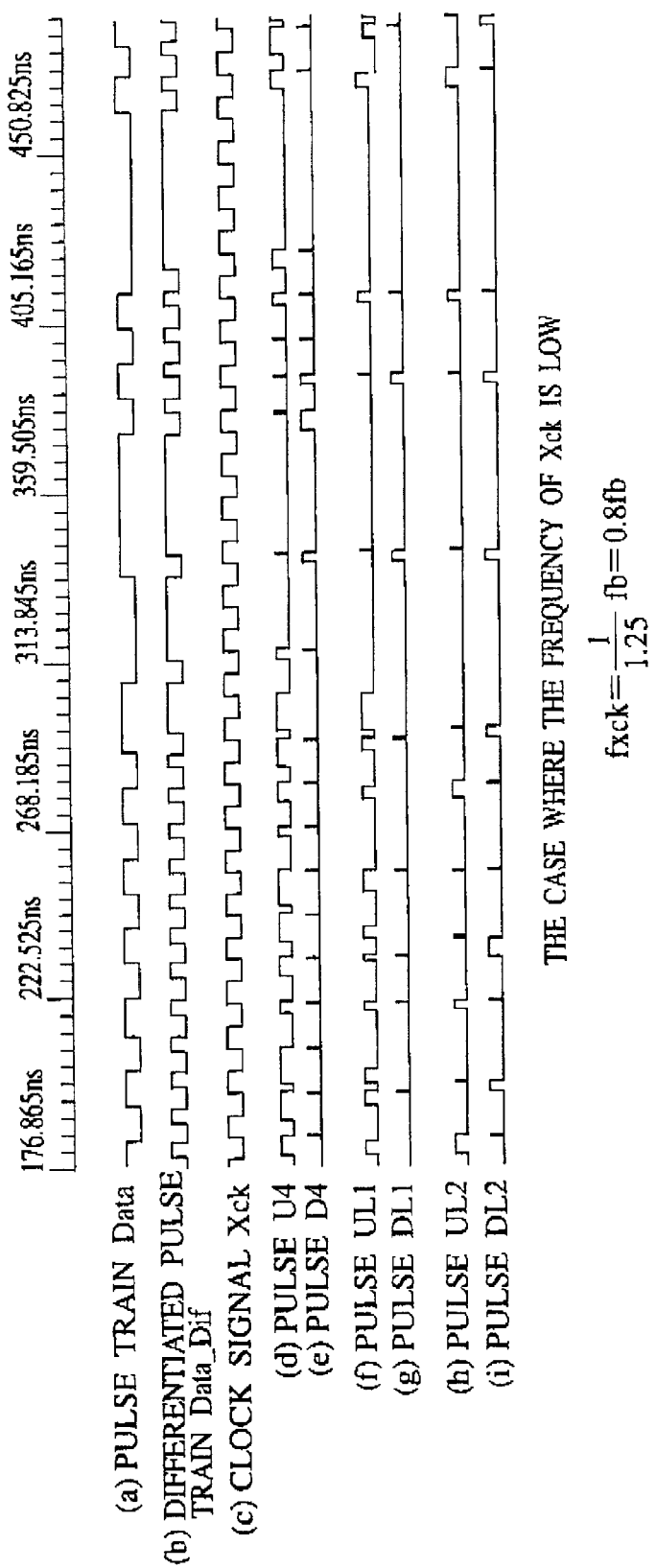
FIG. 26 is a time chart showing the case where the frequency fxck of the clock signal Xck is set lower than the frequency fb of the pulse train Data (fxck=(1/1.25) fb=0.8 fb)

FIG. 22 to FIG. 26 are time charts showing the pulse train Data, the differentiated pulse train Data_Dif, the clock signal Xck; the pulse U4 and the pulse D4 shown in FIG. 11; the pulse UL1 and the pulse DL1 shown in FIG. 21; and the pulse UL2 and the pulse DL2 shown in FIG. 10 in the prior art for the sake of comparison in case the middle point 43 of the switch 39 is connected to the contact 41, i.e., in case the output corresponding to the high level period of the pulse train Data is obtained. Here, FIG. 22 shows the case where frequencies and phases coincide with each other between the pulse train Data and the clock signal Xck, FIG. 23 shows the case where the clock signal Xck goes ahead of the pulse train Data by 0.25T (where T is one period), FIG. 24 shows the case where the clock signal Xck lags behind the pulse train Data by 0.25T, FIG. 25 shows the case where a frequency $f_{xck}$ of the clock signal Xck is set higher than the twice of a frequency $f_b$ of the pulse train Data ($f_{xck}$=1.25$f_b$), and FIG. 26 shows the case where the frequency $f_{xck}$ of the clock signal Xck is set lower than the frequency $f_b$ of the pulse train Data ($f_{xck}$=(1/1.25)$f_b$=0.8$f_b$). In FIG. 22 to FIG. 26, the delay time of the delay circuit 15 in the differentiator 3 is 0.6T.

In FIG. 22 to FIG. 24, it can be understood that encircled portions of the pulse U4 and the pulse D4 as the outputs in the embodiment shown in FIG. 11, i.e., the outputs that correspond to the low level period of the pulse train Data, can be canceled in the output pulse U11 and the output pulse D11 in the present embodiment shown in FIG. 21.

Also, as shown in FIG. 25, it can be understood that, when the clock frequency, i.e., the frequency $f_{xck}$ of the voltage-controlled oscillator 14 is set to the frequency that is 1.25 times the twice frequency $f_b$(=1/T) of the pulse train Data, the pulse DL1 has the overwhelmingly wider width than the pulse UL1 in comparison with the output pulse UL1 and the output pulse DL1. Since the pulse DL1 is the lagging phase instructing pulse, this wider wide of the lagging phase instructing pulse signifies that this pulse acts to lower the clock frequency $f_{xck}$. In contrast, as shown in FIG. 10, it can be understood that the pulses having the almost equal width are output alternatively as the output pulse UL2 and the output pulse DL2 in the prior art. Strictly speaking, the pulse DL2 (lagging phase instructing pulse) has the slightly wide width, but the frequency and the phase are locked by this frequency if the current on the pulse UL2 side, i.e., the charging current is slightly large in the charge pump unit 12 at the succeeding stage. That is, the fatal defect appears such that the false pulling is caused. This "1.25 times" shows that the twice frequency $f_b$ of the pulse train Data and the local clock frequency $f_{xck}$ are the relationship of "$f_{xck}$:$f_b$=5:4". In the prior art shown in FIG. 10, there is the drawback that the false pulling of the frequency is caused in such integer proportional relationship.

In this case, it is found that, if the delay time of the delay circuit 15 is set longer than 0.5T as the ideal delay time, e.g., is set to 0.6T, the possibility of the false pulling can be reduced.

As shown in FIG. 26, if conversely the clock frequency $f_{xck}$ is low ($f_{xck}$=(1/1.25)$f_b$=0.8$f_b$), there is the high possibility to cause the false pulling in the pulse UL2 and the pulse DL2. This shows the case where the above frequency relationship is "$f_{xck}$:$f_b$=4:5".

In this fashion, according to this embodiment, any one of three cases, i.e., the case where the pulse UL1 and the pulse DL1 in which the phase/frequency are compared with each other in both the high level period and the low level period of the pulse train Data are output, the case where the pulse UL1 and the pulse DL1 in which the phase/frequency that correspond to only the high level period are compared with each other are output, and the case where the pulse UL1 and the pulse DL1 in which the phase/frequency that correspond to only the low level period are compared with each other are output, can be selected by switching the switch 39. In addition, since the differentiated pulse train Data_Dif, that is the differentiated pulse at the rise and the fall of the pulse train Data, and the clock signal Xck as it is are input into the phase comparator itself, the phase/frequency comparison without the error can be executed. Also, since comparing chances are increased by executing the phase/frequency comparison in both the high level period and the low level period, quick frequency pulling can be achieved. Accordingly, any one of the high level period and the low level period is selected by positioning the switch 39 at the position of the contact 40 in the frequency pulling stage such as the power supply turning-ON time and then switching the switch 39 into the contact 41 or the contact 42 after the predetermined time has lapsed, and thus the phase compared output containing small jitters can be obtained.

In the above embodiment, the selection is made by using the switch 39. But the middle point 43 may be connected to any of the contacts 40, 41, 42 from the beginning without the provision of the switch 39.

<<Further Embodiment>>

Figure 27:
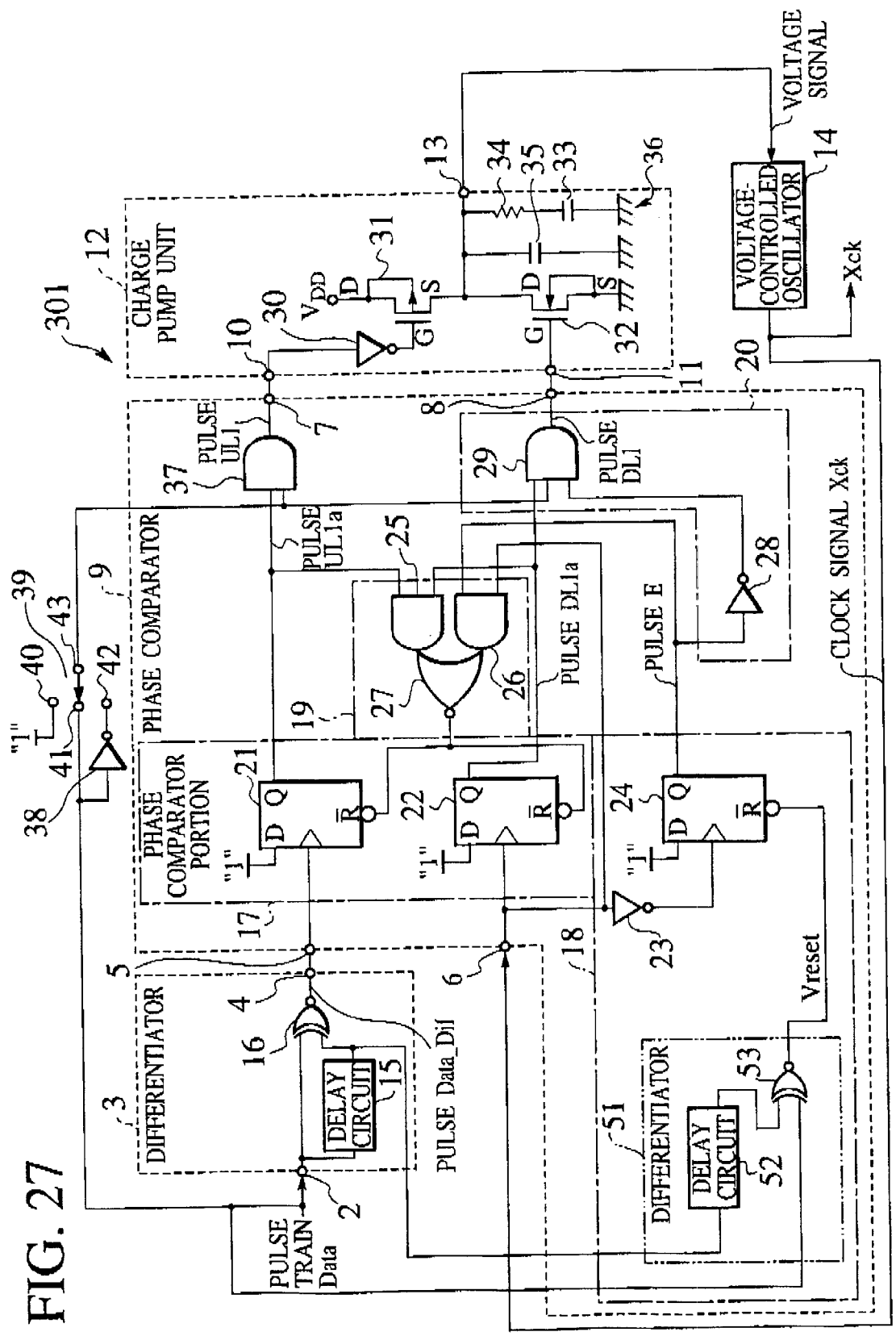
FIG. 27 is a circuit diagram in which a method of resetting a correcting pulse generating portion in the synchronizing signal extracting device shown in FIG. 21 is modified.

Next, in an embodiment shown in FIG. 27, the method of resetting the correcting pulse generating portion 18 in the synchronizing signal extracting device 301 shown in FIG. 21 is modified. More particularly, in FIG. 21, the D flip-flop circuit 24 in the correcting pulse generating portion 18 is reset by the differentiated pulse train Data_Dif that is input into the input terminal 5. Therefore, in the synchronizing signal extracting device 301 shown in FIG. 21, sometimes the false locking phenomenon occurs according to the reset timing of the correcting pulse generating portion 18.

For this reason, in order to overcome the above problem, the D flip-flop circuit 24 is reset by an output of a differentiator 51 that is additionally provided in the correcting pulse generating portion 18. The differentiator 51 differentiates the differentiated pulse train Data_Dif The differentiator 51 consists of a delay circuit 52 and an exclusive-NOR circuit 53, like the differentiator 3. The delay circuit 52 delays the output of the delay circuit 15 by a time described later. The exclusive-NOR circuit 53 calculates the exclusive-OR between the discontinuous pulse train Data input into the input terminal 2 and the delayed pulse train Data output from the delay circuit 52, then generates a reset signal Vreset consisting of the inverted pulses of the pulses In the pulse train Data, that have the width that is equal to the delay times of the delay circuit 15 and the delay circuit 52, and then supplies them to the reset terminal of the D flip-flop circuit 24.

Here, the configuration in FIG. 21 corresponds to the case where the delay time of the newly provided delay circuit 52 is 0. In the synchronizing signal extracting device 301 having such configuration shown in FIG. 21, no problem occurs if the frequency is increased from the lower frequency toward the target frequency, nevertheless in some cases the false locking is caused at the frequency higher than the target frequency depending upon the delaying way in the delay circuit 15 if the frequency is decreased from the higher frequency toward the target frequency. This false locking phenomenon will be explained with reference to FIG. 28 hereunder.

Figure 28:
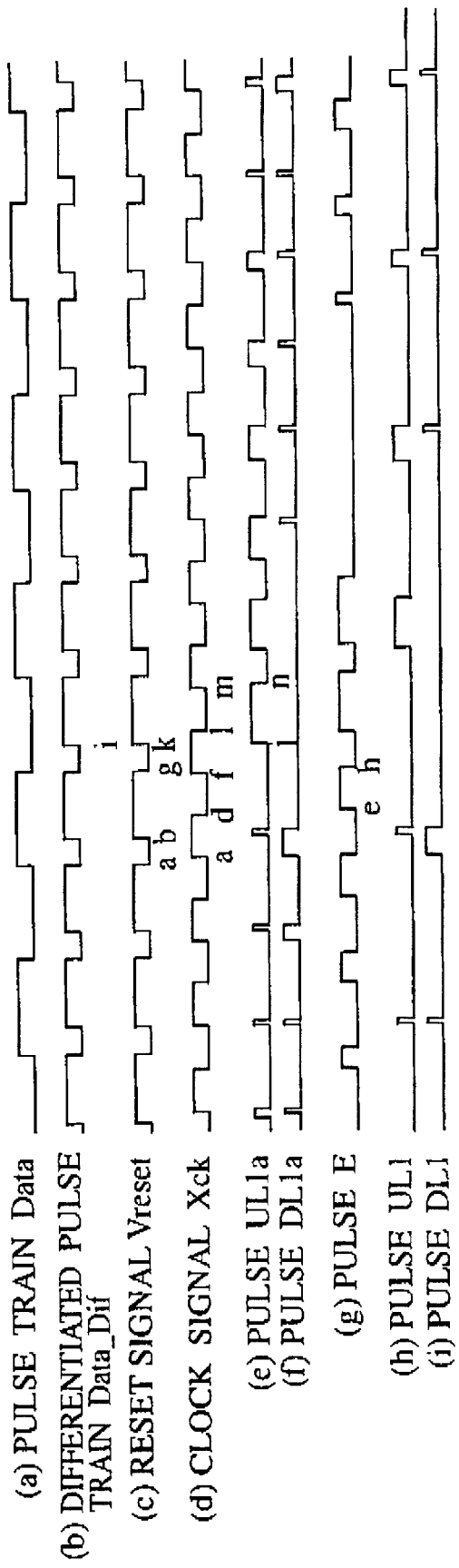
FIG. 28 is a time chart showing an operation executed when a false lock is caused in the synchronizing signal extracting device shown in FIG. 21.

FIG. 28 is a time chart showing the case where the delay time of the delay circuit 15 is 0.3T, the delay time of the delay circuit 52 is 0, and the local clock frequency $f_{xck}$ is 22.22 MHz. This local clock frequency $f_{xck}$=22.22 MHz is the frequency that has the relationship of $f_{xck}$:$f_b$=10:9 with respect to the bit clock frequency $f_b$=20 MHz. In this manner, the false locking occurs at the local frequency that has the integer ration to the bit clock frequency. In this case, the above frequency having the relationship of $f_{xck}$:$f_b$=5:4 is 25 MHz.

In FIG. 28, since the delay time of the delay circuit 52 is 0, the reset signal Vreset has the same waveform as the differentiated pulse train Data_Dif output from the differentiator 3. Also, as shown in FIG. 27, since the clock being obtained by inverting the clock signal Xck by the inverter circuit 23 is input into the clock input terminal of the D flip-flop circuit 24, such D flip-flop circuit 24 outputs "1" at the fall of the clock signal Xck.

In FIG. 28, since the time of the rise b of the reset signal Vreset is earlier in time than the fall d of the clock signal Xck, the reset of the D flip-flop circuit 24 is canceled at the time of the fall d of the clock signal Xck, and thus the output (pulse E) of the D flip-flop circuit 24 becomes "1" at the time e.

When the output (pulse E) of the D flip-flop circuit 24 is "1", the D flip-flop circuit 21 and the D flip-flop circuit 22 are reset simultaneously at the time of the rise f of the succeeding clock signal Xck. After the D flip-flop circuit 21 and the D flip-flop circuit 22 are reset, one of the D flip-flop circuit 21 and the D flip-flop circuit 22 is set to "1" correspondingly at the earlier rise of the differentiated pulse train Data_Dif and the clock signal Xck.

In this case, since the time of the rise i of the differentiated pulse train Data_Dif comes earlier, the output (pulse UL1a) of the D flip-flop circuit 21 is set to "1" at the time of the rise j and then is reset at the time of the rise m of the succeeding clock signal Xck. That is, the output (pulse UL1a) of the D flip-flop circuit 21 is kept at "1" in the period j-n, and thereafter the output (pulse UL1a) of the D flip-flop circuit 21 outputs "1" in a similar manner. This is the output to increase the frequency. In this manner, since the output to Increase further the frequency is issued although the clock signal Xck is high, not the negative feedback but the positive feedback is executed to cause the oscillation. Also, in the case of 25 MHz, because of the same reason, the pulses having substantially equal and balanced widths are generated as the output (pulse UL1a) of the D flip-flop circuit 21 and the output (pulse DL1a) of the D flip-flop circuit 22.

In order to overcome this problem in the configuration in FIG. 21, it may be thought of that the reset state of the D flip-flop circuit 24 is extended in time much more. The simplest method is to extend the delay time of the delay circuit 15, e.g., is set to 0.6T to 0.7T. However, since the delay time of the delay circuit 15 decides the timing serving as the reference of the phase comparison, it is desired that the lead and the lag of the phase should be compared by the equal width. That is, it is desired that the delay time of the delay circuit 15 should be set to ½ of the bit width, i.e., 0.5T.

Therefore, as shown in FIG. 27, the differentiator 51 that is able to control the reset time of the delayed flip-flop circuit 24 independently is newly provided, and thus the reset time of the D flip-flop circuit 24 can be set longer by the delay circuit 52.

Now, because it may be guessed that the delay times of the delay circuit 15 and the delay circuit 52 are varied according to fabrication conditions of the delay elements, and operation conditions such as the voltage, the temperature, etc, it is desired that the operating margin should be set as large as possible and that the delay circuit can be operated perfectly by the about 0.3T as the delay time of the delay circuit 15. In contrast, it is preferable that the delay time of the added delay circuit 52 should be set longer. However, if such delay time is set too longer, the false pulse is generated at the time of normal lock, i.e., when both the frequency and the phase coincide with each other. With the above, it is desired that the delay time of the delay circuit 52 should be set to less than 0.5T.

Figure 29:
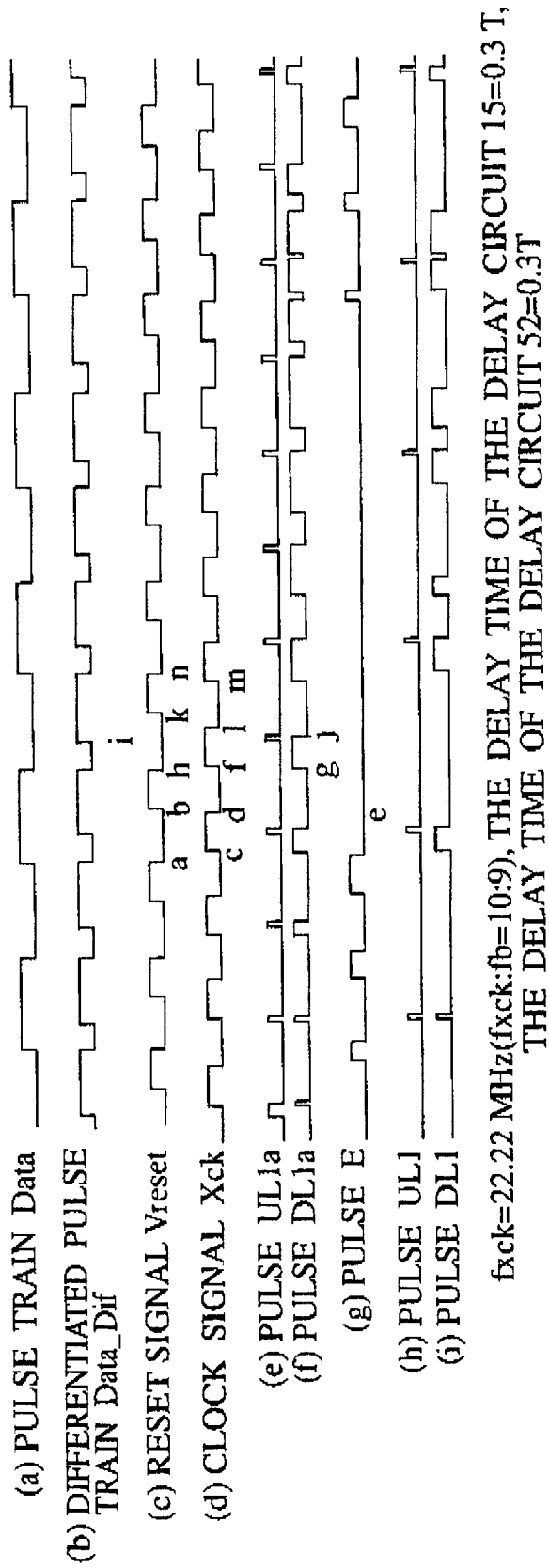
FIG. 29 is a time chart showing an operation not to cause the false lock in the modified synchronizing signal extracting device shown in FIG. 27.

Next, an operation of the configuration shown in FIG. 27 will be explained with reference to a time chart shown in FIG. 29 hereunder. In FIG. 29, in order to uniformize the conditions, the local clock frequency $f_{xck}$=22.22 MHz is employed, the delay time of the delay circuit 15 is 0.3T, and the delay time of the delay circuit 52 is 0.3T.

In FIG. 29, since the reset signal Vreset is "0" in the period a-b and the time of the rise d of the clock signal Xck exists in this period, the D flip-flop circuit 24 is reset continuously, and thus the output (pulse E) of the D flip-flop circuit 24 is kept at "0" without the influence of the fall d of the clock signal Xck. Accordingly, the D flip-flop circuit 22 is set at the time of the rise f of the succeeding clock signal Xck, and the output (pulse DL1a) normally becomes "1" at the time g.

In this fashion, only the output (pulse DL1a) of the D flip-flop circuit 22 is generated. That is, the normal output to reduce the frequency further more is generated, and thus the false lock is never caused.

As the results of various confirmations, it can be found that, if the delay time of the delay circuit 52 is 0.3T, no false lock is caused until the delay time of the delay circuit 15 is 0.3 T to 0.6T and, if the delay time of the delay circuit 52 is 0.4T, no false lock is caused until the delay time of the delay circuit 15 is 0.2 T to 0.5T.

<<Still Further Embodiment>>

Figure 31:
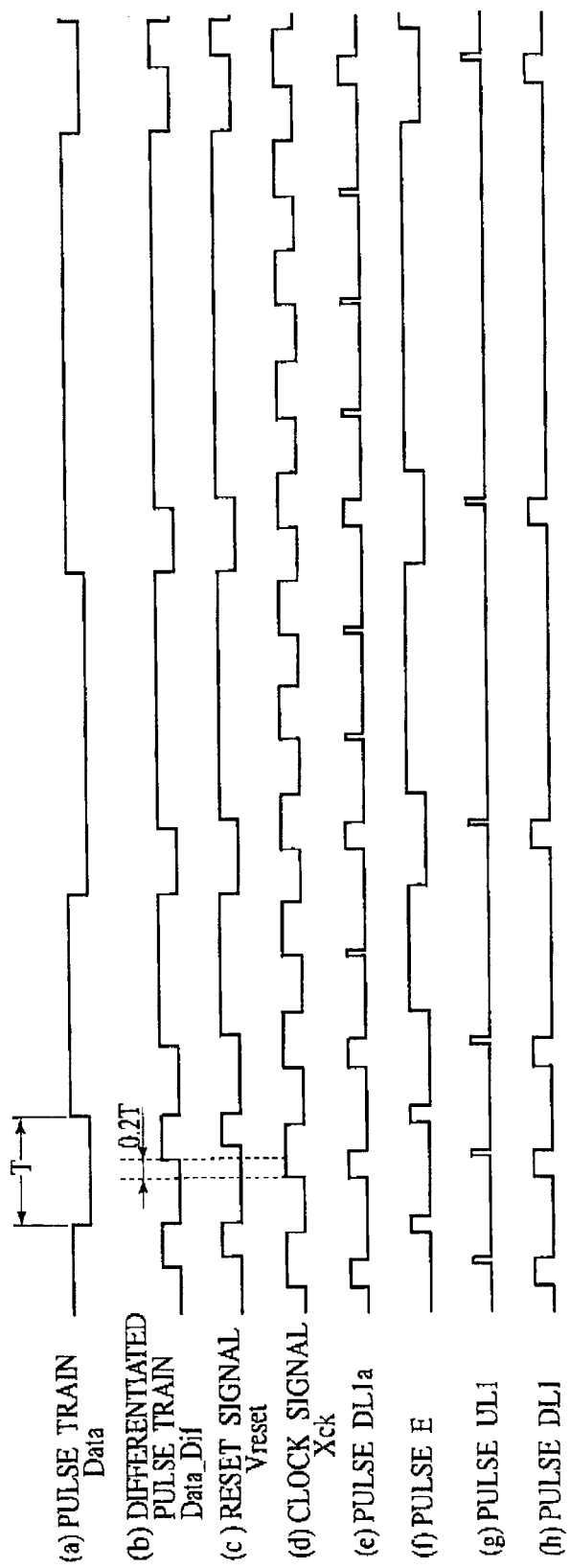
FIG. 31 is a time chart showing the case where the clock signal Xck leads in phase 0.2T than the differentiated pulse train Data_Dif so that no false pulse appears in the signal of pulse DL1 in the synchronizing signal extracting device shown in FIG. 27.
Figure 32:
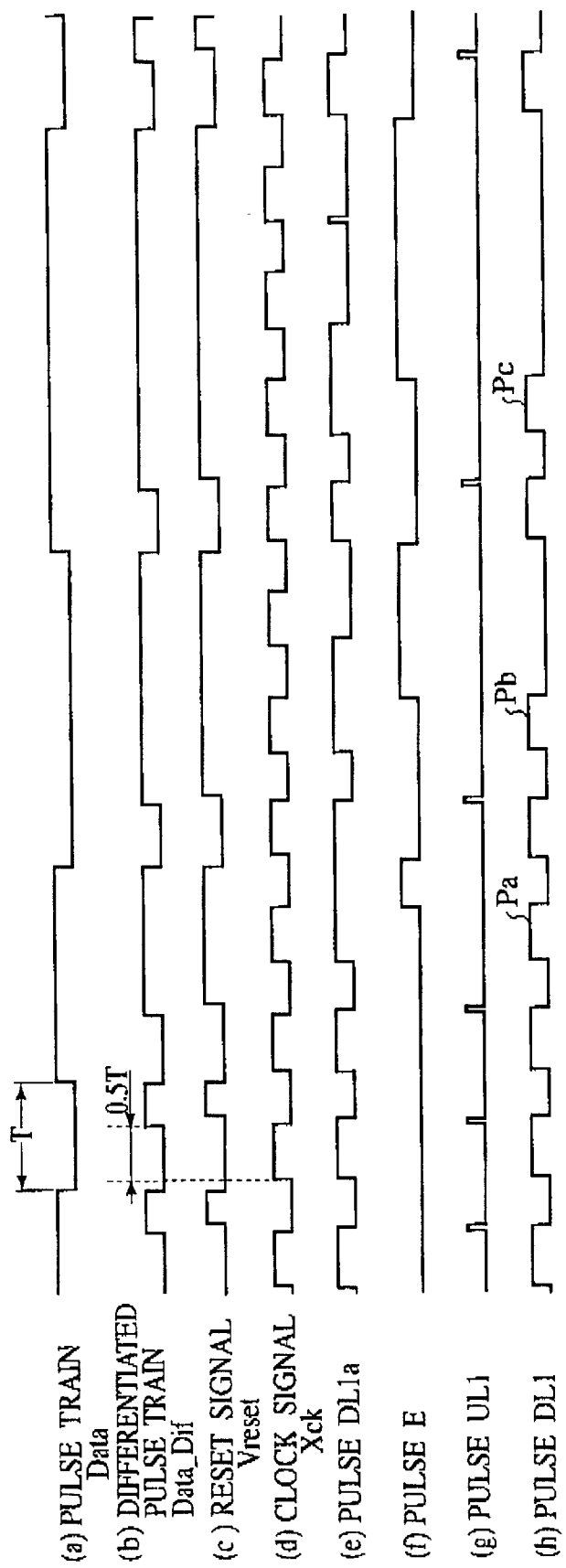
FIG. 32 is a time chart showing the case where the clock signal Xck leads in phase 0.5T than the differentiated pulse train Data_Dif so that false pulses appear in the signal of pulse DL1 in the synchronizing signal extracting device shown in FIG. 27.
Figure 33:
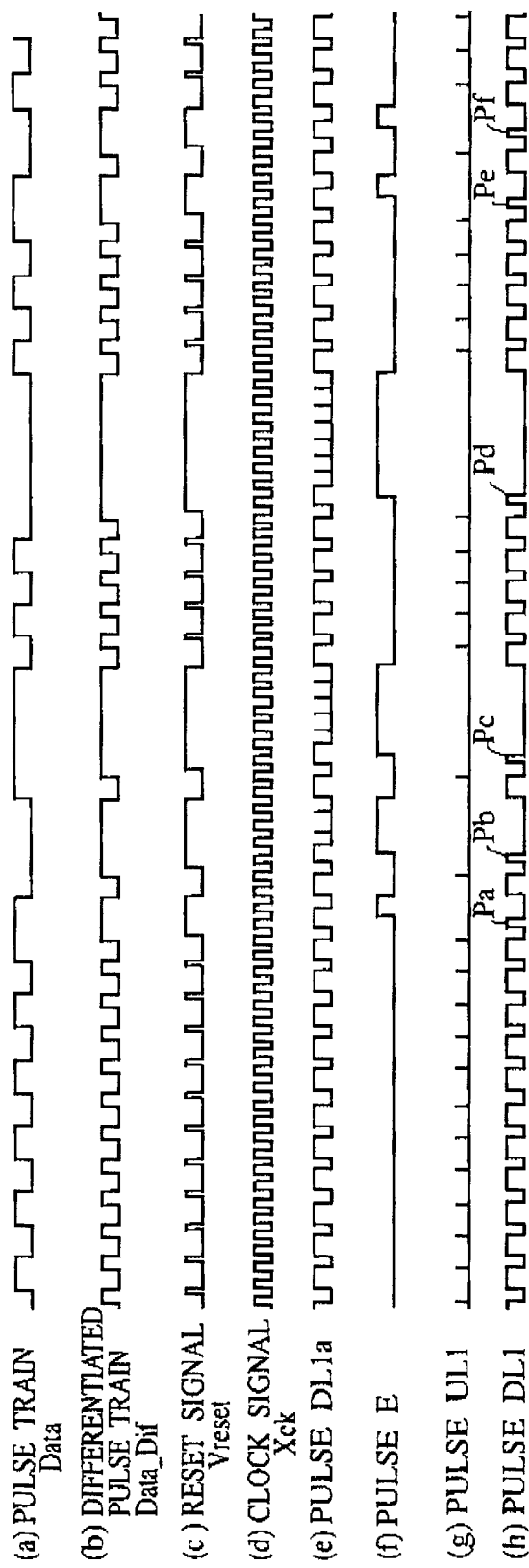
FIG. 33 is a time chart showing the case where the frequency of the clock signal Xck is higher than that of the differentiated pulse train Data_Dif so that false pulses appear In the signal of pulse DL1 in the synchronizing signal extracting device shown in FIG. 27.
Figure 34:
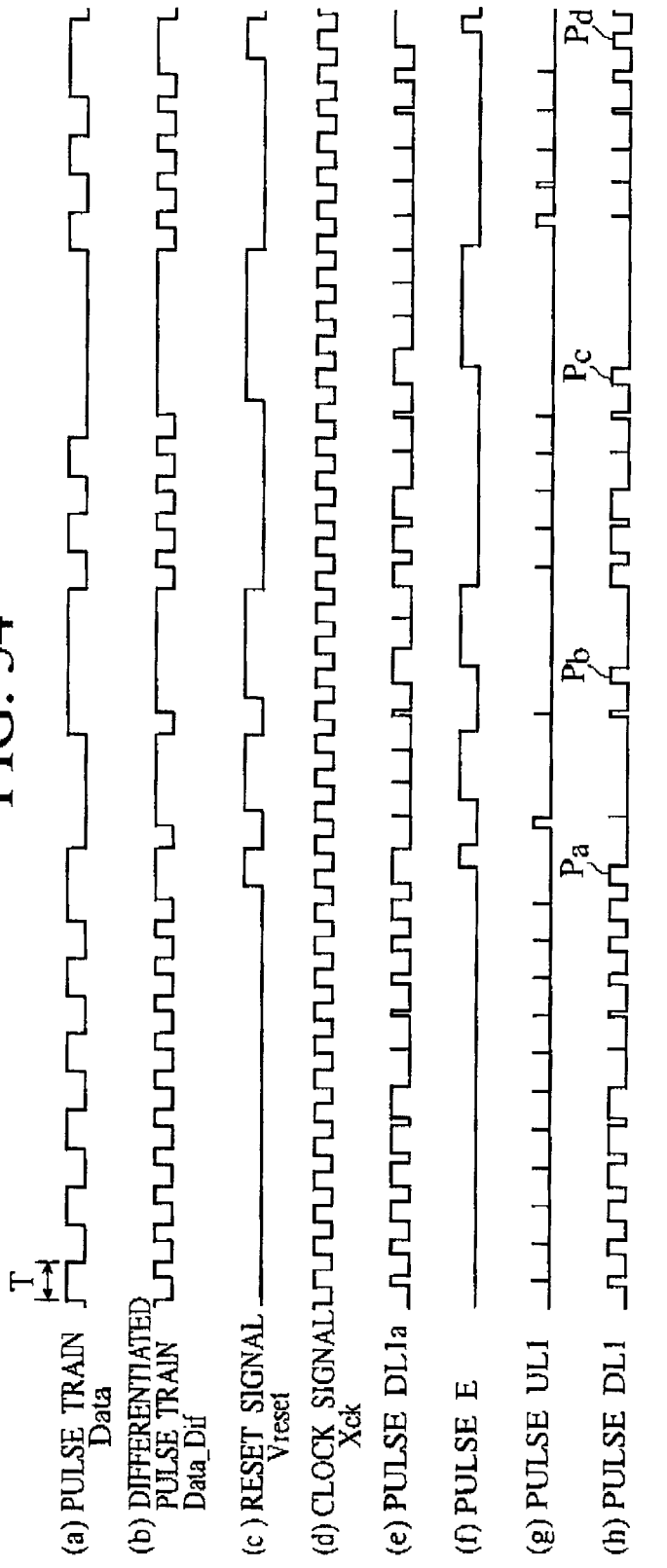
FIG. 34 is a time chart showing the case where the frequency of the clock signal Xck is higher than that of the differentiated pulse train Data_Dif so that false pulses appear in the signal of pulse DL1 in the synchronizing signal extracting device shown in FIG. 27.

FIG. 31 is a time chart showing the case where the clock signal Xck leads in phase 0.2T than the differentiated pulse train Data_Dif in the synchronizing signal extracting device shown in FIG. 27. In this case, no false pulse appears in the signal of pulse DL1. However, if the delay time of the delay circuit 15 is set so large that the clock signal Xck leads in phase 0.5T than the differentiated pulse train Data_Dif. false pulses Pa, Pb and Pc appear in the signal of pulse DL1 as shown in FIG. 32. Also, when the frequency of the clock signal Xck is higher than the differentiated pulse train Data_Dif, false pulses appear in the signal of pulse DL1 as shown in FIGS. 33 and 34.

In order to overcome the above drawback, according to this embodiment, the correcting pulse generating portion 18 in the synchronizing signal extracting device shown in FIG. 27 is modified.

Figure 30:
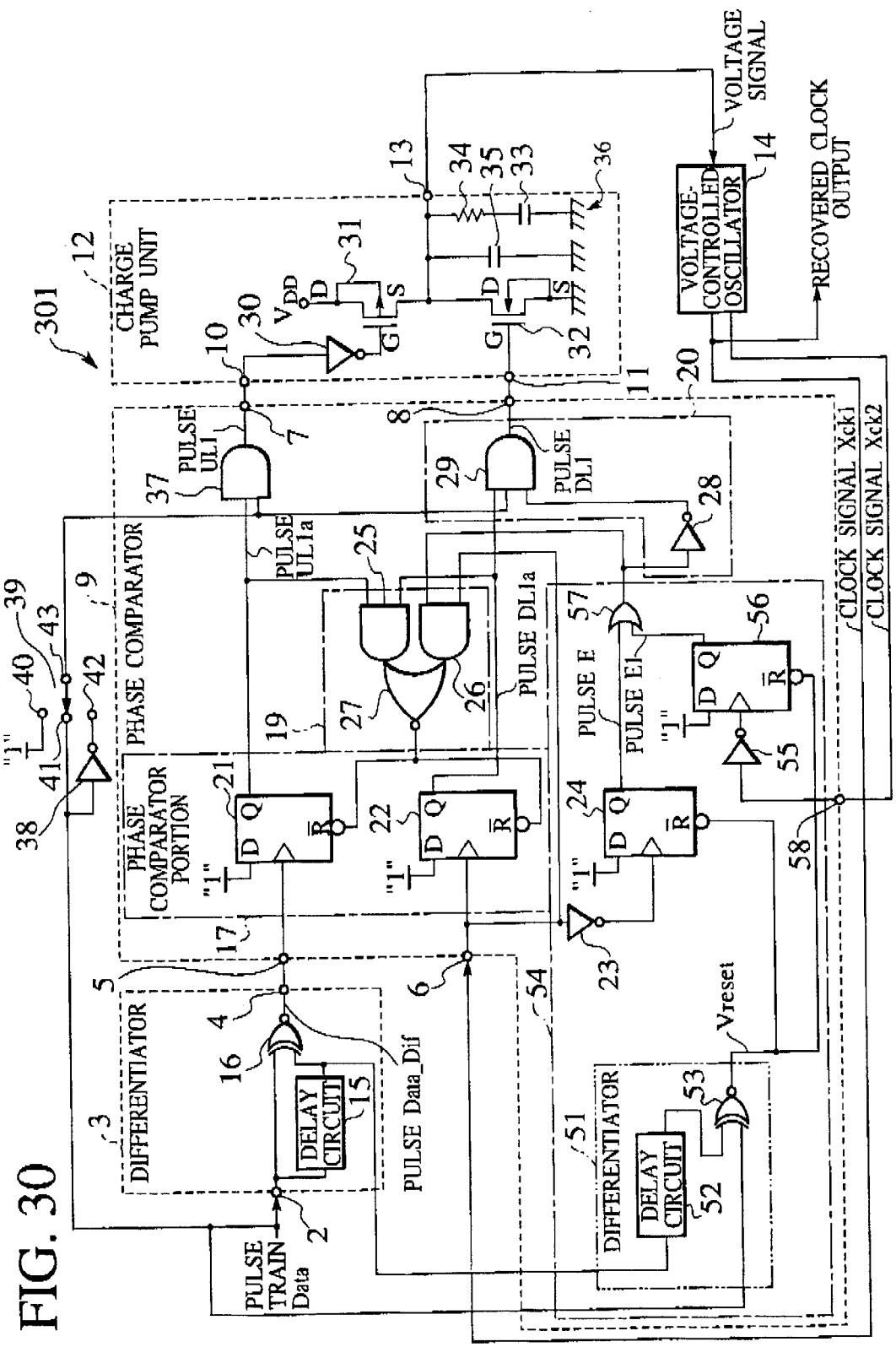
FIG. 30 is a circuit diagram in which a correcting pulse generating portion in the synchronizing signal extracting device shown in FIG. 27 is modified.

FIG. 30 is a circuit diagram showing a synchronizing signal extracting device including the modified correcting pulse generating portion 54. In addition to the differentiator 51, the inverter circuit 23 and the D flip-flop circuit 24, the modified correcting pulse generating portion 54 includes an inverter circuit 55, a D flip-flop circuit 56 and an OR circuit 57.

The inverter circuit 55 is a circuit for inverting a clock signal Xck2 being output from the voltage-controlled oscillator 14 and input into the input terminal 58. The D flip-flop circuit 56 acquires the "1" signal being input into the data Input terminal D every time when the inverted clock signal Xck2 output from the inverter circuit 55 is raised. and outputs this signal from the data output terminal Q while holding this, and also resets the held content to then output the "0" signal from the data output terminal Q every time when the reset signal Vreset output from the differentiator 51 is "1" and thus the "0" signal (the "1" signal in the negative logic) is input into the reset terminal R. The OR circuit 57 calculates the logical sum of the pulse E output from the data output terminal Q of the D flip-flop circuit 24 and the pulse E1 output from the data output terminal Q of the D flip-flop circuit 56.

Figure 35:
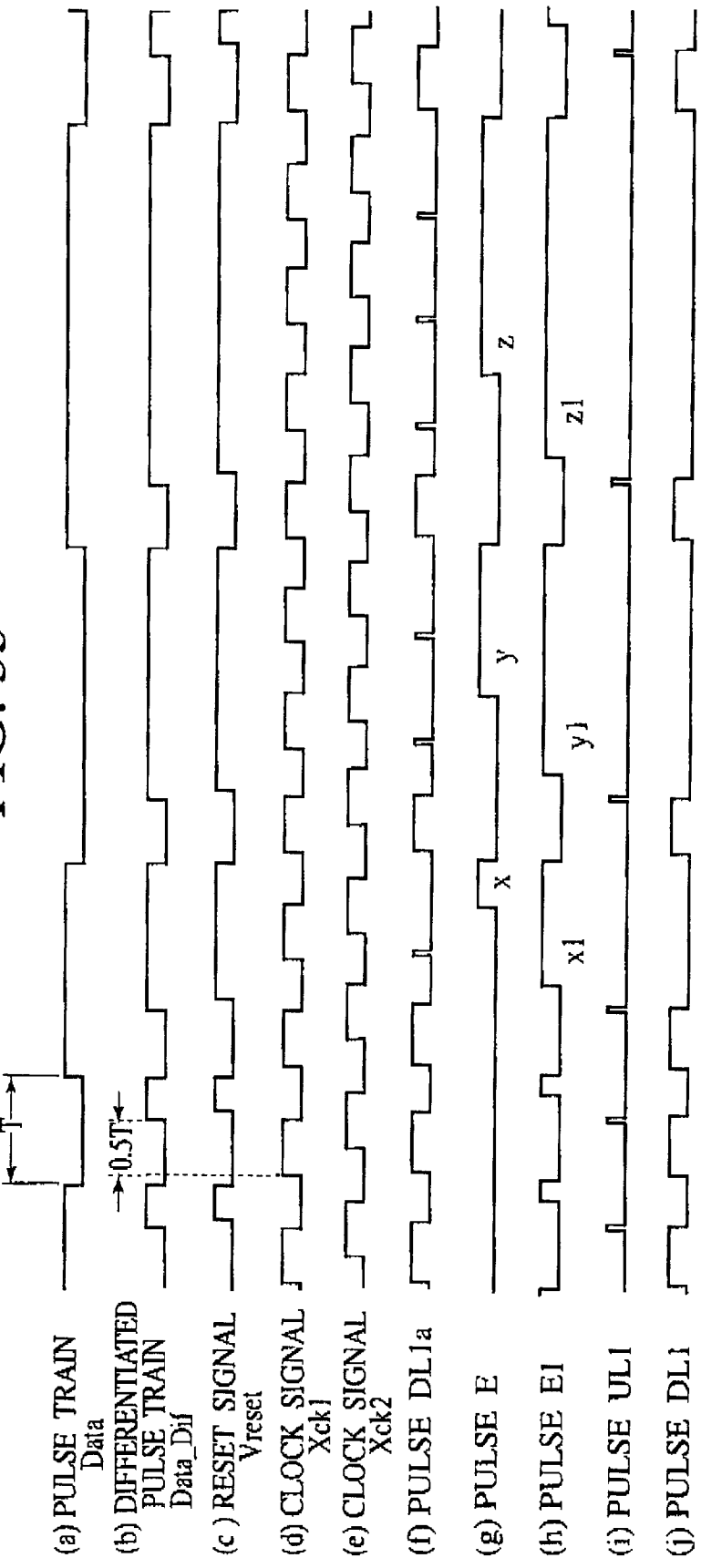
FIG. 35 is a time chart showing an operation of the synchronizing signal extracting device shown in FIG. 30 where no false pulse appears even when the clock signal Xck1 leads in phase 0.5T than the differentiated pulse train Data_Dif.

FIG. 35 is a time chart showing an operation of the synchronizing signal extracting device shown in FIG. 30. The clock signal Xck2 being output from the voltage-controlled oscillator 14 lags behind the clock signal Xck1 by 90 degrees as shown in FIG. 35. The clock signal Xck2 may be easily generated such that the voltage-controlled oscillator 14 is materialized as an oscillator constructed by including even number stage connection of differential amplifiers and cross connection of input stage thereof and a signal of the intermediate point of the oscillator is picked up. Therefore, a signal such as the clock signal Xck2 has been popularly used in a quadricorrelator and so on.

Figure 36:
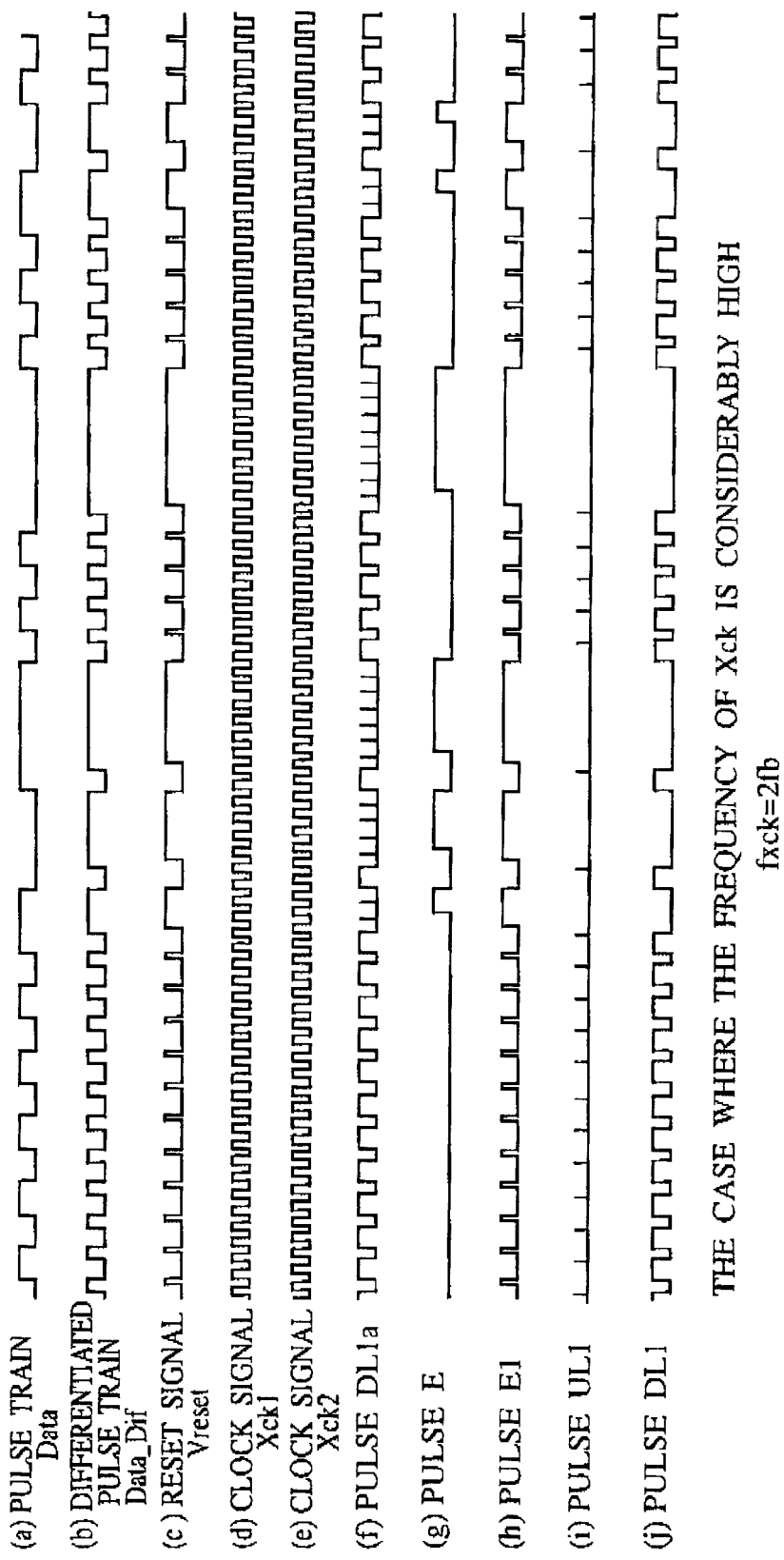
FIG. 36 is a time chart showing an operation of the synchronizing signal extracting device shown in FIG. 30 where no false pulse appears even when the frequency of the clock signal Xck1 is higher than that of the differentiated pulse train Data_Dif.
Figure 37:
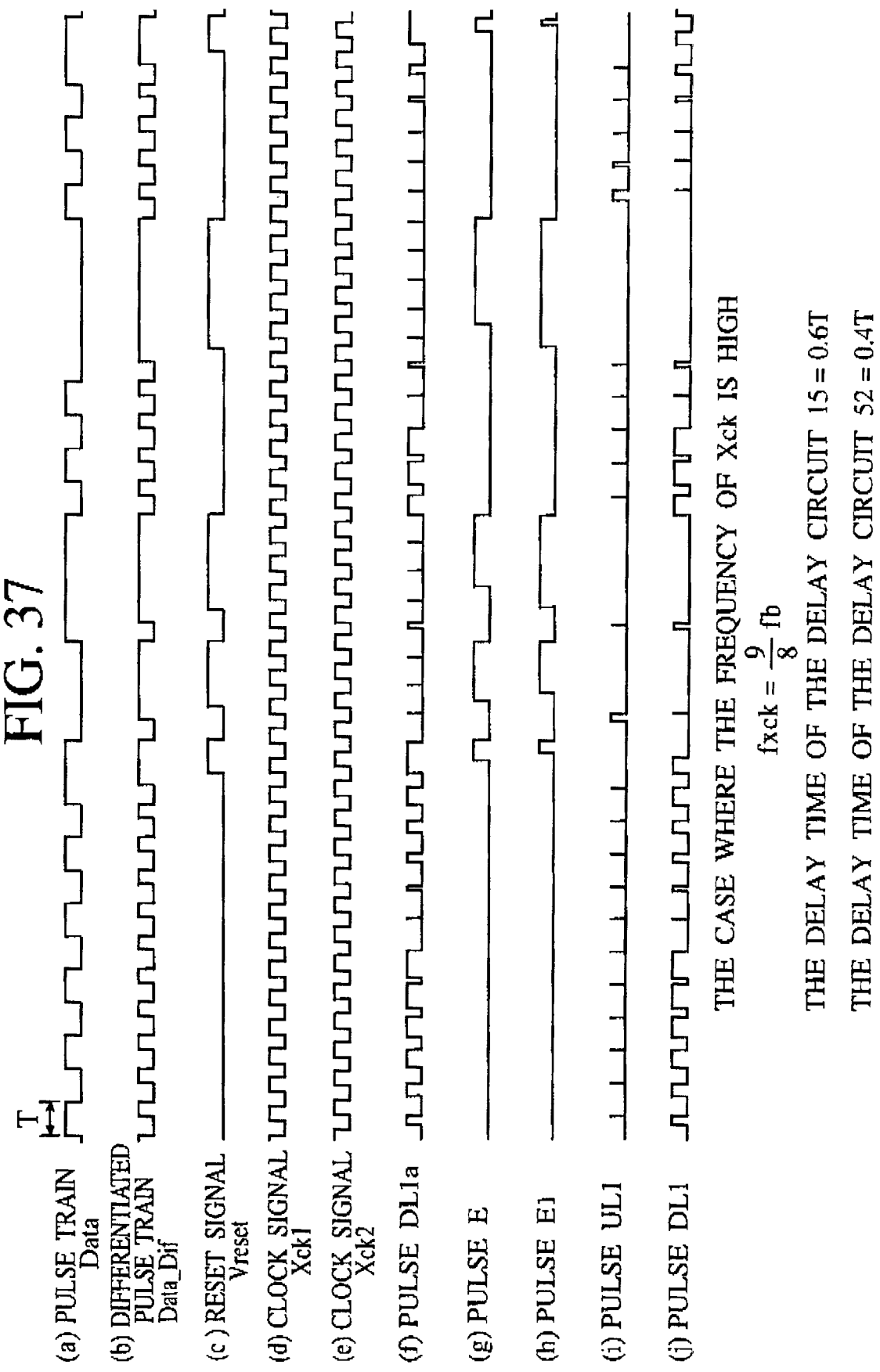
FIG. 37 is a time chart showing an operation of the synchronizing signal extracting device shown in FIG. 30 where no false pulse appears even when the frequency of the clock signal Xck1 is high 9/8 times that of the differentiated pulse train Data_Dif.

As already described above, the D flip-flop circuit 56 is triggered by the clock signal Xck2 that lags behind the clock signal Xck1 by 90 degrees. Thus, not only the pulse E output from the D flip-flop circuit 24 triggered by the clock signal Xck1 but also the pulse E1 output from the D flip-flop circuit 56 triggered by the clock signal Xck2 are used as a correcting pulse for the pulse correcting portion 20. With this configuration, no false pulse appears in the signal of pulse DL1 even when the clock signal Xck1 leads in phase 0.5T than the differentiated pulse train Data_Dif. Further, no false pulse appears in the signal of pulse DL1 also even when the frequency of the clock signal Xck1 is higher than that of the differentiated pulse train Data_Dif as shown in FIGS. 36 and 37 corresponding to FIGS. 33 and 34, respectively.

Accordingly, it becomes possible to reproduce stable clock and data even when the delay times of the delay circuits 15 and 52 vary due to temperature, voltage, manufacturing condition and so on.

<<Yet Still Further Embodiment>>

On the other hand, under a certain condition, the configuration of the synchronizing signal extracting device shown in FIG. 27 can be simplified.

Figure 38:
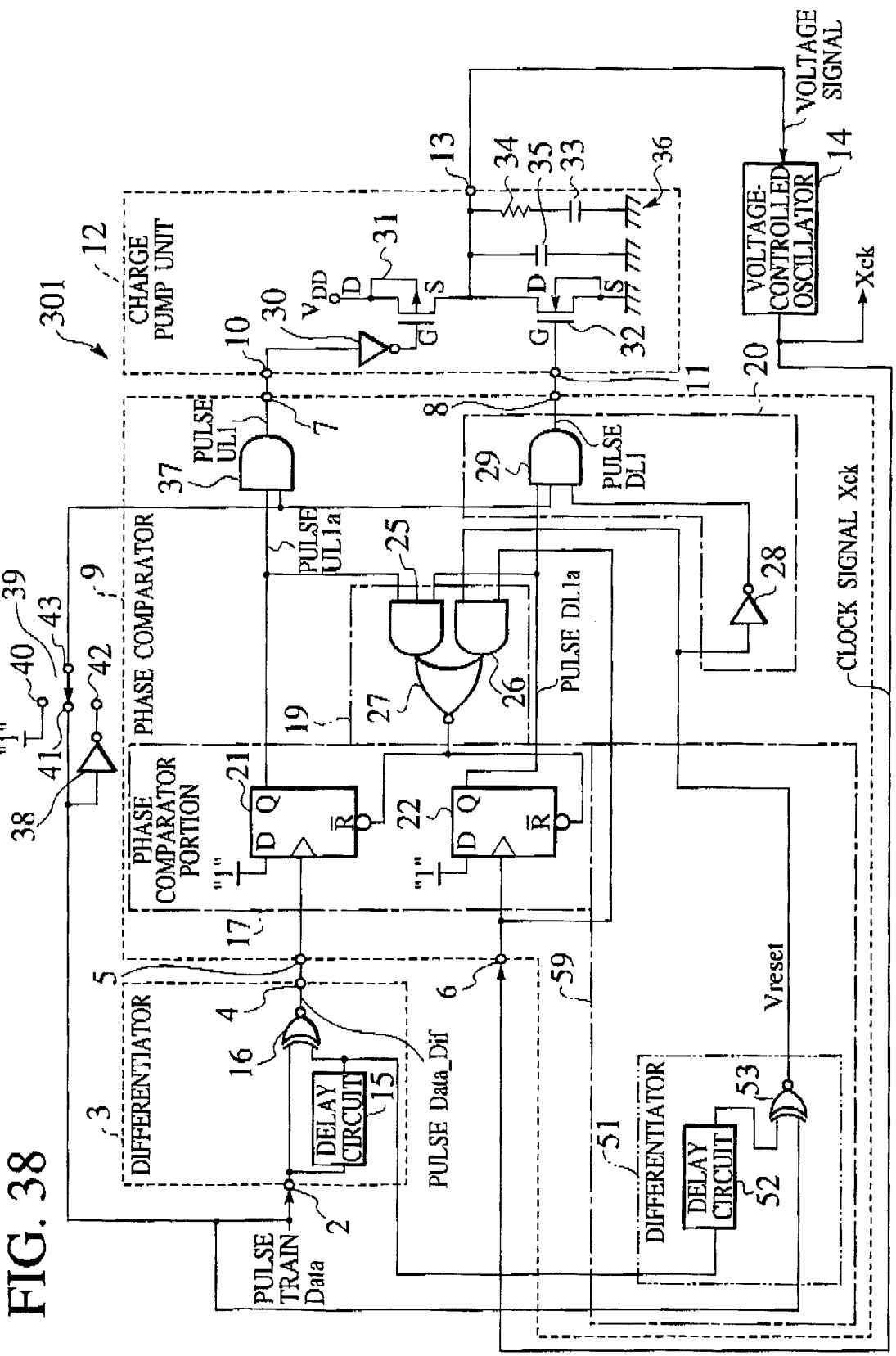
FIG. 38 is a circuit diagram in which a correcting pulse generating portion in the synchronizing signal extracting device shown in FIG. 27 is modified.

FIG. 38 is a circuit diagram showing a synchronizing signal extracting device including the modified correcting pulse generating portion 59. The modified correcting pulse generating portion 59 is constructed such that the inverter circuit 23 and the D flip-flop circuit 24 are deleted from the correcting pulse generating circuit 18. That is, the modified correcting pulse generating portion 59 includes only the delay circuit 52 and the exclusive-NOR circuit 53, Thus, the output signal of the exclusive-NOR circuit 53, i.e., reset signal Vreset, is directly used for the resetting portion 19 and the pulse correcting portion 20.

FIG. 39 is a time chart showing an operation of the synchronizing signal extracting device shown in FIG. 38.

Even such a device having such above configuration would function properly as shown in FIG. 39, when the clock signal Xck leads in phase 0.5T than the differentiated pulse train Data_Dif. The reason is that, if the sum of the delay times of the delay circuits 15 and 16 substantially coincides with bit width T, the reset signal Vreset obtained by performing exclusive-NOR operation on a signal delayed by the delay circuits 15 and 16 and the pulse train Data presents "0" or "1" depending on whether the pulse train Data is in pulse missing state or not so that the reset signal Vreset can be directly used as a signal for the pulse correcting portion 20.

The cases shown in FIGS. 40 and 41, in which the frequency of the clock signal Xck is higher than that of the differentiated pulse train Data_Dif, also function properly just the same as the cases shown in FIGS. 36 and 37.

However, it should be noted that the device shown in FIG. 38 does not operate expectedly under a certain frequency relation of the clock signal Xck and the differentiated pulse train Data_Dif and a certain delay time of the delay circuit 52, as described hereunder.

Generally, there is a possibility of false pulling of frequency and freezing in the pulling frequency or oscillation at the stage of frequency pulling in the following relation of the frequency fxck of the clock signal Xck and the frequency fb of the pulse train Data.

$$fxck=((2n+1)/2n)fb$$

or $$fxck=((2n-1)/2n)fb$$

where n is a given integer.

Particularly, when n=4, i.e. fxck=(9/8)fb, it has been experientially found that there is a highest possibility of the false pulling of frequency or the oscillation.

As already explained, when fxck=(9/8)fb and the delay time of the delay circuit 52 is 0.4T as shown in FIG. 41, proper pulses for decreasing the frequency are generated without any problem. However, when the delay time of the delay circuit 52 is 0.6T under the same frequency condition as shown in FIG. 42, false pulses are generated in the signal UL1 after time t1 or t2, though corresponding pulses should be generated in the signal DL1. This is because a rising of the clock signal Xck at the time t1 or t2 occurs during the reset signal Vreset is in the high level ("1") thereof, therefore, both the D flip-flop circuit 21 and the D flip-flop circuit 22 are reset at the time t1 or t2 so that a rising of the differentiated pulse train Data_Dif which appears earlier than the next rising of the clock signal Xck causes the D flip-flop circuit 21 to be set to "1".

In view of the above, it is necessary that the delay time of the delay circuit 52 is equal to or less than 0.4T in the embodiment shown in FIG. 38. In this connection, an ideal condition for detecting an incomplete pulse signal having some missing pulses is that the delay time of the delay circuit 15 is 0.6T and the delay time of the delay circuit 52 is 0.4T (0.6T+0.4T=1T), and under this condition, the reset signal Vreset shows "1" for a duration accurately corresponding to a duration in which pulses are missing and shows "0" for the other duration. Incidentally, at the present time, it is impossible to forecast whether the next pulse to be is missing. Therefore, past data that precedes by one bit is stored in a delay circuit and then present data is compared with the past data so that it may be possible to determine whether the present data corresponds to data of a missing pulse. In this sense, the delay circuit is an important storage element.

Different from the device shown in FIG. 38, the both devices shown in FIGS. 27 and 30 properly operate even in the condition shown in FIG. 42, because the pulse E triggered by a falling edge of the clock signal Xck(Xck1) that appears after a rising edge of the clock signal Xck(Xck1) is used as a correcting pulse in the device shown in FIG. 27 and the pulse E1 triggered by a falling edge of the clock signal Xck2 is additionally used as a correcting pulse in the device shown in FIG. 30 so that a rising of the clock signal Xck(Xck1) never occurs during the pulse E or E1 is in the high level ("1") during pulse missing state. Although the rising occurs during the pulse E or E1 is in the high level ("1") during normal state, there is no problem since the comparison operation is inhibited by resetting both the D flip-flop circuit 21 and the D flip-flop circuit 22.

Meanwhile, with regard to frequency pulling-in, according to the above two embodiments, even under the condition where the frequency fxck1(fxck) of the clock signal Xck1 (xck) is considerably higher than, for example, twice as high as that of the differentiated pulse train Data_Dif as shown in FIGS. 36 and 40, the wide pulse DL1 for strongly decreasing the frequency of the clock signal is generated.

On the other hand, under the condition where the frequency fxck1(fxck) of the clock signal Xck1(xck) is considerably lower than, for example, half of that of the differentiated pulse train Data_Dif, the wide pulse UL1 for strongly increasing the frequency of the clock signal is generated according to the embodiments, though not shown in the drawings.

Other frequency discriminating means such as a quadri-correlator and a rotational slip detector do not have the above feature. That is, according to these frequency discriminating means, although a strong pulling signal is generated when the frequency of the clock signal is near the frequency of the pulse train of original data, the pulling signal becomes week as the frequencies depart from each other and resulting in that no pulling signal appears when the frequency of the clock signal is twice or half.

In contrast, according to the embodiments, there is no demerit such as above and a strong pulling signal is generated depending on only whether the frequency is higher or lower and not depending on the degree thereof. Further, once the frequencies coincide with each other and then a phase-pulling stage comes, a strong phase-pulling signal is generated similarly. Furthermore, the frequency-pulling stage is continuously and smoothly followed by the phase-pulling stage without any pause. In addition, the devices according to the embodiments have a characteristic of an almost ideal frequency/phase comparator such that only an output signal including pulses having width of nearly zero is generated at a point of coincidence in frequency and phase.

In conclusion, from the foregoing descriptions, it is found that the device shown in FIG. 38 is preferable when a stable delay circuit is available, and the device shown in FIG. 27 is preferable in practical use, and the device shown in FIG. 30 is preferable when it is necessary to keep an operation margin enough.

As described above, according to the present invention, the precise synchronizing signal can be generated with respect to the pulse train that is brought into the tooth missing state due to a modulation by data, while reducing the number of parts. Also, the pulsation of the detected output can be minimized as small as possible to zero at the point of time when the synchronizing signal having the matched frequency and phase is obtained, and the variable range of the detected output can be expanded. As a result, the frequency variable range of the synchronizing signal can be expanded to enable the high speed response, and also the frequency discriminating function can be provided.

It should be understood that many modifications and adaptations of the invention will become apparent to those skilled in the art and it is Intended to encompass such obvious modifications and changes in the scope of the claims appended, hereto.

What is claimed is:

1. A phase comparator comprising:

a phase comparing portion for generating a leading phase instructing pulse and a lagging phase instructing pulse to mate a phase of an input pulse train and a phase of an input clock signal with each other in accordance with the phases;

a correction pulse generating portion for generating a correction pulse in accordance with the input pulse train and the input clock signal; and a resetting portion receiving the leading phase instructing pulse and the lagging phase instructing pulse output from the phase comparing portion, the correction pulse output from the correction pulse generating portion, and the input clock signal for resetting the phase comparing portion by generating a reset pulse.

2. A phase comparator according to claim 1, wherein the correction pulse generating portion generates the correction pulse that has a pulse width equivalent to a time period from a time which correction pilse is triggered by the input clock signal to a time at which the correction pulse is reset by a differentiated pulse train obtained by differentiating the input pulse train, and detects a pulse missing of the input pulse train based on the pulse width of the correction pulse.

3. A phase comparator according to claim 2, wherein the phase comparing portion generates the leading phase instructing pulse and the lagging phase instructing pulse by using the differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

4. A phase comparator according to claim 1, wherein the correction pulse generating portion generates the correction pulse that has a pulse width equivalent to a time period obtained by overlapping a time period from a time at which the correction pulse is triggered by the input clock signal to a time at which the correction pulse is reset by a differentiated pulse train obtained by differentiating the input pulse train and a time period from a time at which the correction pulse is triggered by a second clock signal that lags behind the input clock signal by a predetermined degree to a time at which the correction pulse is reset by the differentiated pulse train obtained by differentiating the input pulse train, and detects a pulse missing of the input pulse train based on the pulse width of the correction pulse.

5. A phase comparator according to claim 4, wherein the phase comparing portion generates the leading phase instructing pulse and the lagging phase instructing pulse by using the differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

6. A phase comparator according to claim 1, wherein the phase comparing portion includes a first flip-flop circuit triggered by a differentiated pulse train obtained by differentiating the input pulse train to output the leading phase instructing pulse and a second flip-flop circuit triggered by the input clock signal to output the lagging phase instructing pulse, and the resetting portion generates the reset pulse when both the leading phase instructing pulse and the lagging phase instructing pulse are output from the phase comparing portion or when the input clock signal is input in a situation that the correction pulse is being output from the correction pulse generating portion, and resets the leading phase instructing pulse and the lagging phase instructing pulse by resetting the respective flip-flop circuits constituting the phase comparing portion.

7. A phase comparator according to claim 6, wherein the phase comparing portion generates the leading phase instructing pulse and the lagging phase instructing pulse by using the differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

8. A phase comparator according to claim 1, wherein the phase comparing portion includes a first flip-flop circuit triggered by a differentiated pulse train obtained by differentiating the input pulse train to output the leading phase instructing pulse and a second flip-flop circuit triggered by the input clock signal to output the lagging phase instructing pulse, and the resetting portion generates the reset pulse when both the leading phase instructing pulse and the lagging phase instructing pulse are output from the phase comparing portion, and resets the leading phase instructing pulse and the lagging phase instructing pulse by resetting the respective flip-flop circuits constituting the phase comparing portion; or generates the reset pulse when the input clock signal is input in a situation that the correction pulse is being output from the correction pulse generating portion and resets the lagging phase instructing pulse by resetting the second flip-flop circuit constituting the phase comparing portion.

9. A phase comparator according to claim 8, wherein the phase comparing portion generates the leading phase instructing pulse and the lagging phase instructing pulse by using the differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

10. A phase comparator according to claim 1, wherein the phase comparing portion generates the leading phase instructing pulse and the lagging phase instructing pulse by using a differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

11. A phase comparator comprising:

a phase comparing portion for generating a leading phase instructing pulse and a lagging phase instructing pulse to mate a phase of an input pulse train and a phase of an input clock signal with each other in accordance with the phases;

a correction pulse generating portion for generating a correction pulse in accordance with the input pulse train and the input clock signal;

a resetting portion for resetting the phase comparing portion by generating a reset pulse in accordance with the leading phase instructing pulse and the lagging phase instructing pulse output from the phase comparing portion, the correction pulse output from the correction pulse generating portion, and the input clock signal; and a pulse correcting portion for removing false pulses contained in the lagging phase instructing pulse output from the phase comparing portion, based on the correction pulse output from the correction pulse generating portion.

12. A phase comparator according to claim 11, wherein the phase comparing portion generates the leading phase instructing pulse and the lagging phase instructing pulse by using a differentiated pulse train obtained by differentiating both of a rise and a fall of the input pulse train, and selects and outputs portions that correspond to at least one of a high level period and a low level period of the input pulse train from the leading phase instructing pulse and the lagging phase instructing pulse.

13. A synchronizing signal extracting device comprising:

a phase comparator including,
  a phase comparing portion for generating a leading phase instructing pulse and a lagging phase instructing pulse to match a phase of an input pulse train and a phase of an input clock signal with each other in accordance with the phases;
  a correction pulse generating portion for generating a correction pulse in accordance with the input pulse train and the input clock signal;
  a resetting portion receiving the leading phase instructing pulse and the lagging phase instructing pulse output from the phase comparing portion, the correction pulse output from the correction pulse generating portion, and the input clock signal for resetting the phase comparing portion by generating a reset pulse;

a differentiator for differentiating a pulse train having a frequency that is ½ of a frequency of the input pulse train, and supplying to the phase comparator as the input pulse train;

a charge pump unit for increasing a voltage value of an output voltage signal by executing a charging operation when the leading phase instructing pulse is input from the phase comparator, and decreasing the voltage value of the output voltage signal by executing a discharging operation when the lagging phase instructing pulse is input from the phase comparator; and a voltage-controlled oscillator for receiving the voltage signal output from the charge pump unit, generating the input clock signal having a frequency that increases as the voltage value of the voltage signal increases, and supplying the input clock signal to the phase comparator.

14. A synchronizing signal extracting device comprising:

a phase comparator including,
  a phase comparing portion for generating a leading phase instructing pulse and a lagging phase instructing pulse to mate a phase of an input pulse train and a phase of an input clock signal with each other in accordance with the phases;
  a correction pulse generating portion for generating a correction pulse in accordance with the input pulse train and the input clock signal;
  a resetting portion for resetting the phase comparing portion by generating a reset pulse in accordance with the leading phase instructing pulse and the lagging phase instructing pulse output from the phase comparing portion, the correction pulse output from the correction pulse generating portion, and the input clock signal;
  a pulse correcting portion for removing false pulses contained in the lagging phase instructing pulseoutput from the phase comparing portion, based on the correction pulse output from the correction pulse generating portion;

a differentiator for differentiating a pulse train having a frequency that is ½ of a frequency of the input pulse train, and supplying to the phase comparator as the input pulse train;

a charge pump unit for increasing a voltage value of an output voltage signal by executing a charging operation when the leading phase instructing pulse is input from the phase comparator, and decreasing the voltage value of the output voltage signal by executing a discharging operation when the lagging phase instructing pulse is input from the phase comparator; and a voltage-controlled oscillator for receiving the voltage signal output from the charge pump unit, generating the input clock signal having a frequency that increases as the voltage value of the voltage signal increases, and supplying the input clock signal to the phase comparator.

* * * * *

UNITED STATES PATENT AND TRADEMARK OFFICE
CERTIFICATE OF CORRECTION

PATENT NO.    : 6,633,184 B2
DATED         : October 14, 2003
INVENTOR(S)   : Gijun Idei et al.

It is certified that error appears in the above-identified patent and that said Letters Patent is hereby corrected as shown below:

Column 30,
Line 16, "time which correction pilse is" should read -- time at which the correction pulse is --.

Column 32,
Lines 62-63, "pulseoutput" should read -- pulse output --.

Signed and Sealed this

Sixth Day of January, 2004

JAMES E. ROGAN
*Director of the United States Patent and Trademark Office*